(12) United States Patent
Hsiung et al.

(10) Patent No.: US 12,107,007 B2
(45) Date of Patent: Oct. 1, 2024

(54) RECESSED CONTACTS AT LINE END AND METHODS FORMING SAME

(71) Applicant: Taiwan Semiconductor Manufacturing Co., Ltd., Hsinchu (TW)

(72) Inventors: Te-Chih Hsiung, Taipei (TW); Jyun-De Wu, New Taipei (TW); Yi-Chen Wang, Hsinchu (TW); Yi-Chun Chang, Hsinchu (TW); Yuan-Tien Tu, Puzih (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 339 days.

(21) Appl. No.: 17/465,499

(22) Filed: Sep. 2, 2021

(65) Prior Publication Data

US 2022/0359287 A1   Nov. 10, 2022

Related U.S. Application Data

(60) Provisional application No. 63/184,559, filed on May 5, 2021.

(51) Int. Cl.
*H01L 21/768*   (2006.01)
*H01L 21/306*   (2006.01)
*H01L 27/088*   (2006.01)

(52) U.S. Cl.
CPC .. *H01L 21/76897* (2013.01); *H01L 21/30625* (2013.01); *H01L 27/088* (2013.01)

(58) Field of Classification Search
CPC ......... H01L 21/76897; H01L 21/30625; H01L 21/823475; H01L 21/76805; H01L 21/76895; H01L 21/32136; H01L 21/7684; H01L 21/76877; H01L 21/823431; H01L 27/088; H01L 27/0886; H01L 23/5226; H01L 23/485
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

FOREIGN PATENT DOCUMENTS

| | | |
|---|---|---|
| CN | 102983105 A | 3/2013 |
| KR | 20140023763 A | 2/2014 |

(Continued)

*Primary Examiner* — Shahed Ahmed
*Assistant Examiner* — Vicki B. Booker
(74) *Attorney, Agent, or Firm* — Slater Matsil, LLP

(57) ABSTRACT

Embodiments include a contact structure and method of forming the same where the contact structure is deliberately positioned near the end of a metallic line. An opening is formed in an insulating structure positioned over the metallic line and then the opening is extended into the metallic line by an etching process. In the etching process, the line end forces etchant to concentrate back away from the line end, causing lateral etching of the extended opening. A subsequent contact is formed in the opening and enlarged opening.

20 Claims, 50 Drawing Sheets

(56) References Cited

U.S. PATENT DOCUMENTS

| | | | |
|---|---|---|---|
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,199,271 B1* | 2/2019 | Xie | H01L 23/485 |
| 2003/0194872 A1* | 10/2003 | Parikh | H01L 21/76868 |
| | | | 257/E21.585 |
| 2004/0102035 A1* | 5/2004 | Lee | H01L 23/5226 |
| | | | 438/653 |
| 2014/0048939 A1 | 2/2014 | Park et al. | |
| 2016/0043035 A1* | 2/2016 | Lin | H01L 21/76802 |
| | | | 438/653 |
| 2017/0053916 A1* | 2/2017 | Ching | H01L 21/76831 |
| 2018/0019133 A1 | 1/2018 | Ng et al. | |
| 2018/0301371 A1* | 10/2018 | Wang | H01L 29/7851 |
| 2019/0287851 A1* | 9/2019 | Chen | H01L 21/76814 |
| 2022/0310919 A1 | 9/2022 | Lin et al. | |

FOREIGN PATENT DOCUMENTS

| | | |
|---|---|---|
| TW | 201312655 A | 3/2013 |
| TW | 202018820 A | 5/2020 |

* cited by examiner

RECESSED CONTACTS AT LINE END AND METHODS FORMING SAME

PRIORITY CLAIM AND CROSS-REFERENCE

This application claims the benefit of the following provisionally filed U.S. Patent application: Application No. 63/184,559, filed May 5, 2021.

BACKGROUND

In the manufacturing of integrated circuits, contact plugs are used for electrically coupling to the source and drain regions and the gates of transistors. The source/drain contact plugs were typically connected to source/drain silicide regions, whose formation processes include forming contact openings to expose source/drain regions, depositing a metal layer, depositing a barrier layer over the metal layer, performing an anneal process to react the metal layer with the source/drain regions, filling a metal into the remaining contact opening, and performing a Chemical Mechanical Polish (CMP) process to remove excess metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
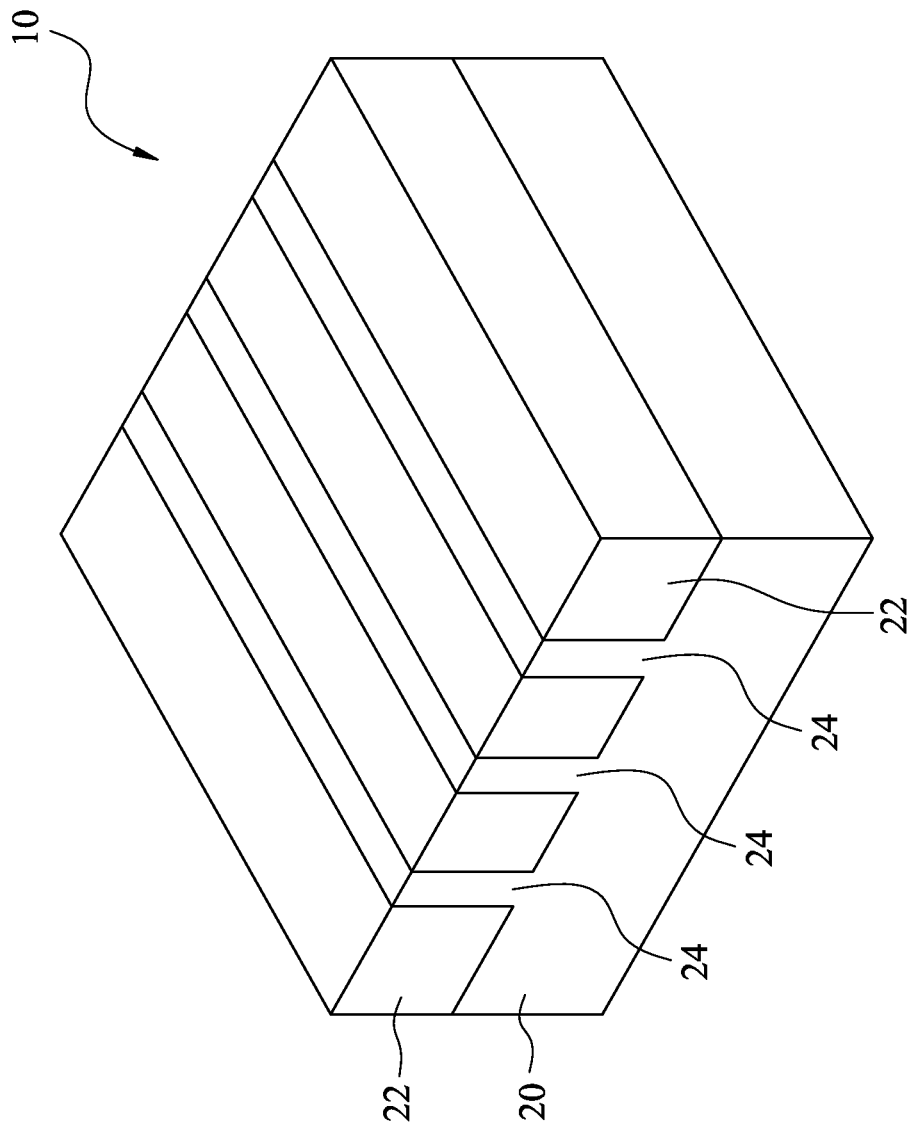
FIGS. 1-8, 9A, 9B, 10, 11A, 11B, 12, 13A, 13B, 14A, 14B, 15A, 15B, 16A, 16B, 17, 18A, 18B, 19A, and 19B are perspective views and cross-sectional views of intermediate stages in the formation of a transistor and the respective contact vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact plug is provided which is deliberately disposed near the edge of an underlying metal feature, the contact plug having an extended portion which penetrates into the metal feature, and the method of forming the same are provided. In accordance with some embodiments, a lower source/drain contact plug is formed in a first inter-layer dielectric, and a second inter-layer dielectric is formed over the first inter-layer dielectric. An upper source/drain contact plug is then formed in the second inter-layer dielectric. In the etching of the inter-layer dielectric for forming a contact opening for the upper source/drain contact plug, the contact opening is intentionally disposed near an edge of the lower source/drain contact plug, and a portion of the first inter-layer dielectric is etched to expose the lower source/drain contact plug. The exposed upper surface of the lower source/drain contact plug is etched through the contact opening to provide an enlarged opening or depression in the upper surface of the lower source/drain contact plug which is wider than the lateral extents of the bottom of the contact opening. Because the contact opening is intentionally disposed near the edge of the lower source/drain contact plug, the effect of the etching of the lower source/drain contact plug is intensified by the sidewall of the lower source/drain contact plug so that the resulting opening near the edge of the lower source/drain contact plug is deeper and laterally wider than a similar opening disposed away from the edge of the lower source/drain contact plug. The enlarged opening is defined by the second inter-layer dielectric (and/or diffusion barrier) on one side and the material of the lower source/drain contact plug on the other side and on the bottom. The upper source/drain contact is then grown in a bottom-up process, having a shape resembling an upside down mushroom. During a subsequent polishing process, when etching chemicals seep or leak between the sidewalls of the upper source/drain contact and the second inter-dielectric layer, the enlarged mushroom base helps prevent etching chemicals from contacting the underlying lower source/drain contact plug. Further the surface area contact between the upper source/drain contact plug and the lower source/drain contact plug is improved. Accordingly, the adhesion between the upper source/drain contact plug and the lower source/drain contact plug is also improved, and contact resistance is reduced.

It is appreciated that although a Fin Field-Effect Transistor (FinFET) is used as an example, other types of transistors such as planar transistors, Gate-All-Around (GAA) transistors, or the like, may also adopt the embodiments of the present disclosure. Furthermore, although source/drain contact plugs are used as examples, other conductive features including, and not limited to, conductive lines, conductive plugs, conductive vias, and the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 32:
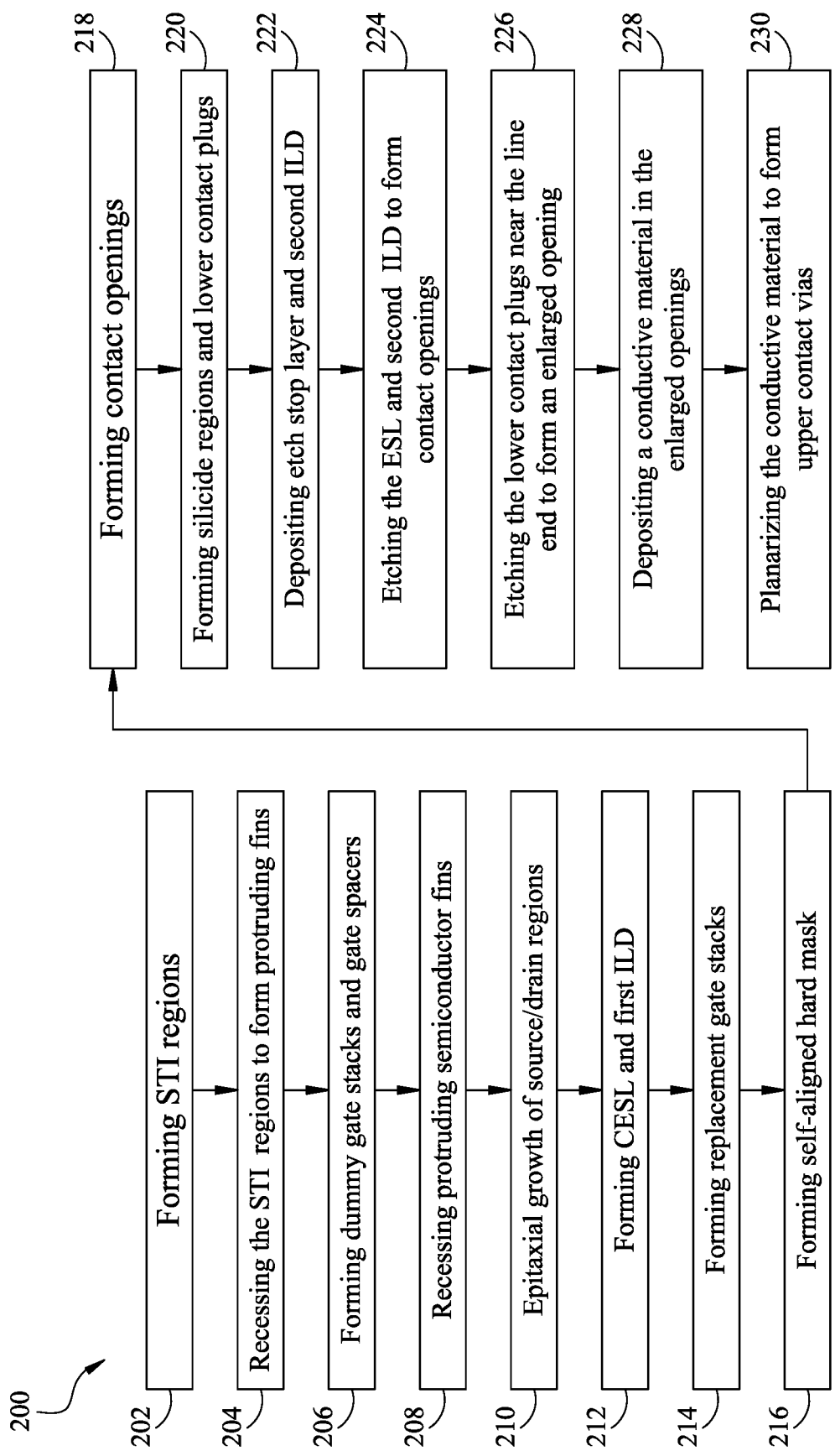
FIG. 32 illustrates a process flow for forming a transistor and contact vias in accordance with some embodiments.

FIGS. 1-8, 9A, 9B, 10, 11A, 11B, 12, 13A, 13B, 14A, 14B, 15A, 15B, 16A, 16B, 17, 18A, 18B, 19A, and 19B illustrate the perspective views and cross-sectional views of intermediate stages in the formation of a Fin Field-Effect Transistor (FinFET) and the corresponding contact plugs in accordance with some embodiments of the present disclosure. The corresponding processes are also reflected schematically in the process flow 200 as shown in FIG. 32.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 32. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to grow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include an oxide layer lining semiconductor strips 24 (not shown), which may be a thermal oxide layer formed through the thermal oxidation of a surface layer of substrate 20. The oxide layer may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the oxide layer, wherein the dielectric material may be formed using Flowable Chemical Vapor Deposition (FCVD), spin-on coating, or the like.

Figure 2:
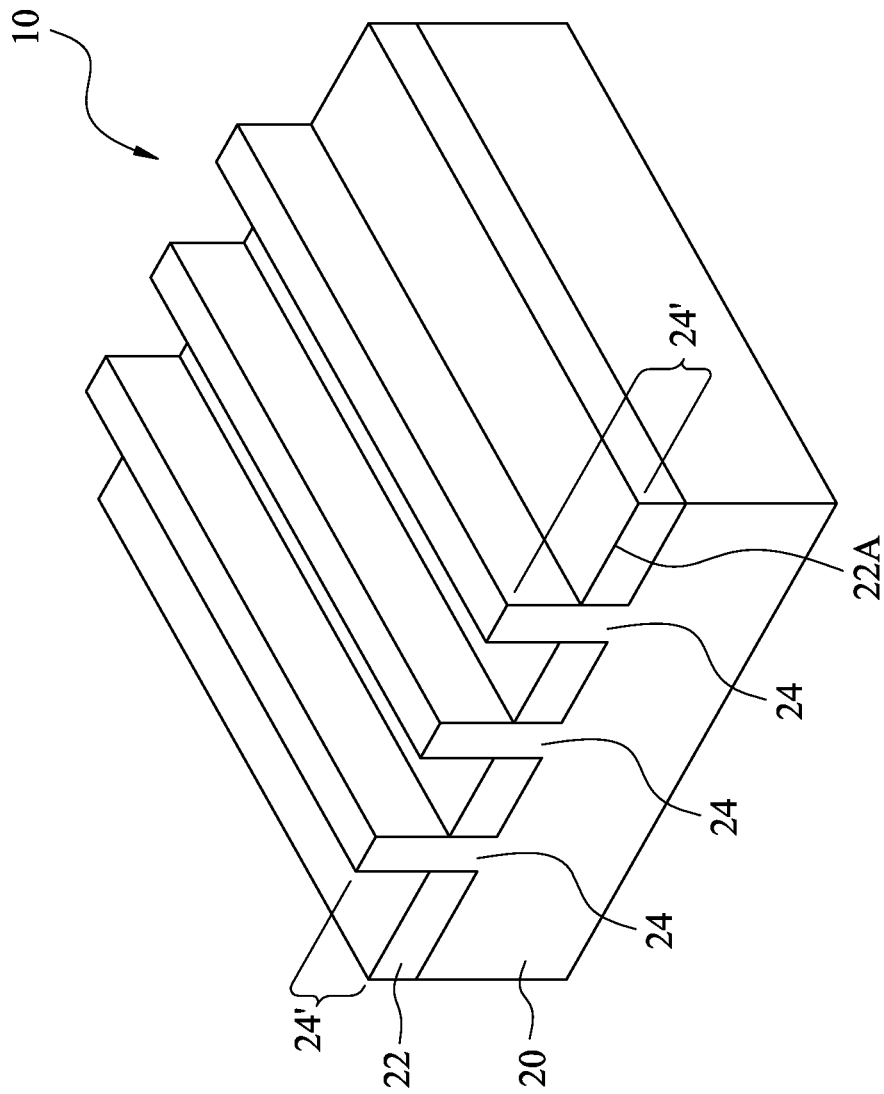

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 32. The etching may be performed using a dry etching process, for example, using $NF_3$ and $NH_3$ as the etching gases. In accordance with alternative embodiments of the present disclosure, the recessing of STI regions 22 is performed using a wet etching process. The etching chemical may include diluted HF solution, for example.

In above-illustrated embodiments, the semiconductor strips may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
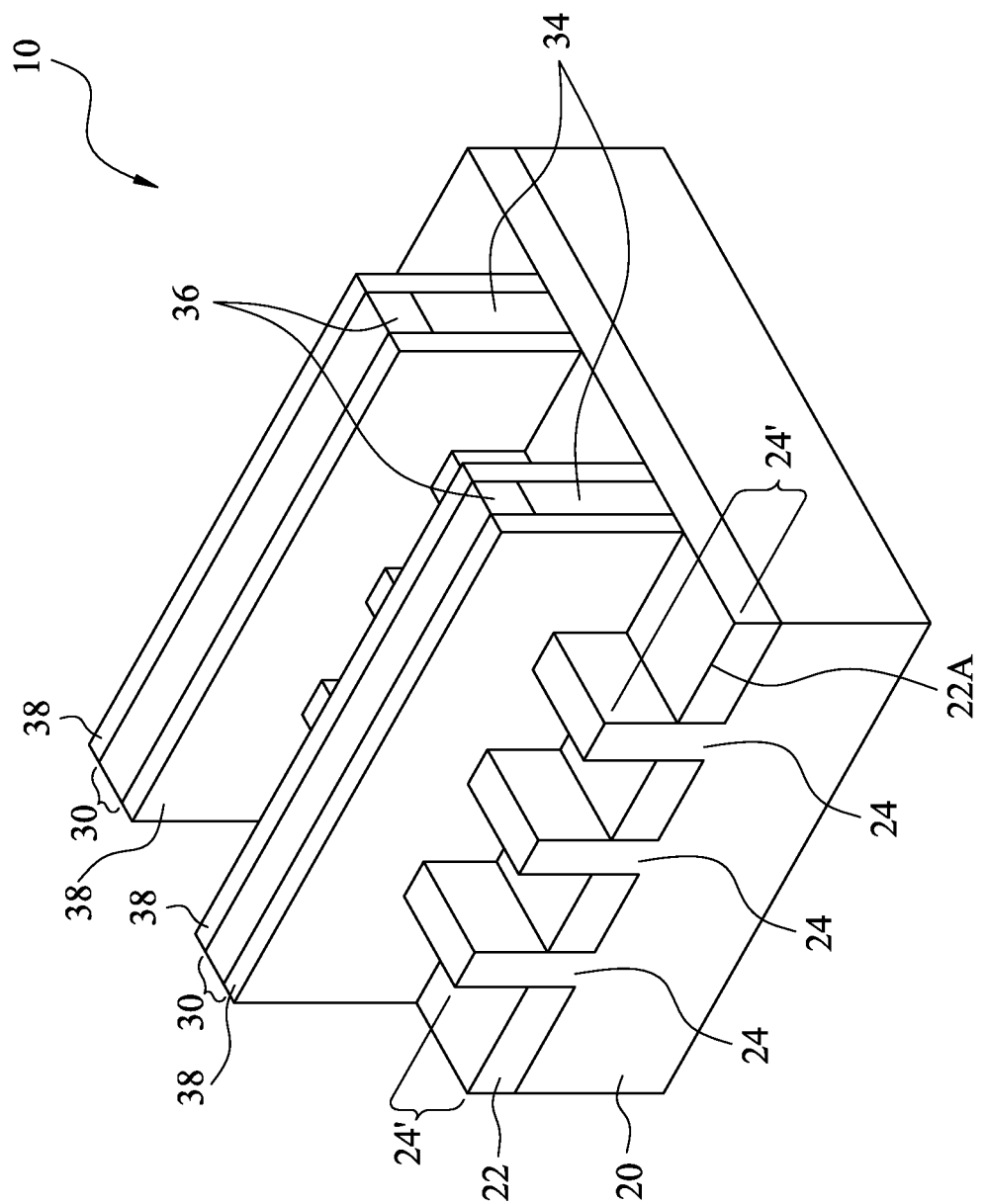

Referring to FIG. 3, dummy gate stacks 30 are formed to extend on the top surfaces and the sidewalls of (protruding) fins 24'. The respective process is illustrated as process 206 in the process flow 200 shown in FIG. 32. Dummy gate stacks 30 may include dummy gate dielectrics (not shown) in sidewalls of protruding fins 24', and dummy gate electrodes 34 over the respective dummy gate dielectrics. The dummy gate dielectrics may comprise silicon oxide. Dummy gate electrodes 34 may be formed, for example, using polysilicon, and other materials may also be used. Each of dummy gate stacks 30 may also include one (or a plurality of) hard mask layer 36 over the corresponding dummy gate electrodes 34. Hard mask layers 36 may be formed of silicon nitride, silicon oxide, silicon oxy-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 shown in FIG. 32. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
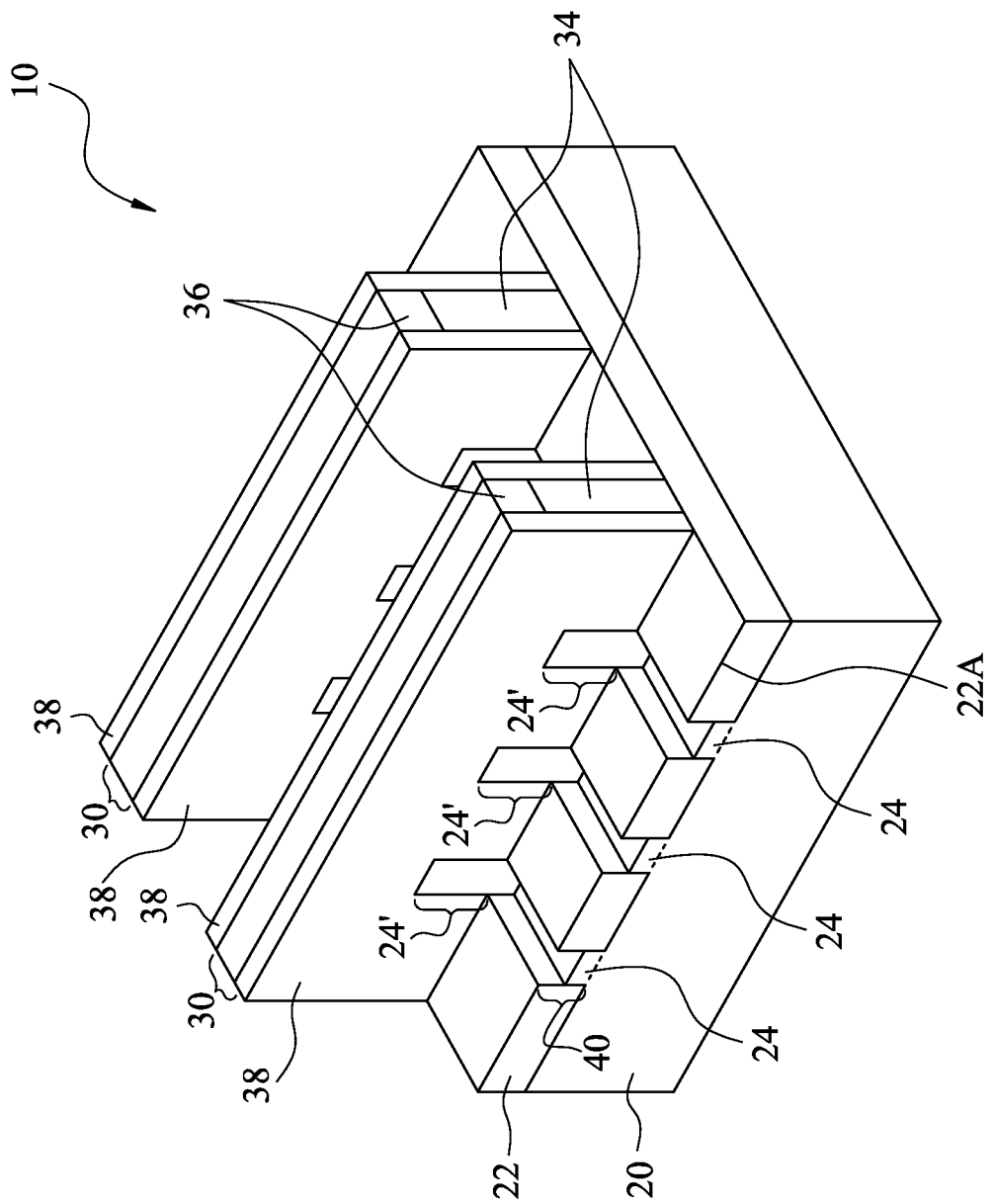

An etching process is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 32. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
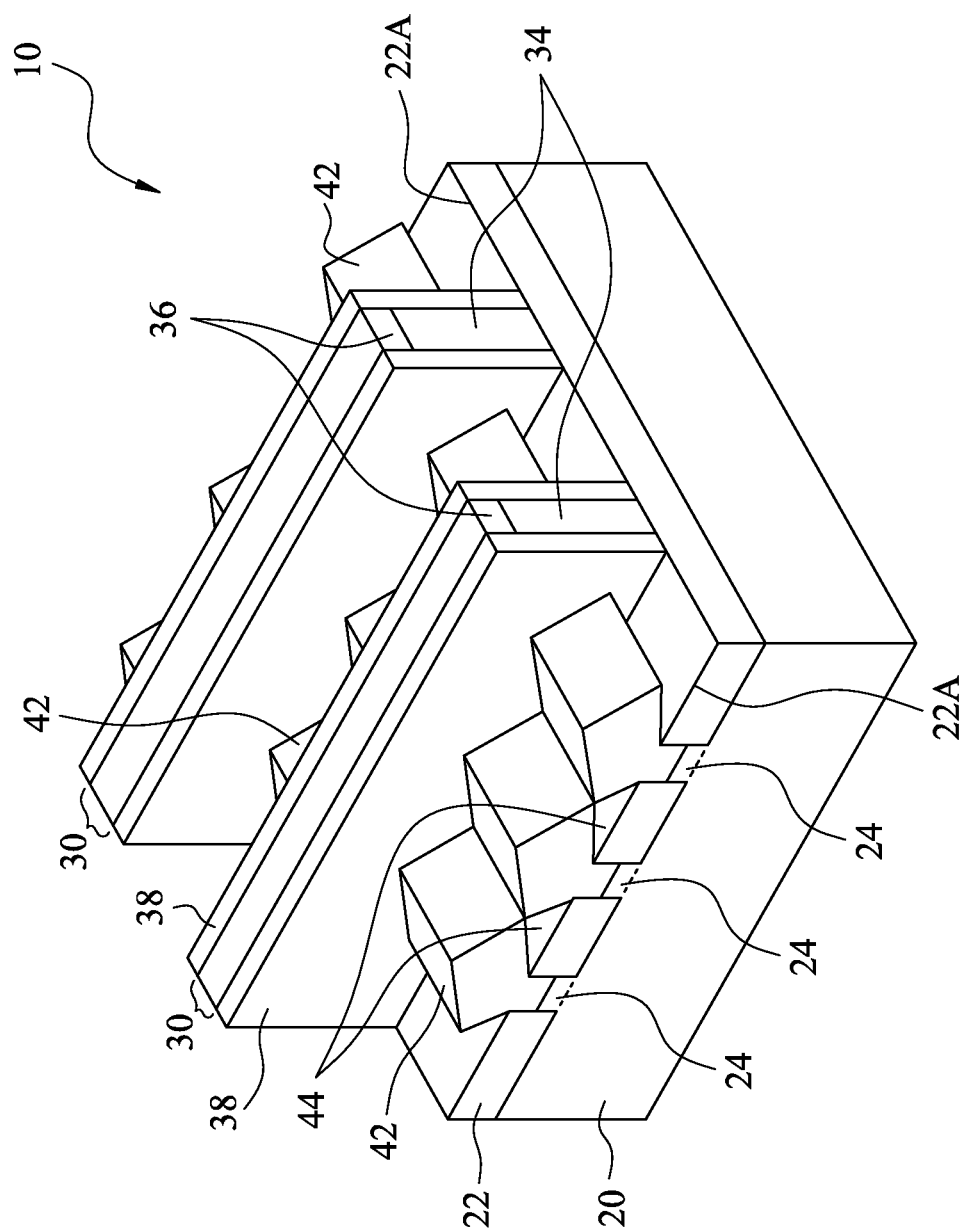
Figure 6:
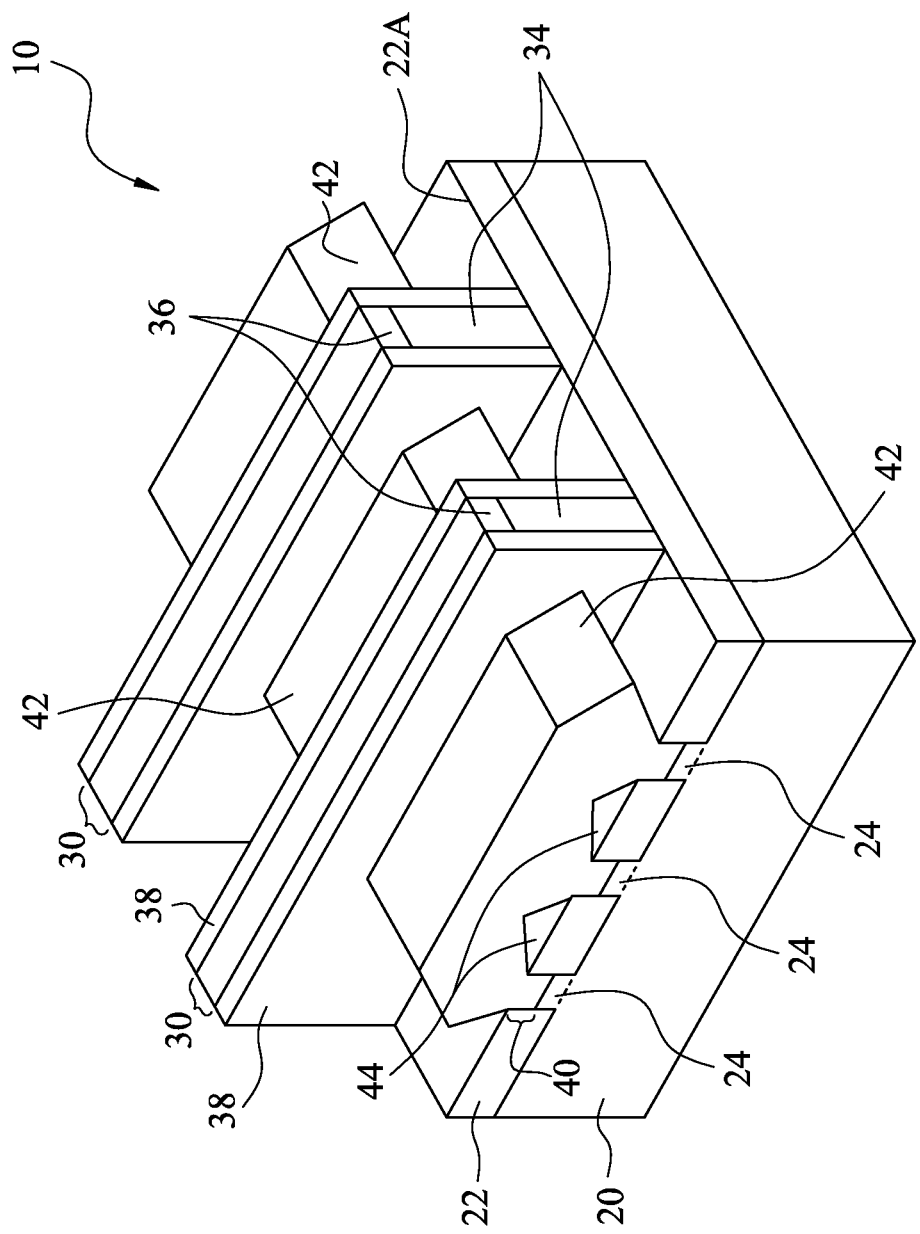

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 32. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy process, epitaxy regions 42 may be further implanted with a p-type or an n-type impurity to form source and drain regions, which are also denoted using reference numeral 42. In accordance with alternative embodiments of the present disclosure, the implantation process is skipped when epitaxy regions 42 are in-situ doped with the p-type or n-type impurity during the epitaxy.

Figure 7:
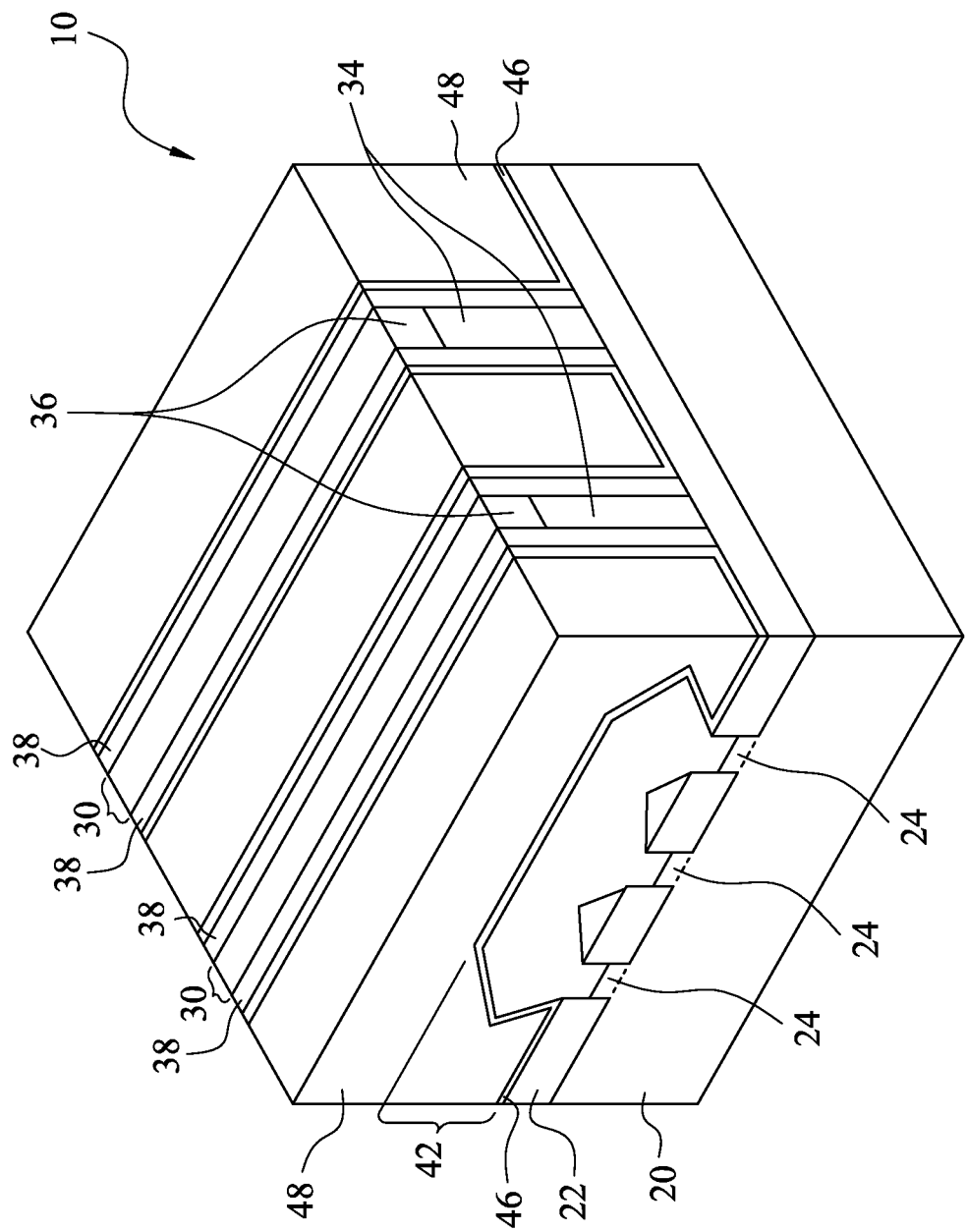

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 32. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition process. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8:
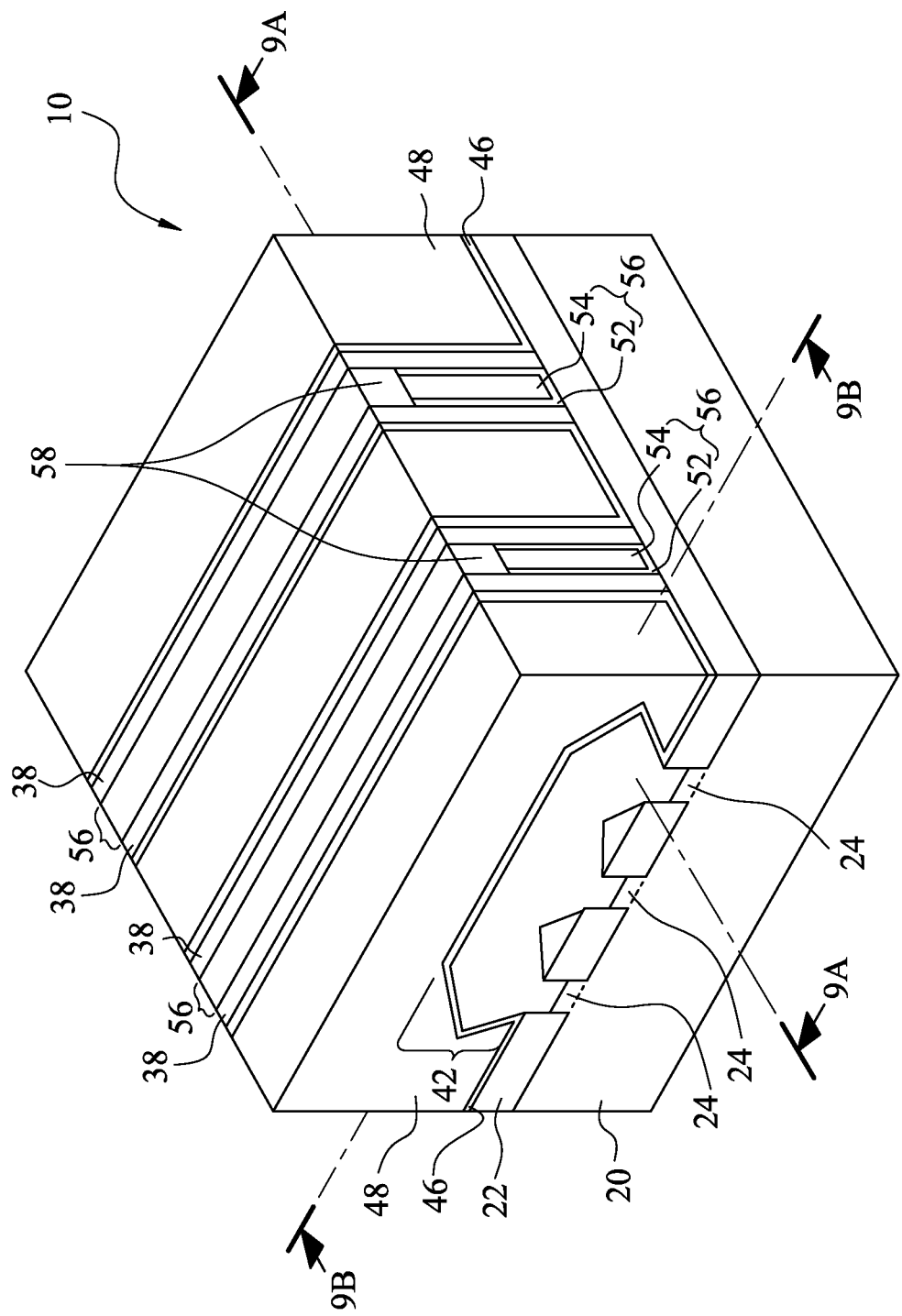
Figure 9A:
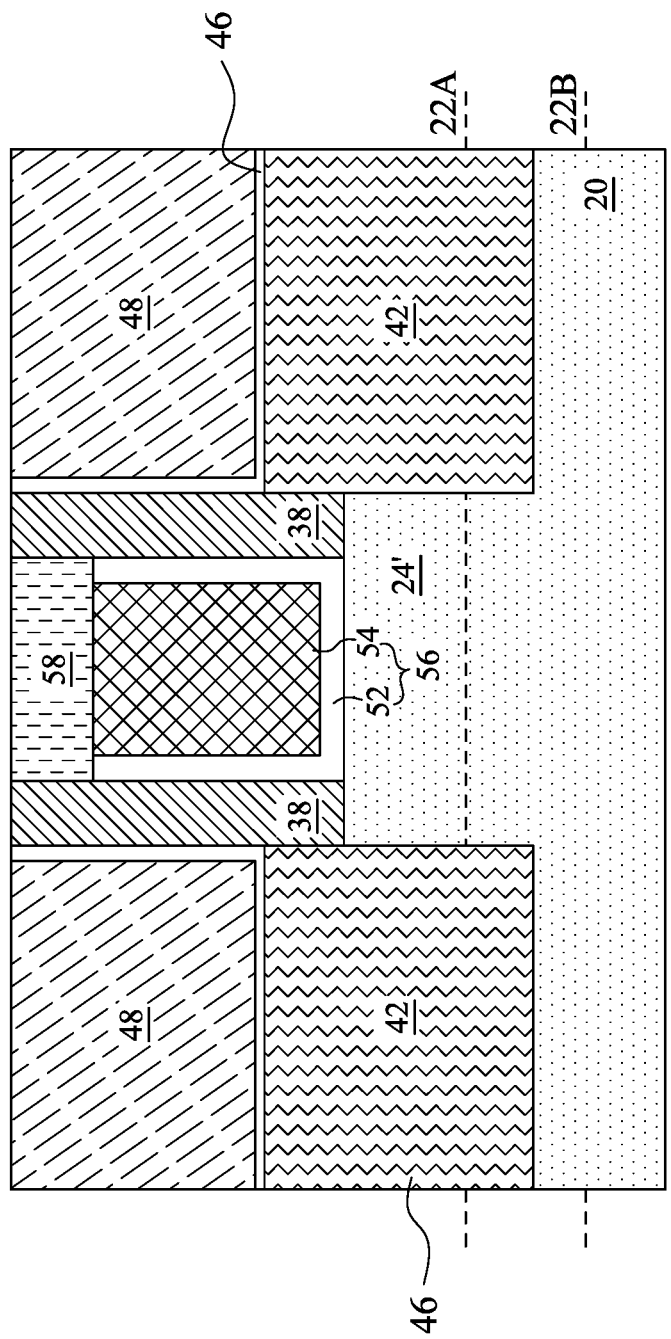
Figure 9B:
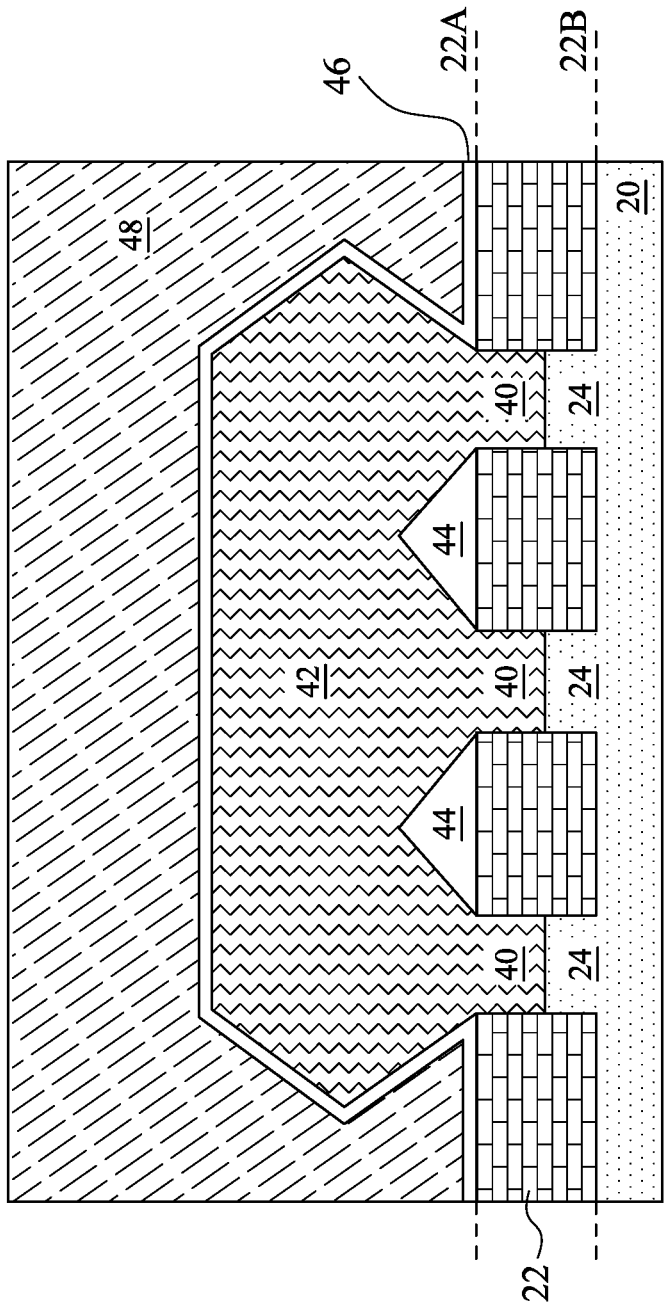

Next, in FIGS. 8, 9A, and 9B, dummy gate stacks 30, which include hard mask layers 36, dummy gate electrodes 34, and the dummy gate dielectrics are replaced with replacement gate stacks 56, which include gate electrodes 54 and gate dielectrics 52. The respective process is illustrated as process 214 in the process flow 200 shown in FIG. 32. FIG. 9A illustrates a cross-sectional view along the reference line 9A-9A in FIG. 8 and FIG. 9B illustrates a cross-sectional view along the reference line 9B-9B in FIG. 8, in accordance with some embodiments.

When forming replacement gate stacks 56, hard mask layers 36, dummy gate electrodes 34 (as shown in FIG. 7), and the dummy gate dielectrics are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIGS. 8, 9A, and 9B, replacement gate dielectrics 52 are formed, which extend into the trenches between gate spacers 38. In accordance with some embodiments of the present disclosure, each of gate dielectrics 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectrics 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIGS. 8, 9A, and 9B, gate electrodes 54 are formed over gate dielectrics 52. Gate electrodes 54 include stacked conductive layers. The stacked conductive layers are not shown separately, while the stacked conductive layers may be distinguishable from each other. The deposition of the stacked conductive layers may be performed using a conformal deposition method(s) such as ALD or CVD. The stacked conductive layers may include a diffusion barrier layer (also sometimes referred to as a glue layer) and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a glue layer, which may be another TiN layer, is formed. The glue layer may or may not fully fill the trenches left by the removed dummy gate stacks.

The deposited gate dielectric layers and conductive layers are formed as conformal layers extending into the trenches, and include some portions over ILD 48. Next, if the glue layer does not fully fill the trenches, a metallic material is deposited to fill the remaining trenches. The metallic material may be formed of tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

FIGS. 8, 9A, and 9B also illustrate the formation of (self-aligned) hard masks 58 in accordance with some embodiments. The respective process is illustrated as process 216 in the process flow 200 shown in FIG. 32. The formation of hard masks 58 may include performing an etching process to recess replacement gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxy-nitride, silicon oxy-carbo-nitride, or the like.

FIG. 9B further illustrates a cross-sectional view through the epitaxy regions 42 and illustrates the CESL 46 and ILD 48 disposed over the epitaxy regions 42, in accordance with some embodiments.

Figure 10:
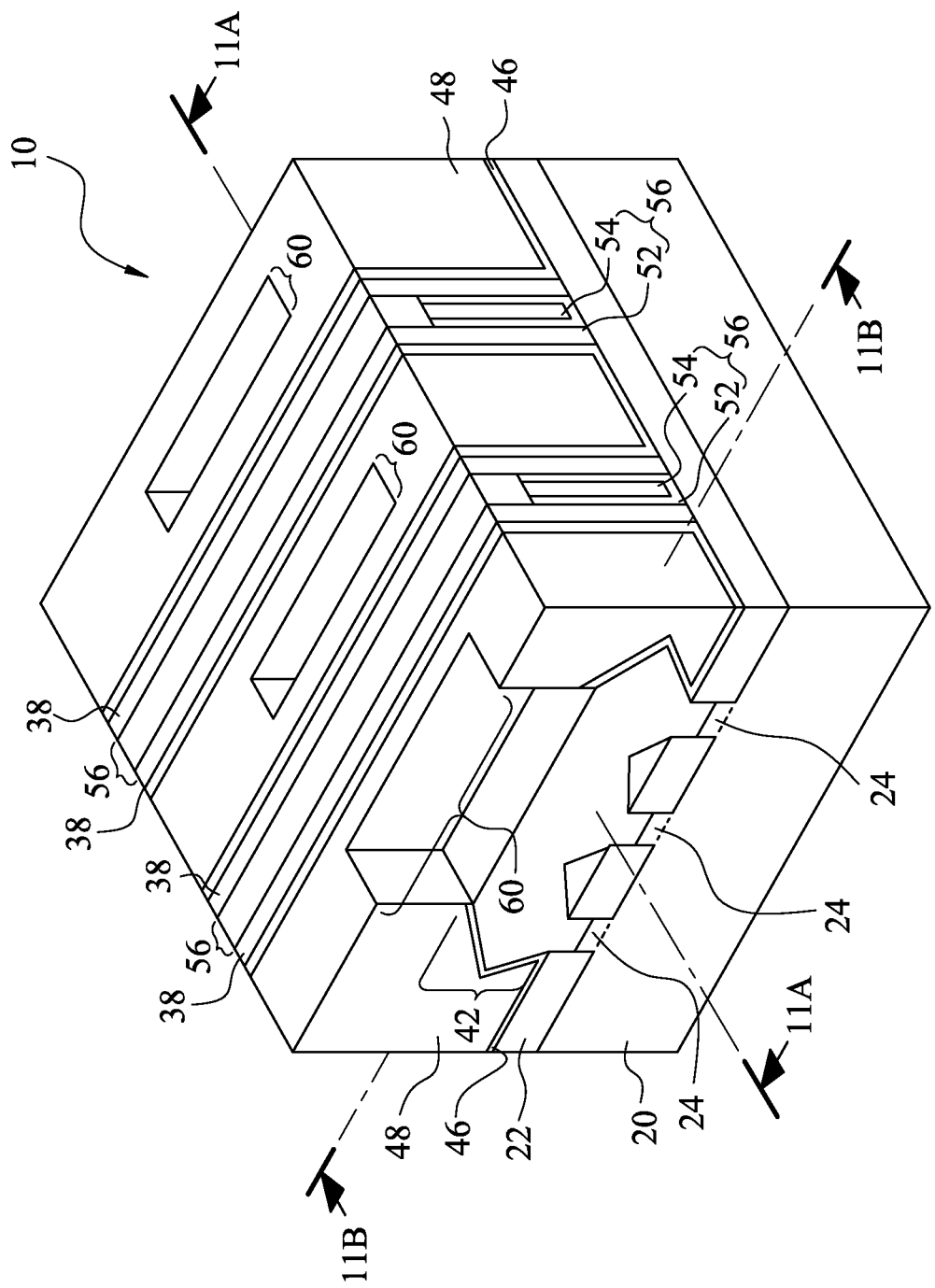
Figure 11A:
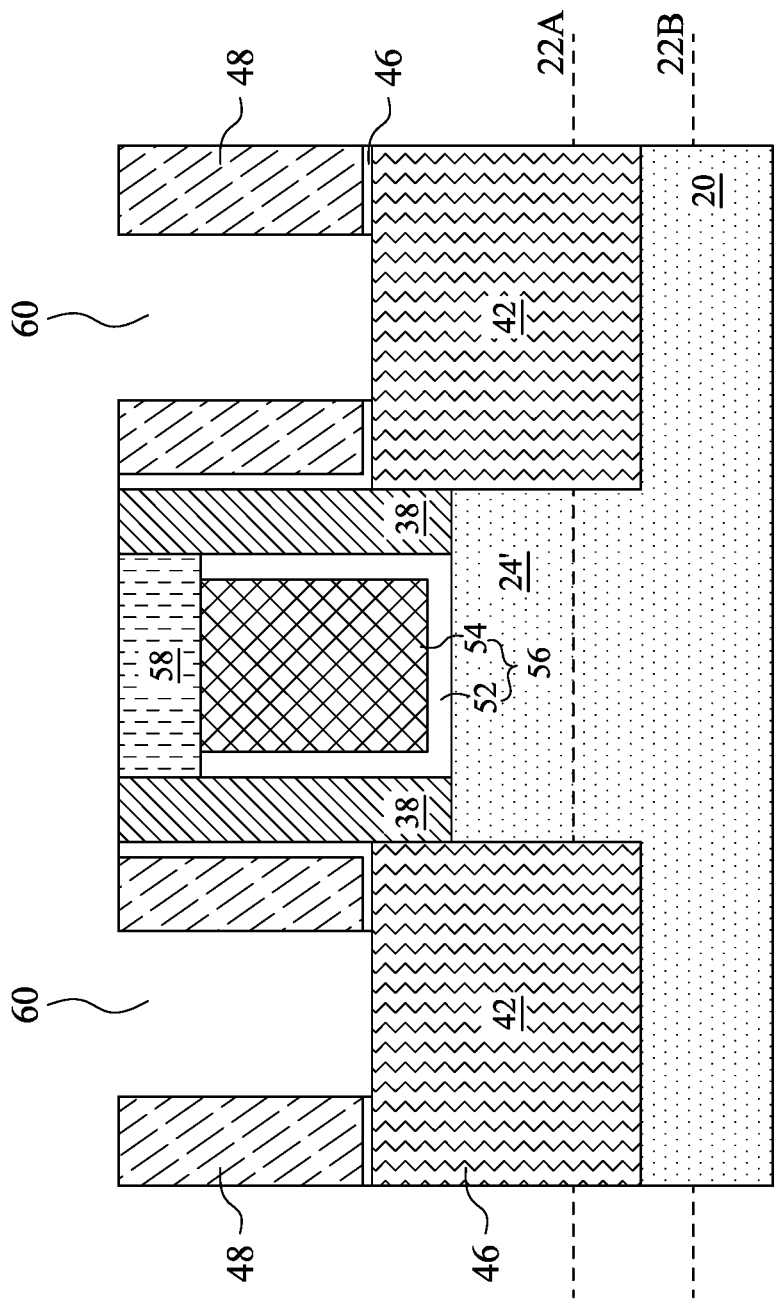
Figure 11B:
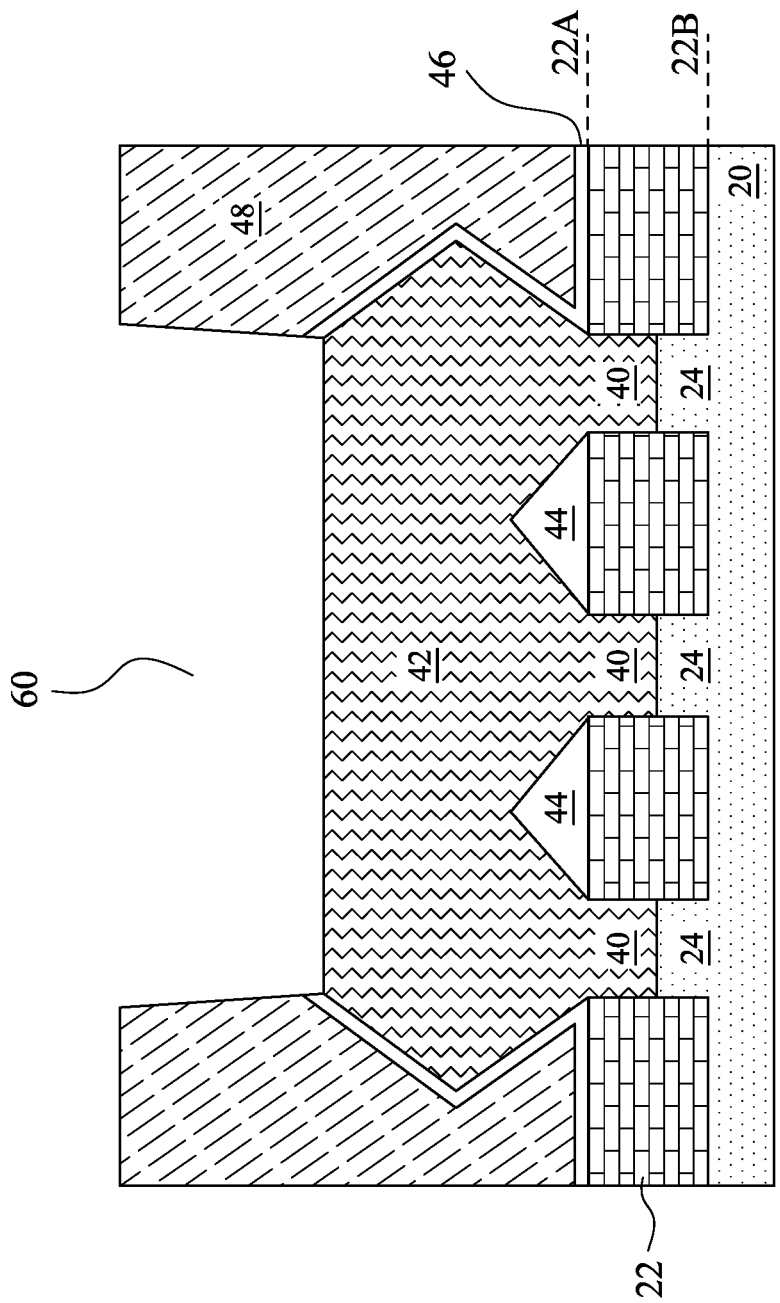

FIG. 10 illustrates a perspective view and FIGS. 11A and 11B illustrate cross-sectional views in the formation of contact openings 60 for the epitaxy regions 42. The respective process is illustrated as process 218 in the process flow 200 shown in FIG. 32. FIG. 11A illustrates the reference cross-section 11A-11A in FIG. 10. FIG. 11B illustrates the reference cross-section 11B-11B in FIG. 10. The formation of contact openings 60 includes etching ILD 48 to expose the underlying portions of CESL 46, and then etching the exposed portions of CESL 46 to reveal epitaxy regions 42. In accordance with some embodiments of the present disclosure, as illustrated in FIG. 10, gate spacers 38 are spaced apart from the nearest contact openings 60 by some portions of ILD 48 and CESL 46.

Figure 12:
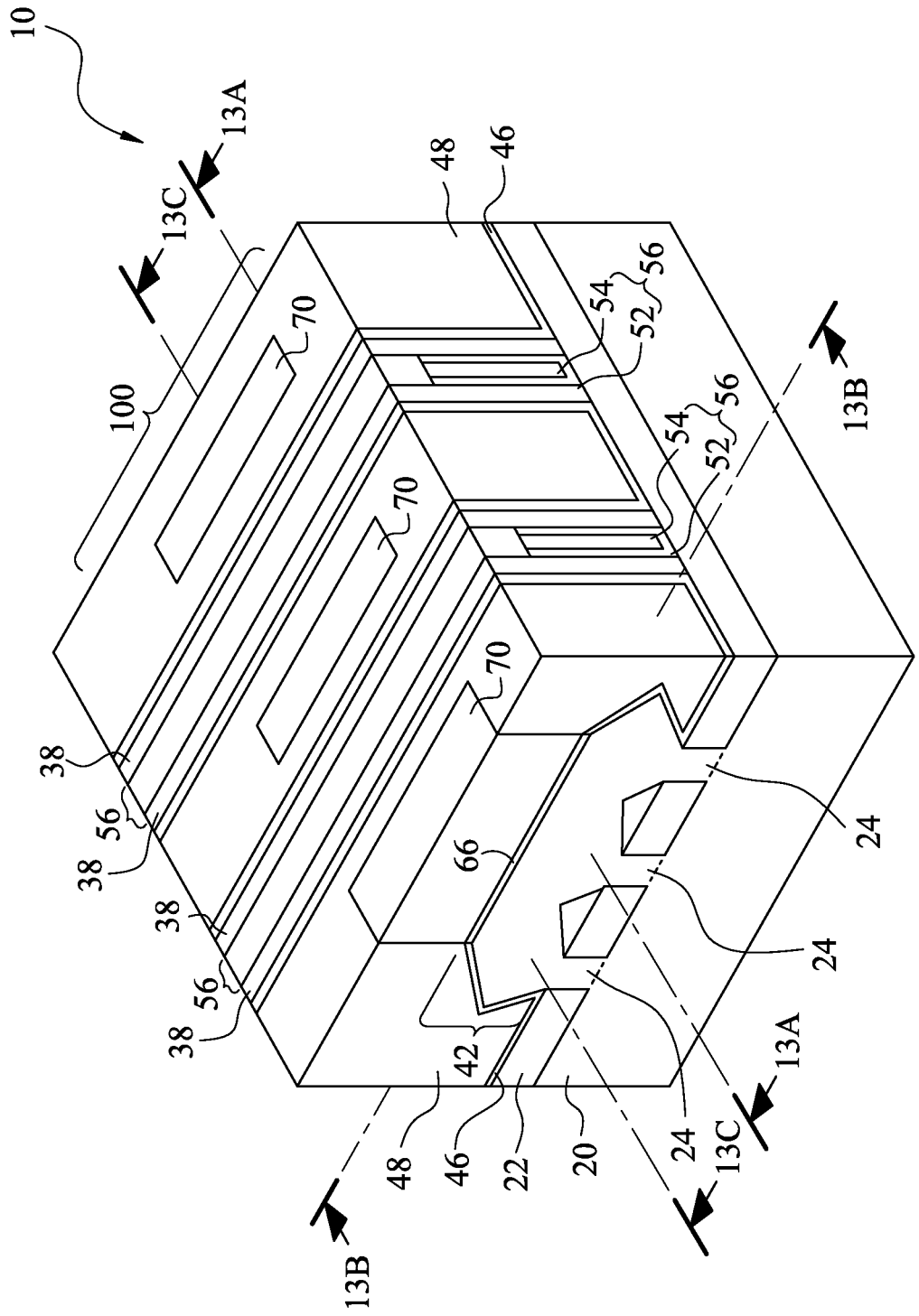
Figure 13A:
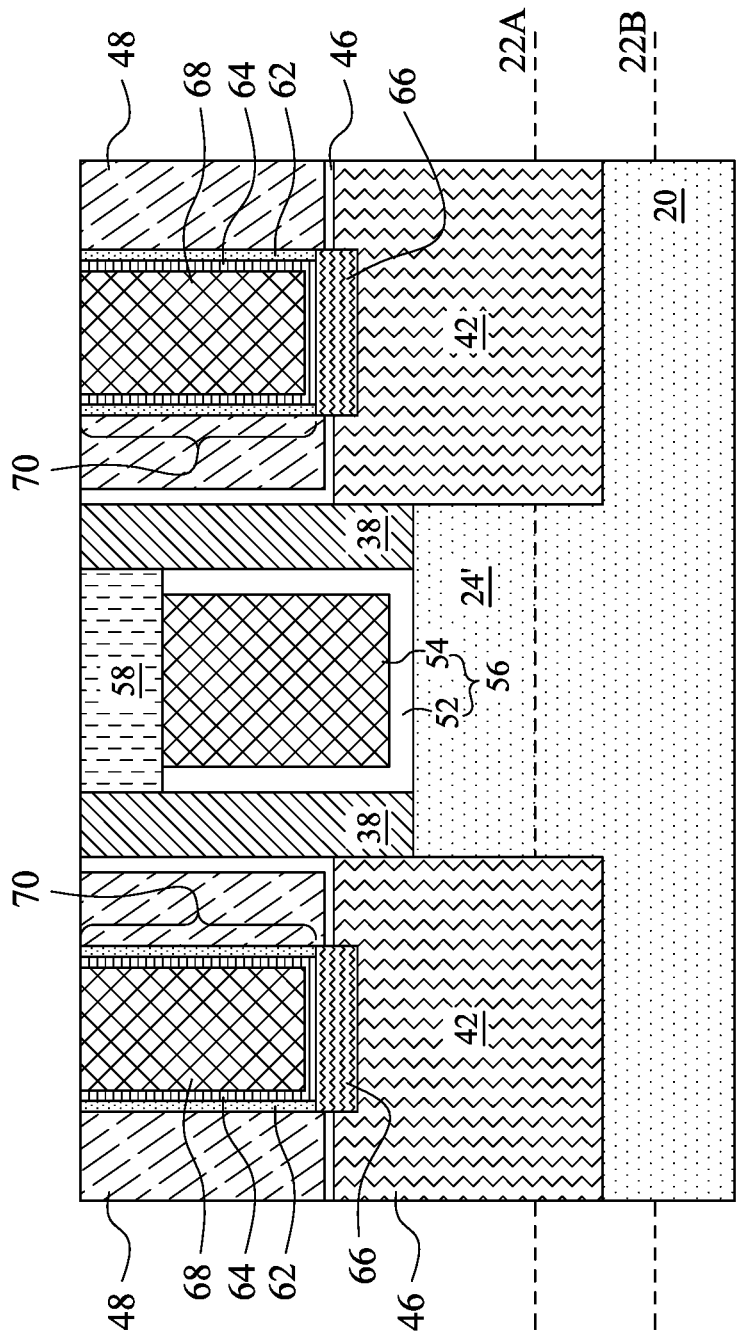
Figure 13B:
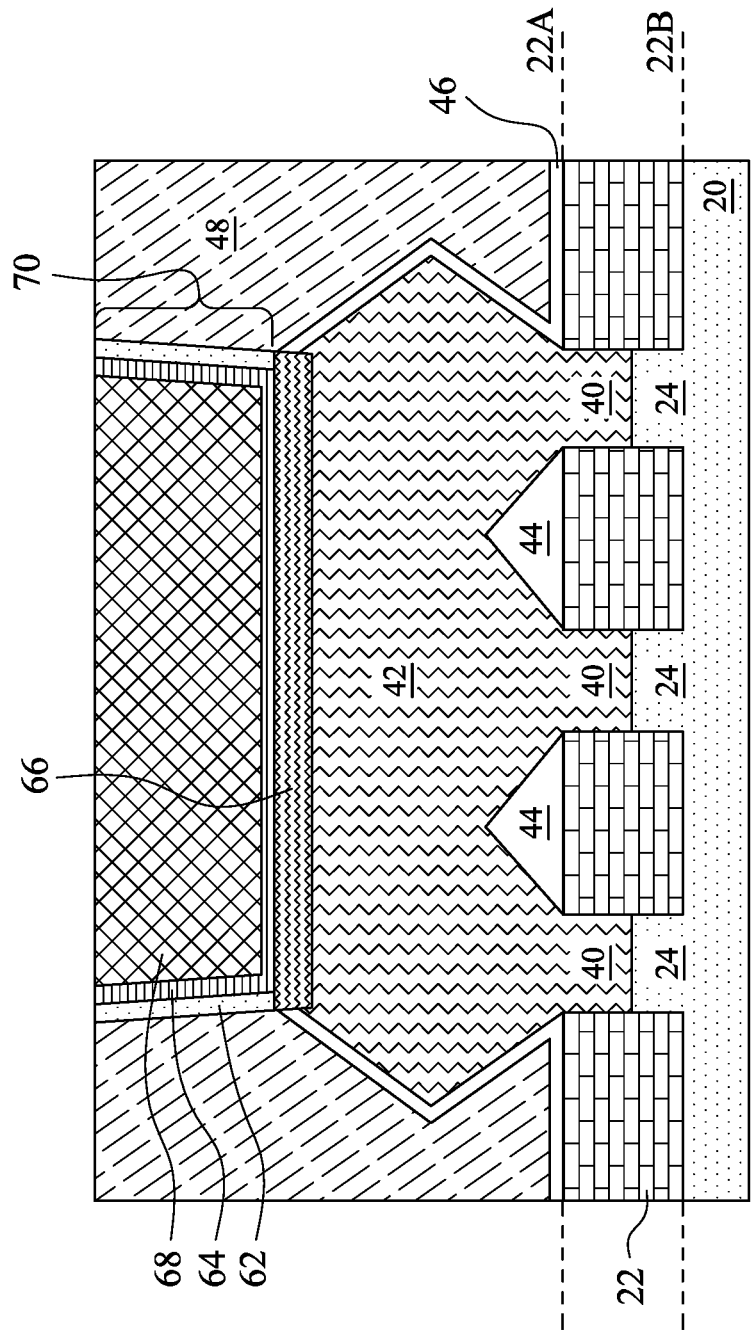

Referring to FIGS. 12, 13A, and 13B, silicide regions 66 and lower source/drain contact plugs 70 are formed. FIG. 12 illustrates a perspective view, FIG. 13A illustrates the reference cross-section 13A-13A in FIG. 12, and FIG. 13B illustrates the reference cross-section 13B-13B in FIG. 12. In accordance with some embodiments, metal layer 62 (such as a titanium layer or a cobalt layer) is deposited, for example, using Physical Vapor Deposition (PVD) or a like method. Metal layer 62 is a conformal layer, and extends onto the top surface of epitaxy regions 42 and the sidewalls of ILD 48. A capping layer 64, for example, utilizing a metal nitride layer (such as a titanium nitride layer) is deposited. An annealing process is then performed to form source/drain silicide regions 66, as shown in FIGS. 12, 13A, and 13B. The respective process is illustrated as process 220 in the process flow 200 shown in FIG. 32. Next, a metallic region 68 formed of a metallic material, which may comprise cobalt, tungsten, or the like, is filled into the remaining portions of the contact openings. A planarization process such as a CMP process or a mechanical grinding process is then performed to remove excess portions of the metal layer 62, the capping layer 64, and the metallic material of the metallic region 68, leaving lower source/drain contact plugs 70. The respective process is also illustrated as process 220 in the process flow 200 shown in FIG. 32. FinFET 100 is thus formed.

FIGS. 14A through 19B illustrate additional intermediate steps in forming upper source/drain contact plugs over the lower source/drain contact plugs 70. FIGS. 14A, 15A, 16A, 18A, and 19A illustrate cross-sections of continuing processes on the cross-section of FIG. 13A, and are along the same cross-section as the reference cross-section 13A-13A of FIG. 12. FIGS. 14A, 15A, 16A, 18A, and 19A also illustrate cross-sections of continuing processes which are parallel to the cross-section of FIG. 13A, for example, along the same cross-section as the reference cross-section 13C-13C of FIG. 12. FIGS. 14B, 15B, 16B, 17, 18B, and 19B illustrate cross-sections of continuing processes on the cross-section of FIG. 13B, and are along the same cross-section as the reference cross-section 13B-13B of FIG. 12.

Figure 14A:
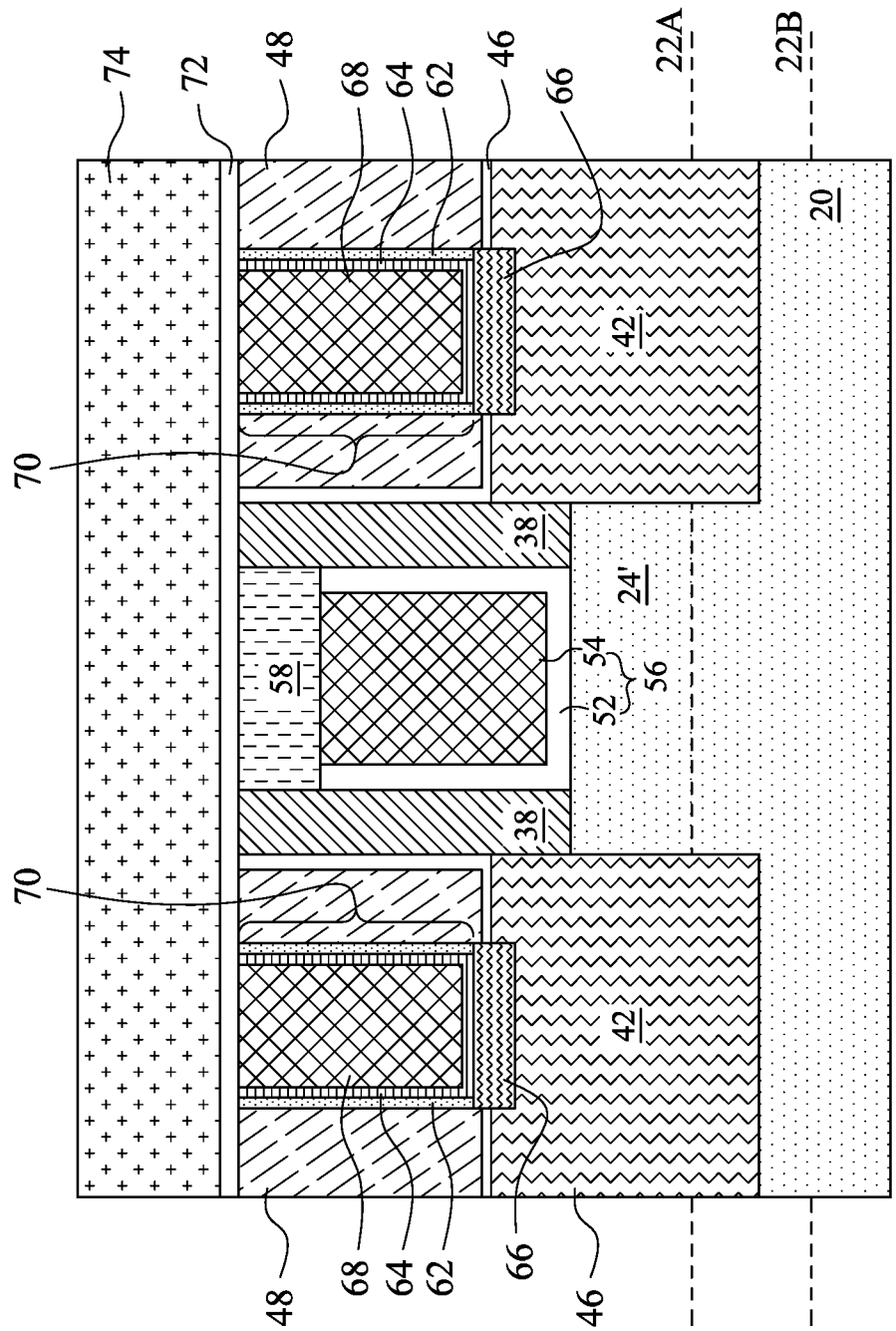
Figure 14B:
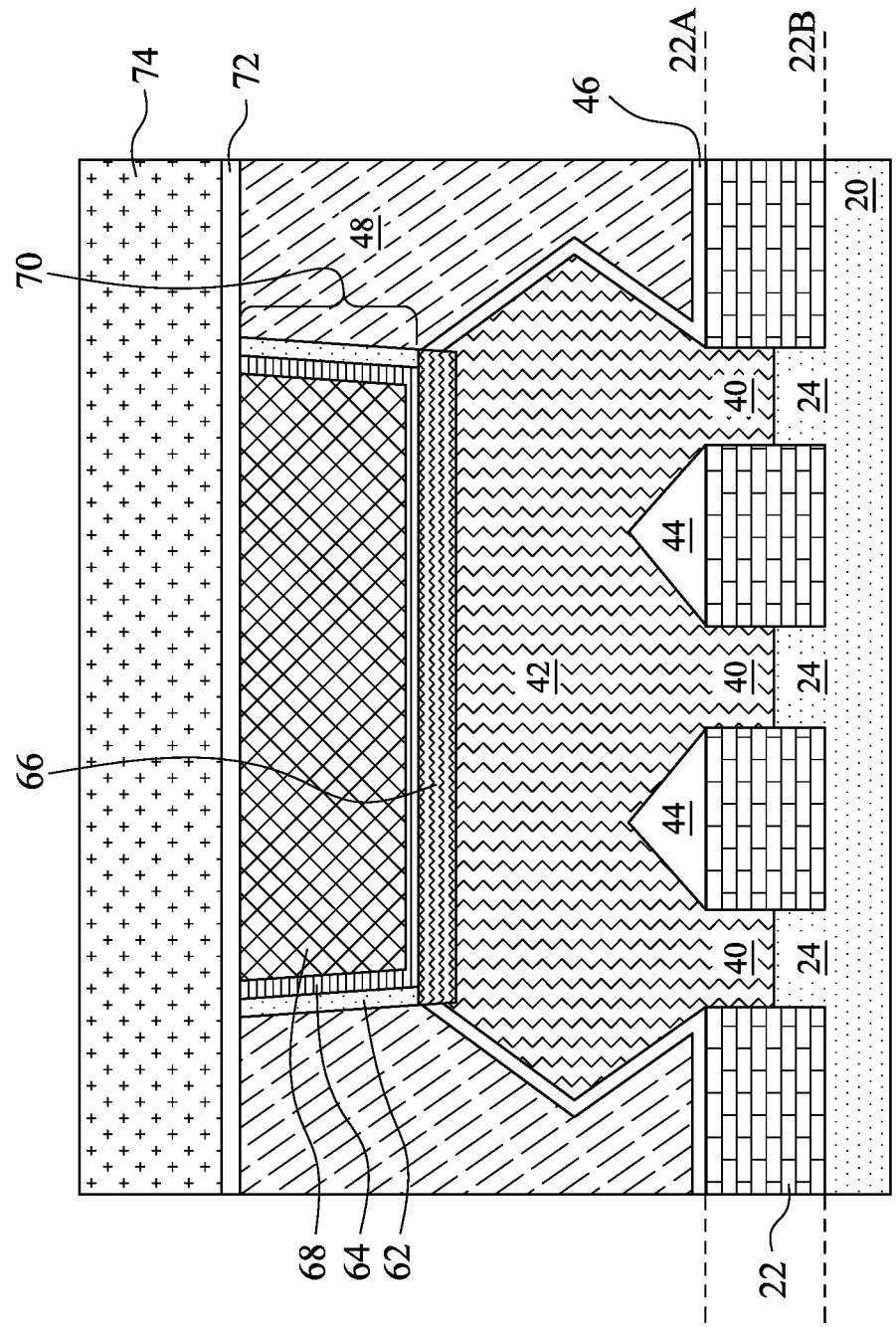

Referring to FIGS. 14A and 14B, etch stop layer (ESL) 72 and inter-layer dielectric (ILD) 74 are deposited. The respective process is illustrated as process 222 in the process flow 200 shown in FIG. 32. ESL 72 may be formed of a dielectric material such as SiN, SiCN, SiC, AlO, AlN, SiOCN, or the like, or composite layers thereof. The formation method may include PECVD, ALD, CVD, or the like.

ILD 74 is deposited over ESL 72. The material and the formation method of ILD 74 may be selected from the same candidate materials and formation methods, respectively, for forming ILD 48. For example, ILD 74 may include silicon oxide, PSG, BSG, BPSG, or the like, which includes silicon therein. In accordance with some embodiments, ILD 74 is formed using PECVD, FCVD, spin-on coating, or the like. In accordance with alternative embodiments, ILD 74 may be formed of a low-k dielectric material.

Figure 15A:
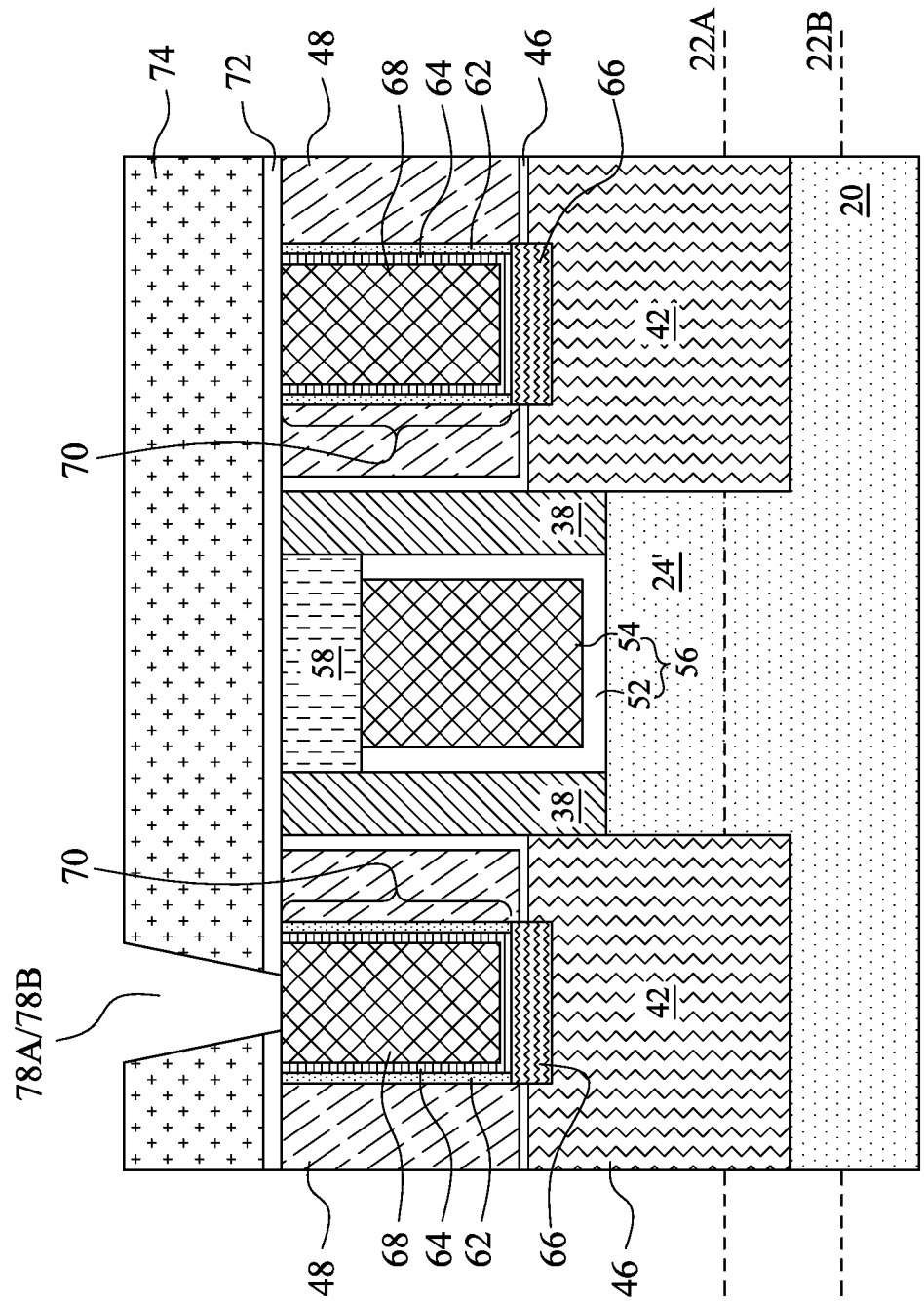
Figure 15B:
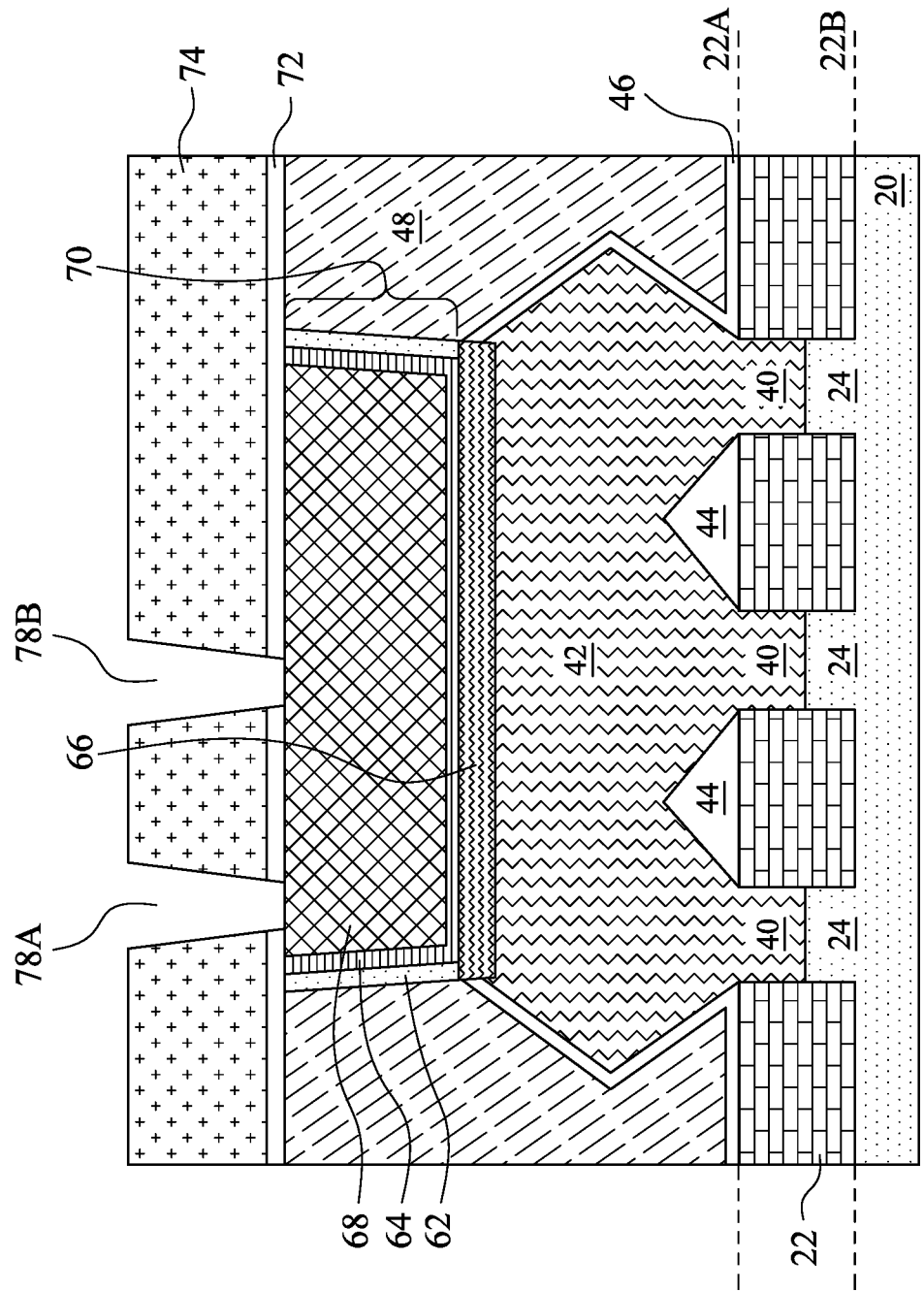

In FIGS. 15A and 15B, source/drain contact openings 78A/78B for the upper source/drain contact plugs are formed. An etching mask (not shown), which may be a tri-layer, is formed over the ILD 74. It should be understood that, in some embodiments, a single source/drain contact opening 78A may be formed near the line end or multiple source/drain contact openings 78A may be formed at opposing ends of the line (metallic region 68). The etching mask is patterned to form openings therein which are then used to define the pattern of the contact openings 78A/78B in ILD 74. If the etching mask is a tri-layer mask, the top layer may be a photoresist material which is patterned using acceptable photolithography techniques. The top layer is then used to pattern the middle layer by an etching process, and the middle layer is used to pattern the lower layer by another etching process. The lower layer then becomes the etching mask for forming the source/drain contact openings 78A/78B. The etching mask is used to protect areas of the ILD 74 which are not to be etched. The ILD 74 is then etched to form the contact openings 78A/78B. The respective process is illustrated as process 224 in the process flow 200 shown in FIG. 32. In accordance with some embodiments, the etching process includes a main etching process utilizing a suitable etchant selective to the ILD 74, using the ESL 72 as an etch stop.

Next, the ESL 72 is etched to reveal the lower source/drain contact plugs 70. The respective process is also illustrated as process 224 in the process flow 200 shown in FIG. 32. The ESL 72 etching may be performed using suitable etchant process gases such as $CHF_3$ or $CH_yF_z$ (y,z=0~9), while carrier gases such as $N_2$ and/or Ar may be added.

As illustrated in FIG. 15B, the contact opening 78A is deliberately disposed near the edge or line end of the lower source/drain contact plugs 70, whereas the contact openings 78B are not disposed near the edge or line end of the lower source/drain contact plugs 70. In some embodiments, the illustrated contact opening 78B is disposed in a different cross-section over a different lower source/drain contact plug 70 than the illustrated contact opening 78A. In some embodiments, contact openings 78B are omitted (all contact openings are disposed near the edge or line end of the lower source/drain contact plugs 70).

Figure 16A:
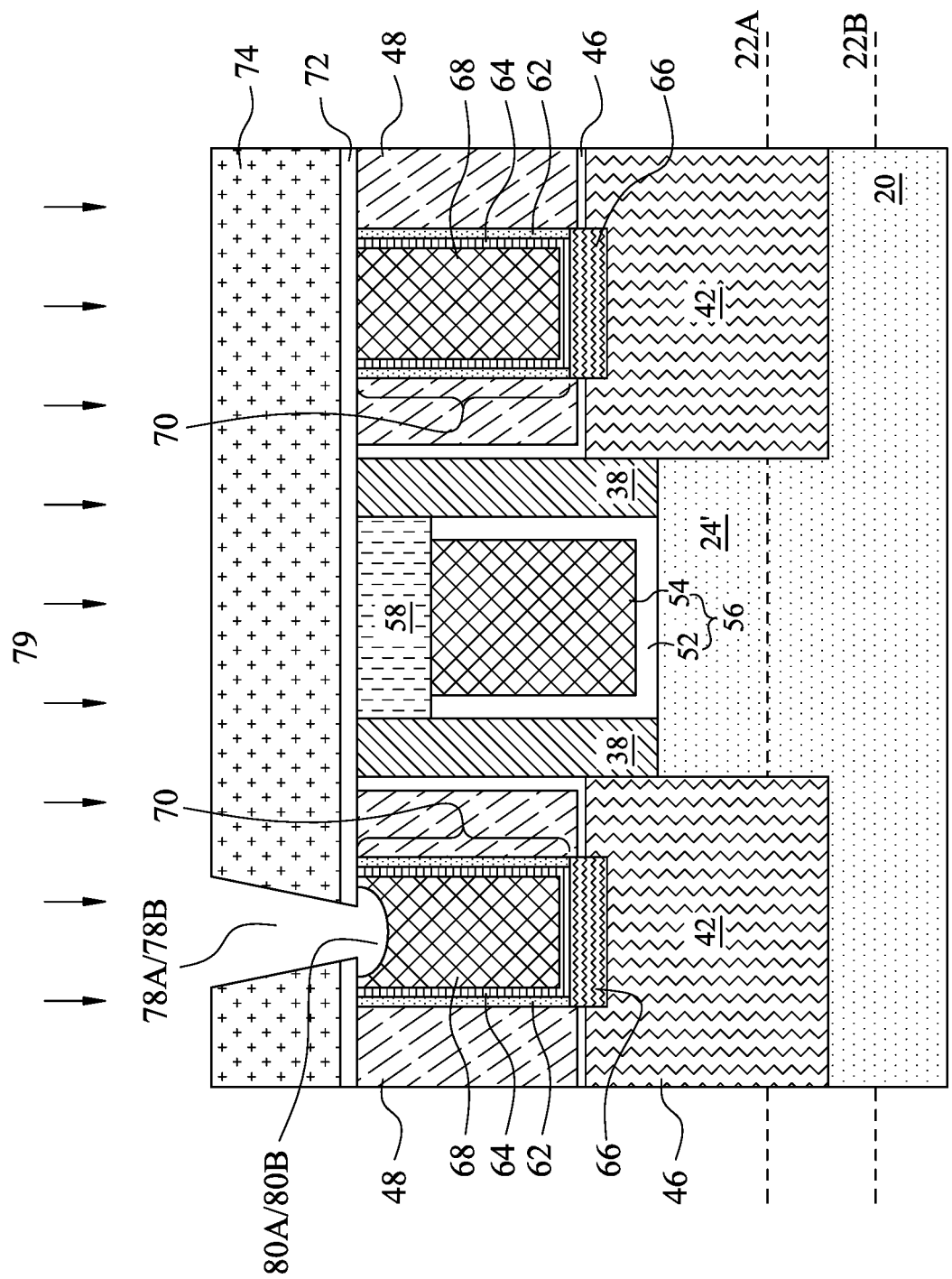
Figure 16B:
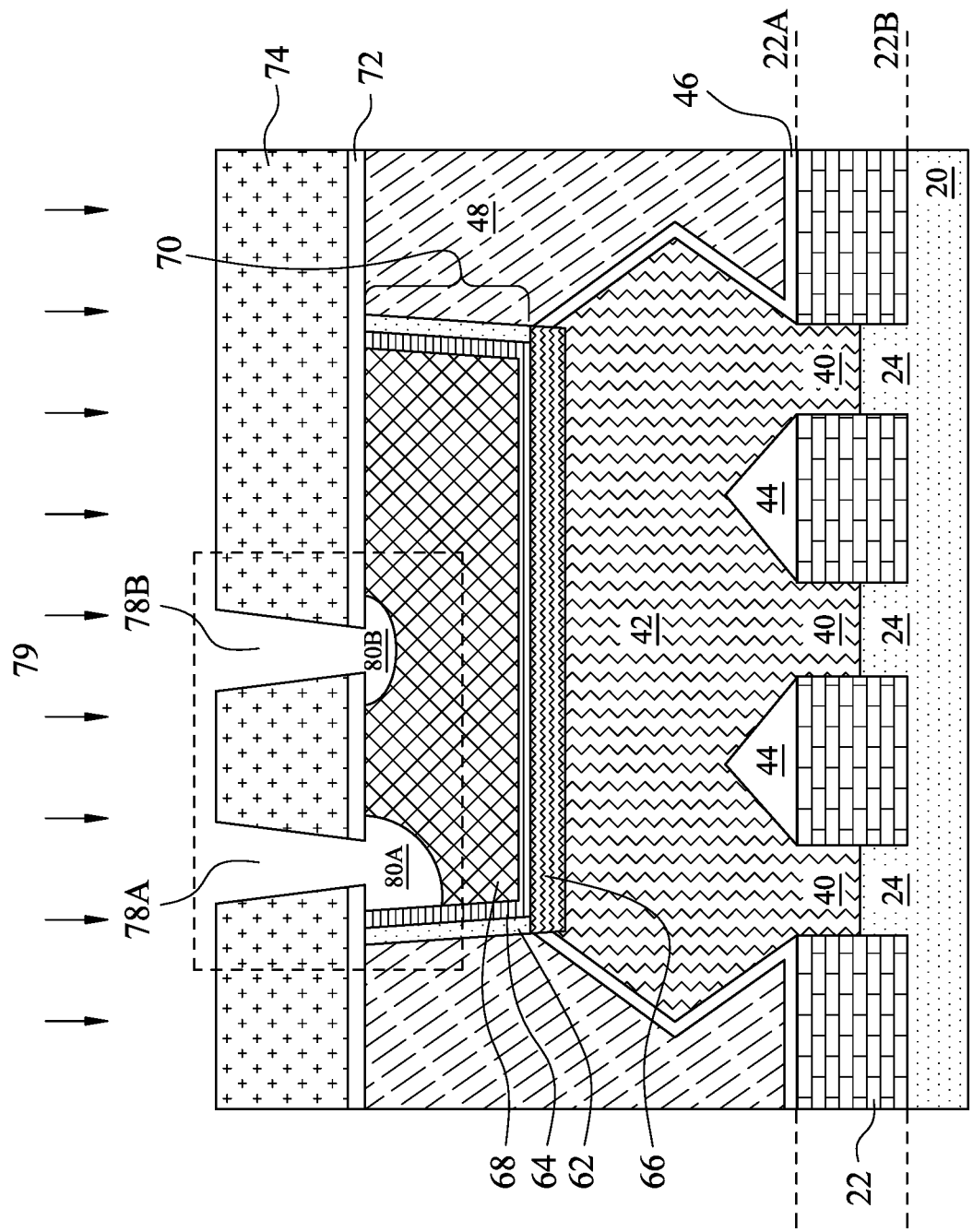

In FIGS. 16A and 16B, an etching process 79 is performed on the contact openings 78A and 78B to extend the contact openings 78A and 78B into the metallic regions 68 of the lower source/drain contact plugs 70 and to form enlarged openings 80A and 80B. The enlarged openings 80A and 80B may also be referred to as depressions, recesses, or an inverted mushroom cap. The respective process is illustrated as process 226 in the process flow 200 shown in FIG. 32. The etching process 79 may use an etchant or may be a cleaning process and may use a cleaning agent. For the sake of simplicity, the etching/cleaning process will be referred to as the etching process 79 and the etching/cleaning agent will be referred to as an etchant. The enlarged openings 80A and 80B provide several advantages. When a subsequent metallic material is deposited in the enlarged openings 80A and 80B and up through the contact openings 78A and 78B the surface area available in the enlarged openings 80A and 80B is greater so that a bottom-up deposition process has improved adherence to the material of the lower source/drain contact plugs 70. Also, because the enlarged openings 80A and 80B extend laterally further than the bottom of the contact openings 78A and 78B, the complete opening is shaped like an inverted mushroom, providing a bottom lip that can help counter any upward force. Further, after the material of the metallic material is deposited in the enlarged openings 80A and 80B and up through the contact openings 78A and 78B, the horizontal surface of the deposited contact serves to block any etchant materials that could seep or leak down between the side of the deposited contact and the bottom surface of the ILD 74. The contact openings 78A provides a further advantage over the contact openings 78B in each of these regards, because of its proximity to the line end of the lower source/drain contact plugs 70. These will be discussed in further detail below.

The etching process 79 used to form the enlarged openings 80A and 80B may use any suitable etchant which is selective to the material of the metallic regions 68 of the lower source/drain contact plugs 70. The etching process 79 can be a wet etch or wet cleaning process where the etchant is provided over the whole surface of the ILD 74 which fills the contact openings 78A and 78B and reacts with the metallic material of the metallic regions 68. For example, where the metallic regions 68 of the lower source/drain contact plugs 70 include cobalt, the material composition may be $CoF_3$ (the presence of fluorine resulting from plasma dissociation of process gasses including one or more of $CF_4$, $C_4F_6$, $CH_yF_z$ (y,z=1~9), or $C_4F_8$ during the plasma etch process of contact via 78A/78B). Deionized water (DIW) may be used as the etchant/cleaning agent, and a reaction between the $CoF_3$ and water will result as follows:

$$4CoF_3 + 2H_2O \rightarrow 4HF + CoF_2 + O_2 \qquad (eq.1)$$

The reaction results in $CoF_2$ which is water soluble, e.g., 1.4 g/100 mL at 25° C. Where different materials of the lower source/drain contact plugs 70 are used, these materials may be similarly etched using a suitable wet etchant for the material used.

The etching of the lower source/drain contact plugs 70 forms enlarged openings 80A/80B in the metallic regions 68 of the lower source/drain contact plugs 70. Where the contact openings 78B are not near the line end of the lower source/drain contact plugs 70, the enlarged openings 80B may have a bowl shape. Where the contact openings 78A are near the line end of the lower source/drain contact plugs 70, the enlarged openings 80A may have a partial bowl shape, where one side of the partial bowl shape is defined by the edge of the metallic regions 68. In the illustrated embodiment, the side of the partial bowl shape is defined by the capping layer 64 which is an artifact of the silicidation process used to form the silicide regions 66. In other embodiments of the present disclosure, the side of the partial bowl shape may be defined by the metal layer 62 or the ILD 48.

Figure 17:
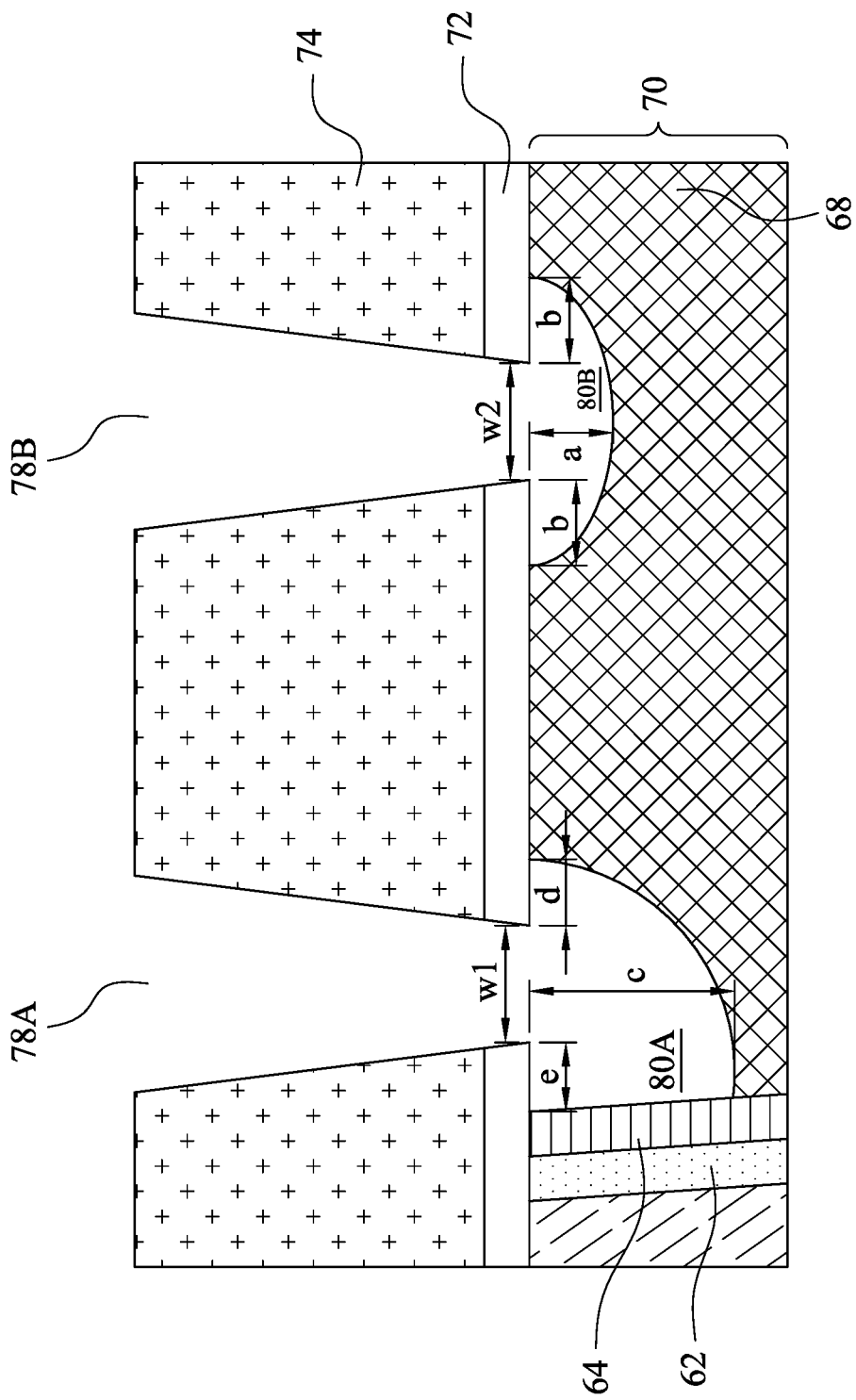

FIG. 17 illustrates an enlarged view of the dashed box of FIG. 16B. FIG. 17 illustrates the enlarged opening 80A and the enlarged opening 80B. As seen in FIG. 17, the size characteristics of the enlarged opening 80A are different than the size characteristics than the enlarged opening 80B. The enlarged opening 80A has a partial bowl shape, and the enlarged opening 80B has a bowl shape. Due to the proximity of the contact opening 78A to the line edge of the lower source/drain contact plugs 70, as the etchant reacts with the metallic region 68, the sidewall of the lower source/drain contact plugs 70 forces etchant to concentrate more on the bottom of the enlarged opening 80A and more on the wide side of the enlarged opening 80A (the wide side being the side opposite the line edge of the lower source/drain contact plugs 70). Thus, the etchant removes more material on the wide side of the enlarged opening 80A than on the narrow side of the enlarged opening 80A and causes an overhang of the ESL 72 and/or ILD 74 over the enlarged opening 80A. In contrast, for the enlarged opening 80B, the etchant may react with the metallic region 68 at the bottom of the contact opening 78B, and as the etching progresses, the etchant may spread evenly laterally in all directions, removing portions of the metallic region 68 evenly beyond the lateral extents of the bottom of the contact opening 78B and causing an overhang of the ESL 72 and/or ILD 74 over the enlarged opening 80B.

The differences in the two enlarged openings 80A and 80B may be observed by differences in the depths and widths of the enlarged openings 80A and 80B. The width of the enlarged opening 80A includes the width w1 of the bottom of the contact openings 78A plus the overhang width d and the overhang width e. The overhang width d corresponds to the width of the enlarged opening 80A between the edge of the width w1 and the side (e.g., remaining side portion of the metallic region 68) of the enlarged opening 80A. The overhang width d also corresponds to the width of the portion of the ESL 72 and/or ILD 74 on a side of the contact opening 78A opposite the line end of the lower source/drain contact plugs 70 that overhangs the enlarged opening 80A. The overhang width e corresponds to the width of the enlarged opening 80A between the edge of the width w1 and the side (e.g., capping layer 64) of the enlarged opening 80A. The overhang width e also corresponds to the width of the portion of the ESL 72 and/or ILD 74 that overhangs the enlarged opening 80A. The depth c of the enlarged opening 80A corresponds to the distance between the level of the upper surface of the metallic region 68 and the bottom of the enlarged opening 80A.

The width of the enlarged opening 80B includes the width w2 of the bottom of the contact openings 78B plus the overhang width b on each side of the enlarged opening 80B. The overhang width b corresponds to the width of the enlarged opening 80B between the edge of the width w2 and the side (e.g., remaining side portion of the metallic region 68) of the enlarged opening 80B. The overhang width b also corresponds to the width of the portion of the ESL 72 and/or ILD 74 that overhangs the enlarged opening 80B. The depth a of the enlarged opening 80B corresponds to the distance between the level of the upper surface of the metallic region 68 and the bottom of the enlarged opening 80B.

Due to the side (e.g., capping layer 64) being unreactive to the etchant of the etching process 79, the depth c and width d of the enlarged openings 80A are respectively greater than the depth a and the width b of the enlarged openings 80B. In addition, in the enlarged opening 80A, the depth c is greater than the overhang width e and overhang width d. In the enlarged opening 80B, the depth a is greater than the overhang widths b. In addition, the volume of the enlarged opening 80A is greater than the volume of the enlarged opening 80B. In some embodiments, the overhang width b may be between about 4 nm and about 9 nm and the depth a may be between about 7 nm and about 10 nm. In some embodiments, the overhang width d may be between about 4 nm and about 12 nm. The width e may be about 0 nm to about 3 nm. Other values for these dimensions are contemplated and may be used. As to the differences between the enlarged openings 80A and 80B, the difference between a and b may be less than about 1 nm, the depth c may be larger than a by a distance of about 0 nm to 3 nm, the width d may be larger than the width b by a distance of about 0 nm to 3 nm, and the difference between c and d may be less than about 3 nm.

Figure 18A:
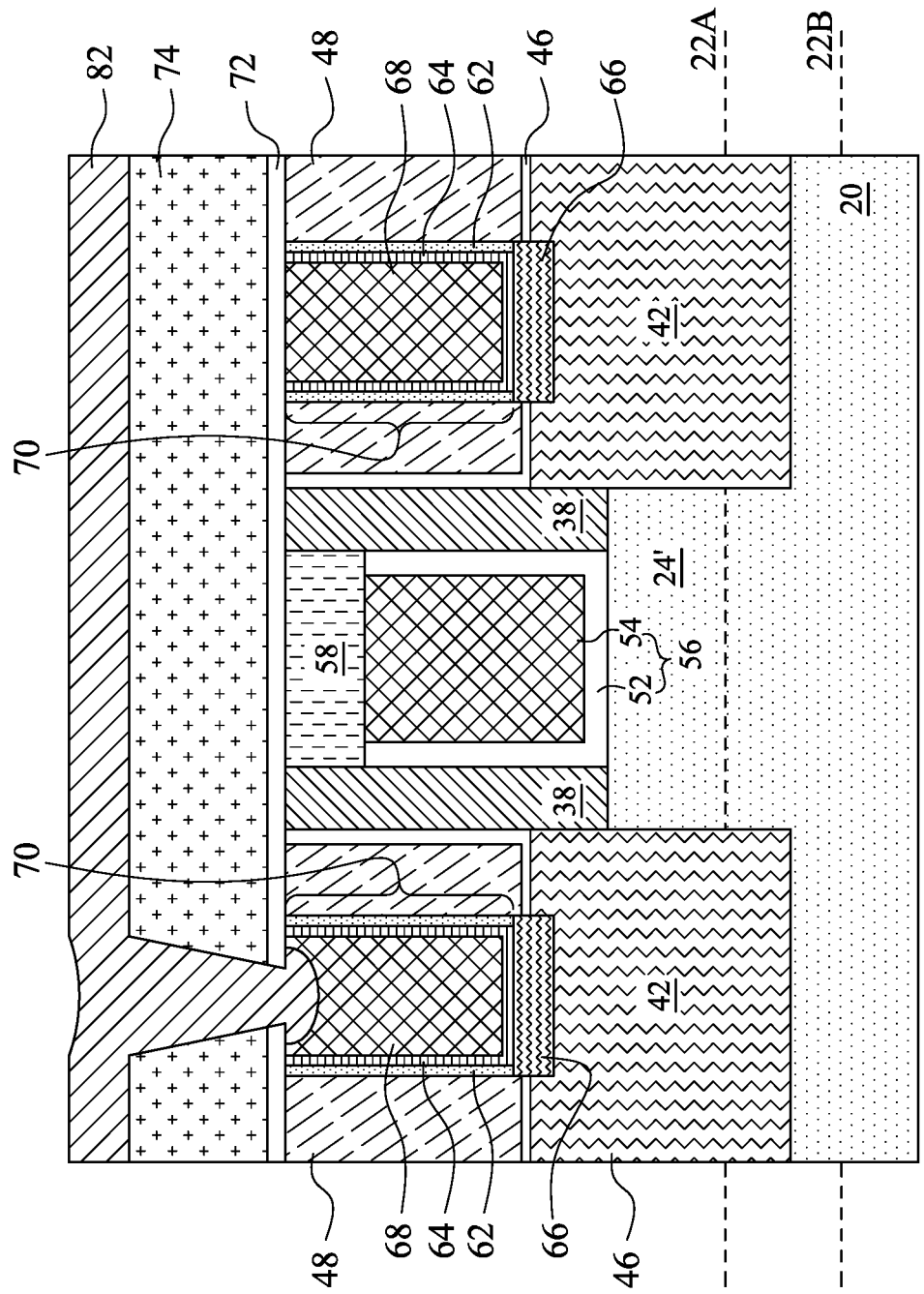
Figure 18B:
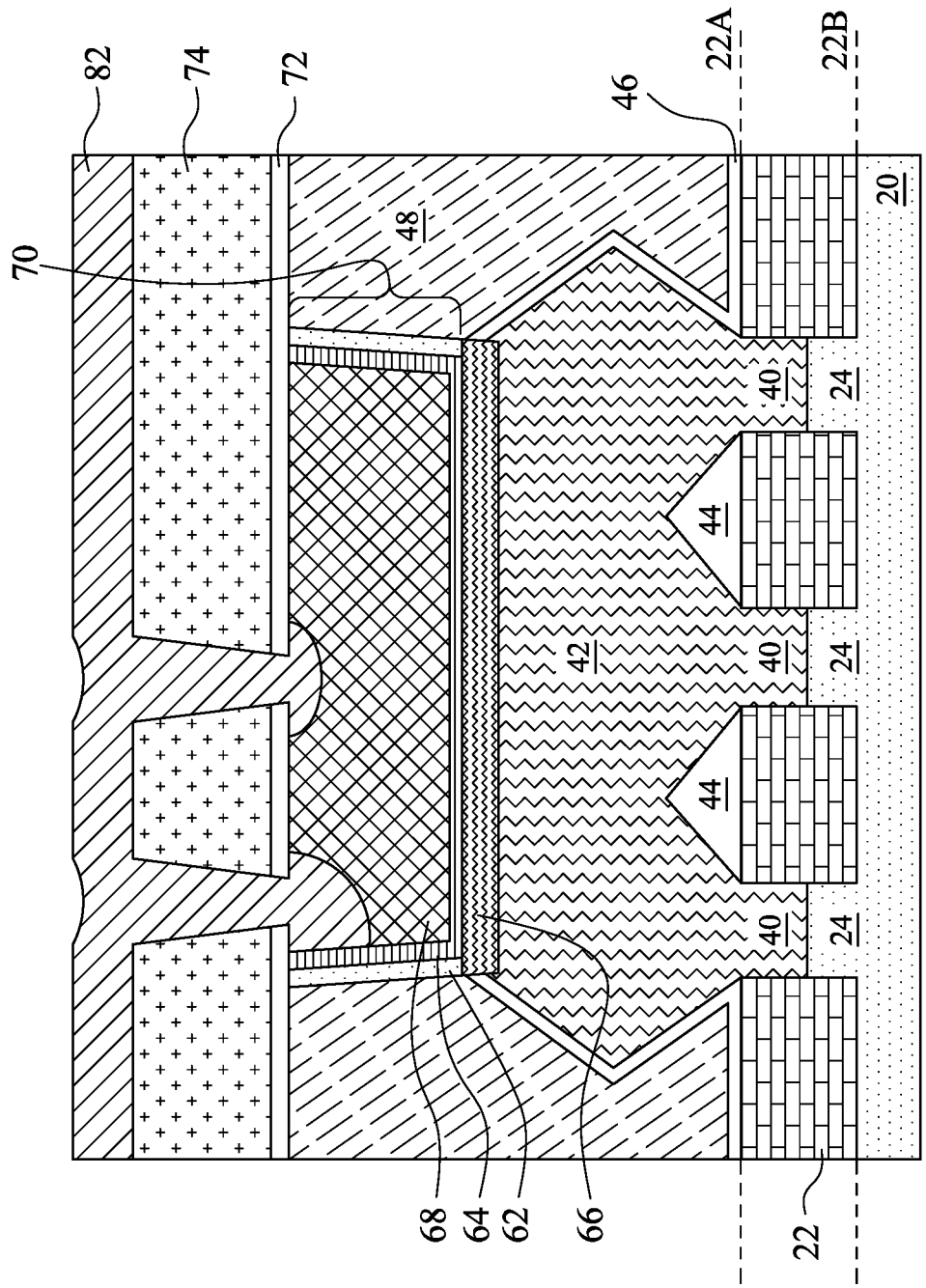

Referring to FIGS. 18A and 18B, metallic material 82 is filled into enlarged openings 80A and 80B and in the contact openings 78A and 78B. The respective process is illustrated as process 228 in the process flow 200 shown in FIG. 32. In accordance with some embodiments, metallic material 82 comprises a metal such as Ru, Co, Ni, Cu, Al, Pt, Mo, W, Al, Ir, Os, or combinations thereof. Metallic material 82 is deposited using a bottom-up deposition process, which may be performed using a thermal Chemical Vapor Deposition (CVD) process. The temperature of wafer 10 may be in the range between 200° C. and about 400° C. The bottom-up deposition process may be performed using $WF_6$ and $H_2$ as process gases (when tungsten is to be deposited), or use other process gases when other materials are adopted. With the bottom-up deposition, enlarged openings 80A and 80B and contact openings 78A and 78B may be filled with no air-gap generated therein. The deposition method may also include CVD, ALD, PVD, ECP, ELD, or the like.

The deposition of metallic material 82 may be performed in a temperature range between about 50° C. and about 500° C., with carrier gas including argon or nitrogen with flow rate of about 10 sccm and about 500 sccm in accordance with some embodiments. Reactant gases such as the metal-containing precursor, $H_2$, $O_2$, $NH_3$, or the like may be added, with flow rates of about 10 sccm and about 500 sccm, and pressure in the range between about 0.00001 Torr and about 10 Torr in accordance with some embodiments.

In accordance with some embodiments, metallic material 82 is formed of a homogenous material, and does not include a barrier layer. In accordance with alternative embodiments, metallic material 82 is formed of a homogenous material, and there is a conformal barrier layer (not shown) formed before metallic material 82 is deposited. The conformal barrier layer may be formed of titanium, titanium nitride, tantalum, tantalum nitride, or the like.

Figure 19A:
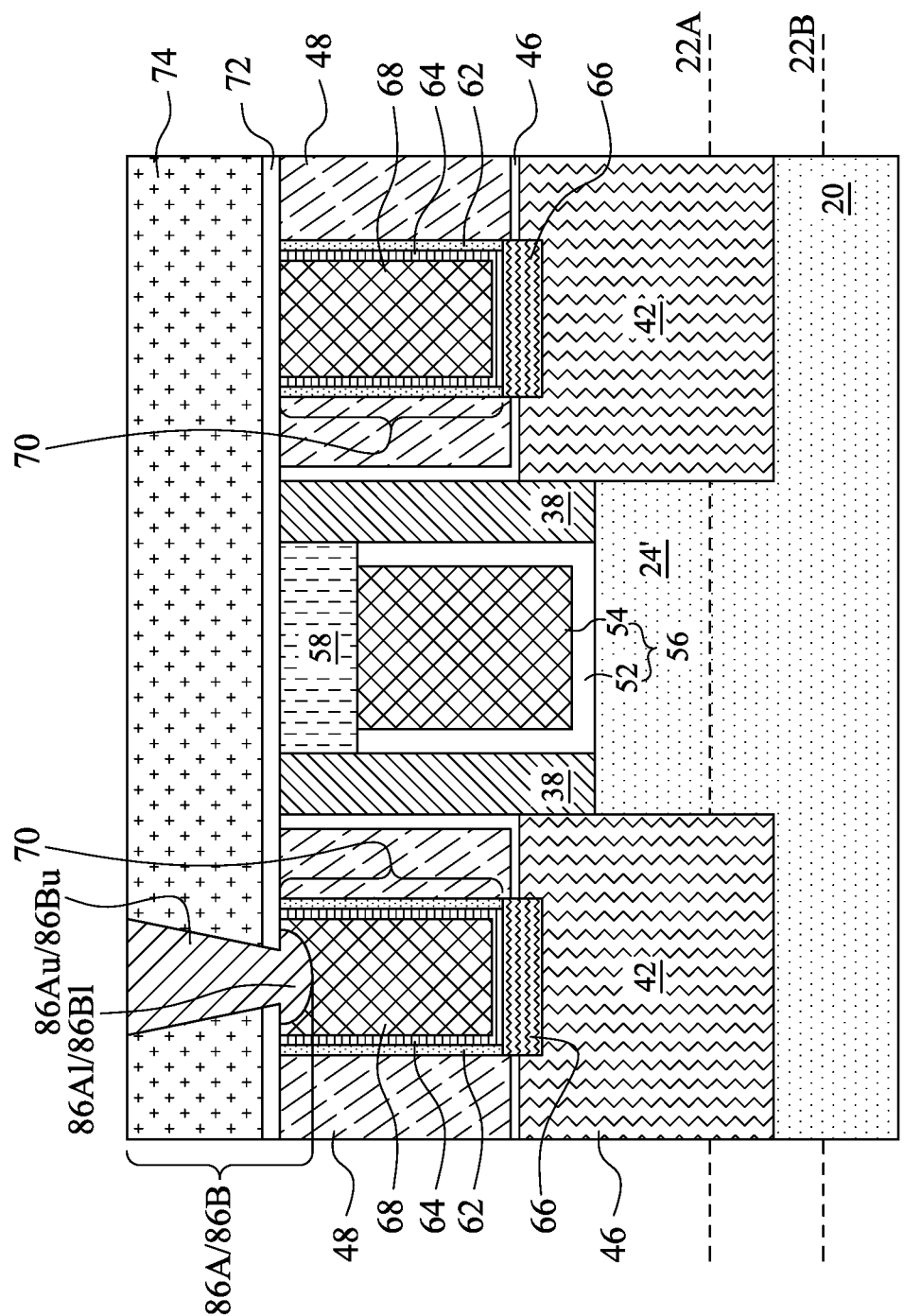
Figure 19B:
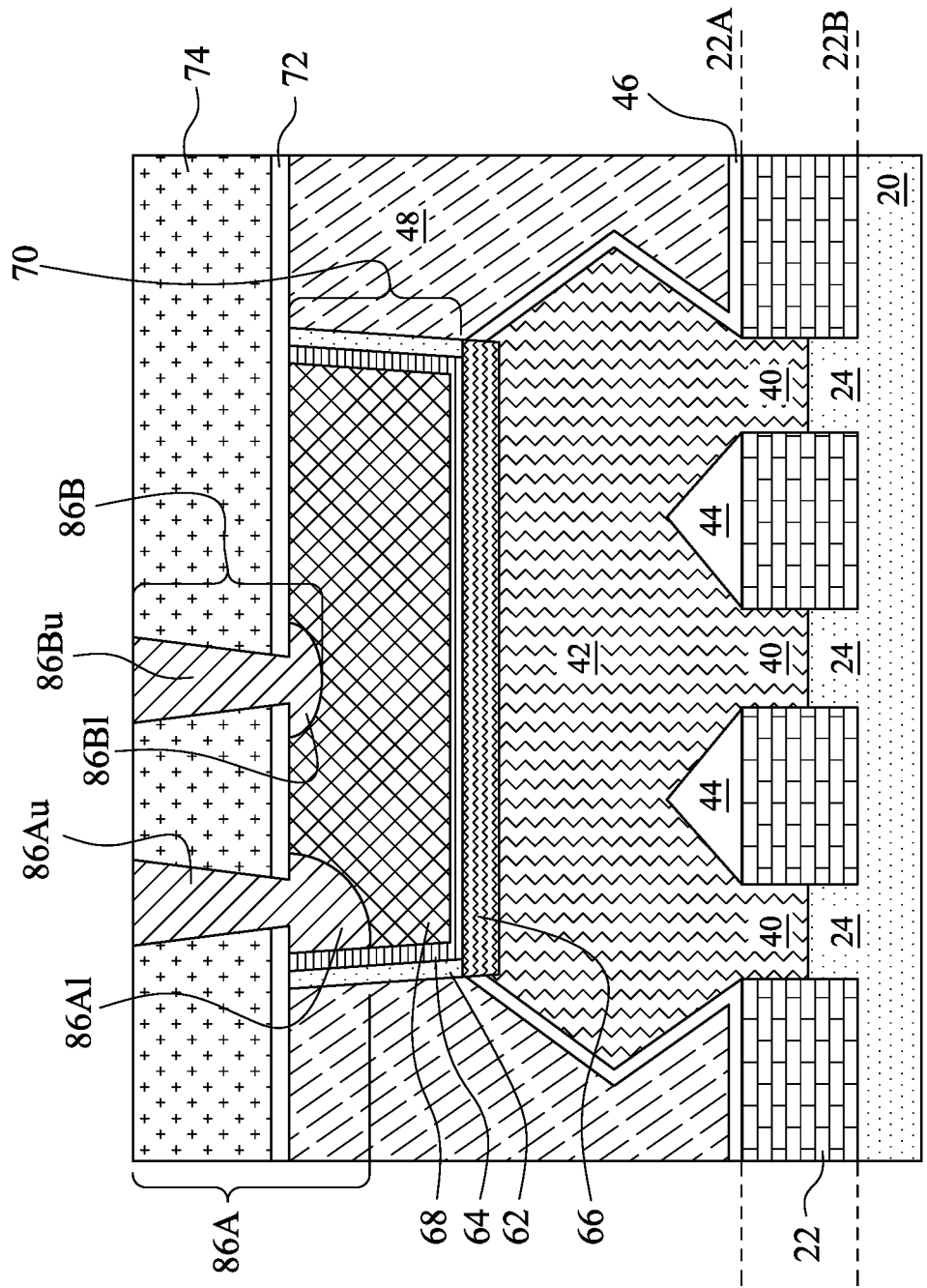

FIGS. 19A and 19B illustrate a planarization process for removing excess portions of metallic material 82, and hence conductive vias 86A and 86B are formed. The respective process is illustrated as process 230 in the process flow 200 shown in FIG. 32. Conductive vias 86A and 86B include lower (expanded) portions 86A*l* and 86B*l*, which extend into the metallic regions 68 of the lower source/drain contact plugs 70, and upper portions 86Au and 86Bu, which is disposed in the ILD 74 and laterally surrounded by the ILD 74. The lower portions 86A*l* and 86B*l* may be considered contact extensions or contact extension regions of the conductive vias 86A and 86B. The resulting relationships between the relationships between the lower portions 86A*l* and 86B*l* follow from the relationships of their respective enlarged openings and the dimensions a, b, c, d, and e, as described above with respect to FIG. 17. In the cross-sectional view as shown in FIGS. 19A and 19B, the lower portion 86A*l* and 86B*l* of conductive vias 86A and 86B extend laterally beyond the respective overlaying upper portions 86Au and 86Bu. The upper portions 86Bu are aligned to the lower portions 86B*l* of the conductive vias 86B. In other words, the side-to-side centers of the upper portions 86Bu are aligned with the side-to-side centers of the lower portions 86B*l*. In contrast, the upper portions 86Au are not aligned to the lower portions 86A*l* of the conductive vias 86A. In other words, the side-to-side centers of the upper portion 86Au are not aligned with (or offset from) the side-to-side centers of the lower portion 86A*l*.

During the planarization process, etching chemicals may seep or leak between the upper portions 86Au and 86Bu of the conductive vias 86A and 86B and the bottom surface of the ILD 74. The etching chemicals can continue to seep to the ESL 72 and contact the upper surface of the lower portions 86A*l* and 86B*l* of the conductive vias 86A and 86B. In the conductive vias 86B, the etching chemicals can continue to spread beyond the width of the lower portion 86B*l*—beyond the width b of FIG. 17—and damage the metallic regions 68. Because the conductive via 86A is near the line end of the lower source/drain contact plugs 70, however, the width d is greater than the width b and the potential for damage to the metallic regions 68 is less. And, in the event of damage to the metallic regions 68 through the conductive vias 86A, the damage is less than similar damage to the metallic regions 68 through the conductive vias 86B.

Due to the lower portions 86A*l* and 86B*l*, the resulting conductive vias 86A and 86B also have the advantage of providing greater stability to counter upward force. The lower portions 86A*l* and 86B*l* are wider than the bottom of the upper portions 86Au and 86Bu, providing a lip of the conductive vias 86A and 86B which resist upward force. A further advantage of the lower portions 86A*l* and 86B*l* of the conductive vias 86A and 86B is due to the exposed surface area of the metallic regions 68. The greater surface area provides better adherence of the conductive vias 86A and 86B to the metallic region 68 (and, in the case of the conductive via 86A, the capping layer 64, metal layer 62, or ILD 48). The greater surface area also reduces conductive resistance between the metallic region 68 and the conductive vias 86A and 86B. The greater volume of the conductive via 86A in the lower portions 86A*l* also provides reduced conductive resistance as compared to the conductive via 86B.

Figure 20:
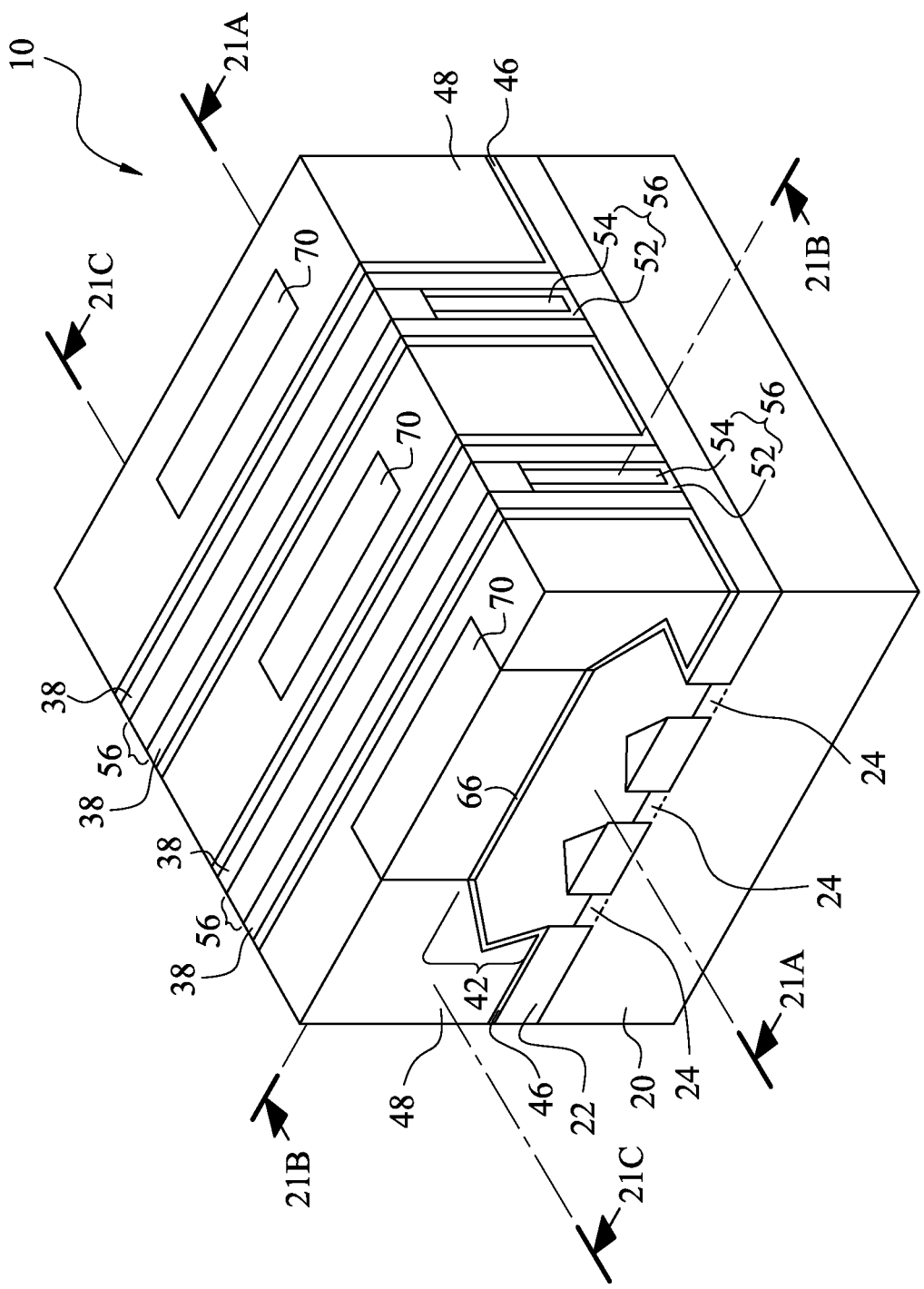
FIGS. 20, 21A, 21B, 21C, 22A, 22B, 22C, 23A, 23B, 23C, 24A, 24B, and 24C are perspective views and cross-sectional views of intermediate stages in the formation of gate contact vias in accordance with some embodiments.

FIG. 20 illustrates a perspective view of the structure in FIG. 14A, however, the ILD 74 and ESL 72 have been omitted from FIG. 20 to show other details. FIGS. 21A through 24C illustrate intermediate steps in forming gate contact plugs over the gate electrodes 54, in accordance with some embodiments. FIGS. 21A, 22A, 23A, and 24A illustrate cross-sections of continuing processes on the device of FIG. 14A, and are along the same cross-section as the reference cross-section 21A-21A of FIG. 20. FIGS. 21B, 22B, 23B, and 24B illustrate cross-sections of continuing processes on the device of FIG. 14A, and are along the same cross-section as the reference cross-section 21B-21B of FIG. 20. FIGS. 21C, 22C, 23C, and 24C illustrate cross-sections of continuing processes on the device of FIG. 14A, and are along the same cross-section as the reference cross-section 21C-21C of FIG. 20, which is parallel to the cross-section 21A-21A of FIG. 20. It should be appreciated that the various views may be combined into a single cross-section though the actual contact structures exist in different cross-sections. For the sake of simplicity, FIGS. 21A through 24C do not illustrate the conductive vias 86A and 86B, as described above, however, the conductive vias 86A and 86B may be formed at the same time as the gate contact plugs, as described with respect to FIGS. 21A through 24C.

Figure 21A:
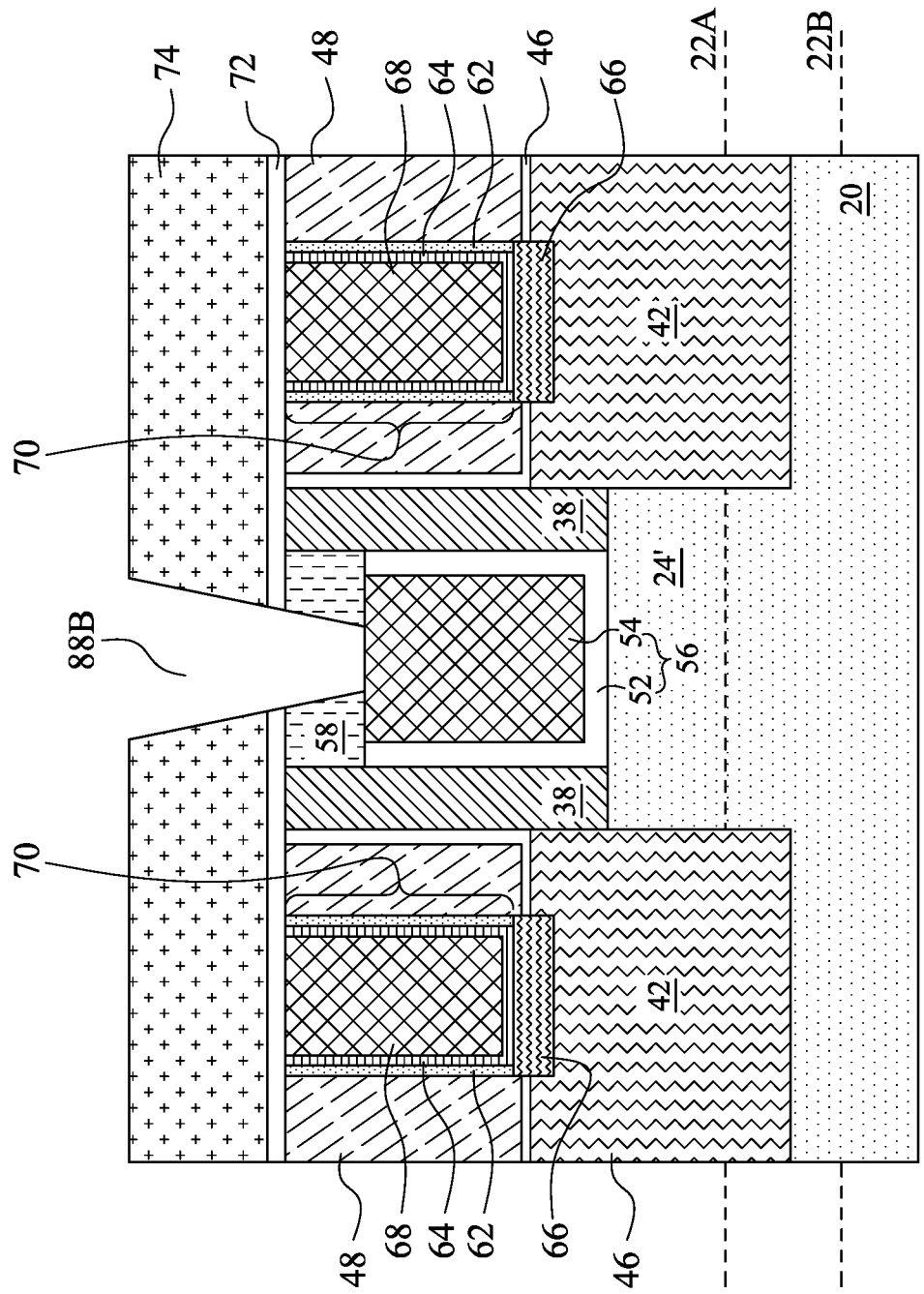
Figure 21B:
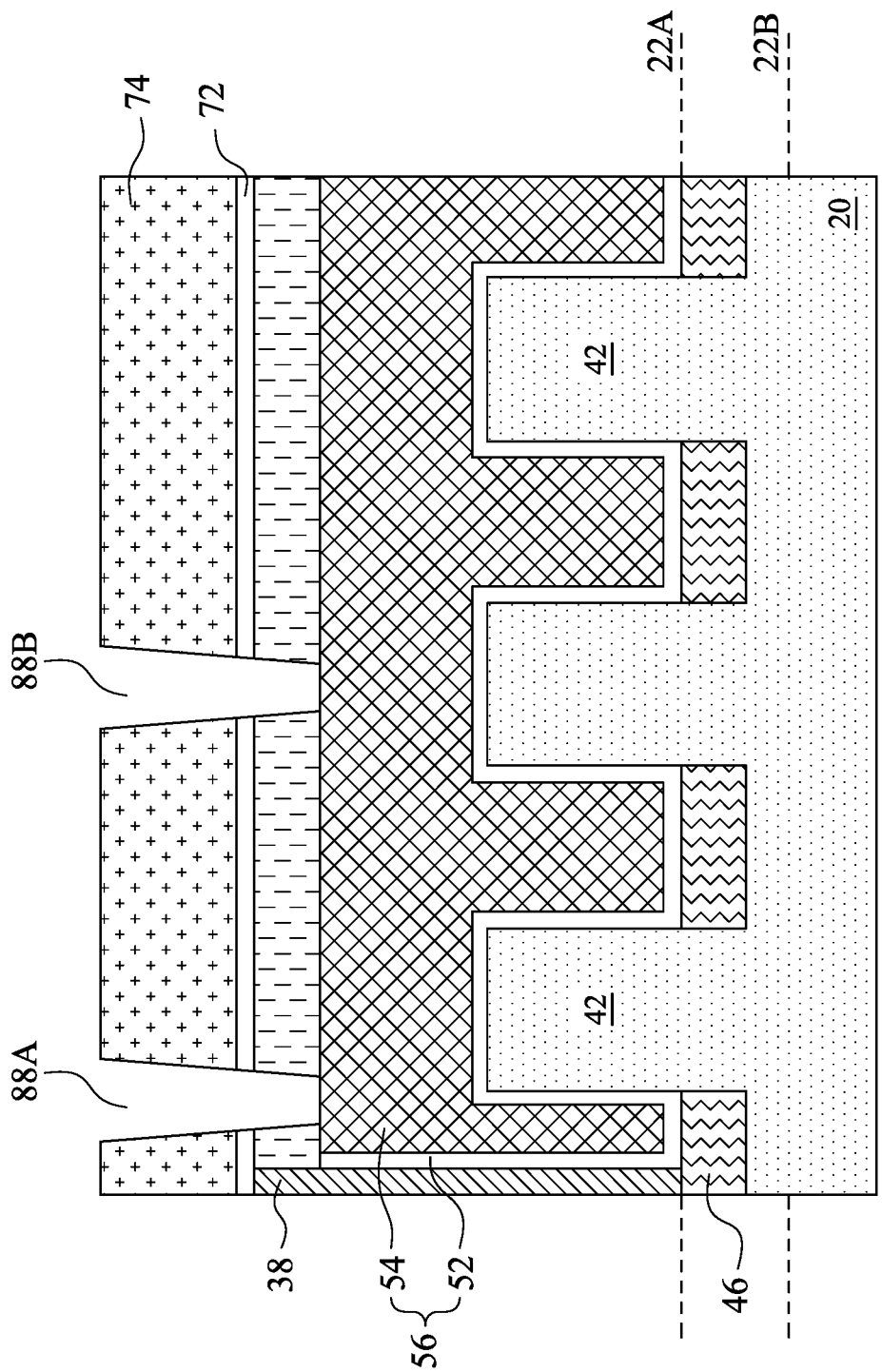
Figure 21C:
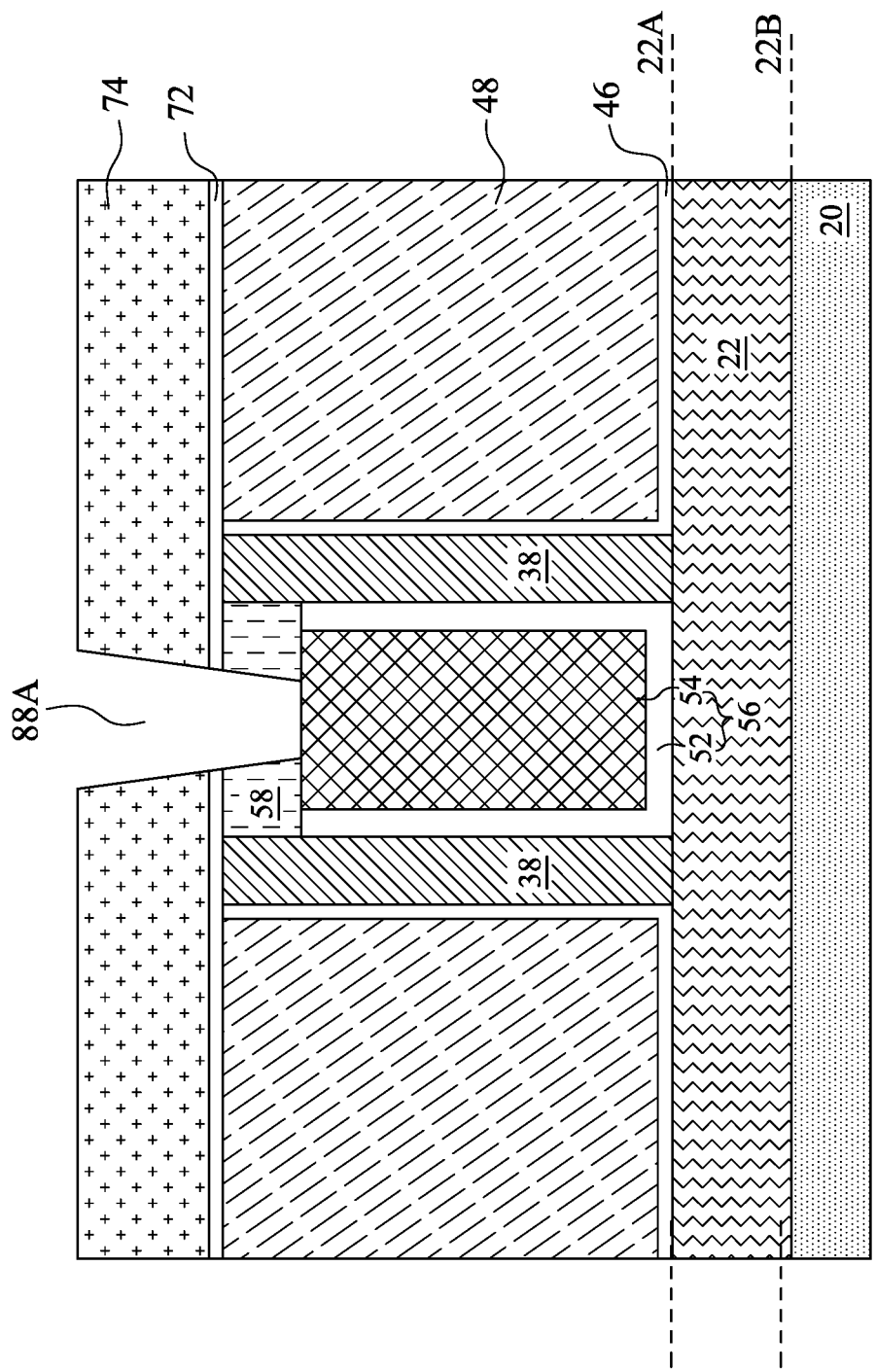
Figure 33:
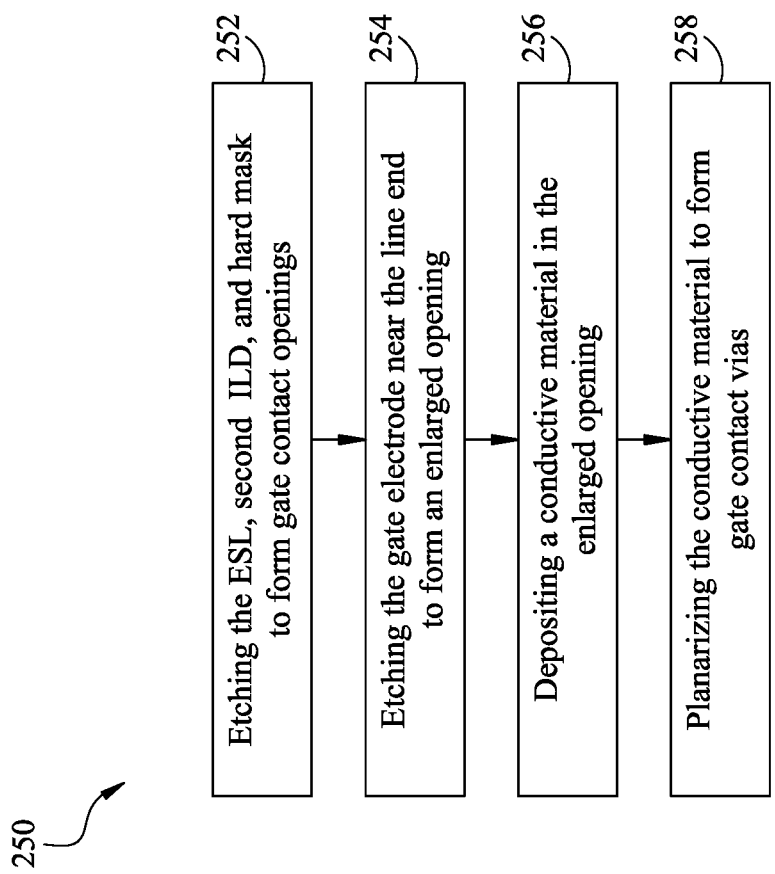
FIG. 33 illustrates a process flow for forming gate contact vias in accordance with some embodiments.

In FIGS. 21A-21C, gate contact openings 88A and 88B are formed, in accordance with some embodiments. In some embodiments a single gate contact opening may be formed for each gate contact, while in other embodiments, multiple gate contact openings may be formed. An etching mask (not shown), which may be a tri-layer, is formed over the ILD 74. The etching mask is patterned to form openings therein which are then used to define the pattern of the gate contact openings 88A/88B in ILD 74. If the etching mask is a tri-layer mask, the top layer may be a photoresist material which is patterned using acceptable photolithography techniques. The top layer is then used to pattern the middle layer by an etching process, and the middle layer is used to pattern the lower layer by another etching process. The lower layer then becomes the etching mask for forming the gate contact openings 88A/88B. The etching mask is used to protect areas of the ILD 74 which are not to be etched. The ILD 74 is then etched to form the gate contact openings 88A/88B. The respective process is illustrated as process 252 in the process flow 250 shown in FIG. 33. In accordance with some embodiments, the etching process includes a main etching process utilizing a suitable etchant selective to the ILD 74, using the ESL 72 as an etch stop.

Next, the ESL 72 is etched to reveal the hard masks 58. The respective process is also illustrated as process 252 in the process flow 250 shown in FIG. 33. The ESL 72 etching may be performed using suitable etchant process gases such as $CHF_3$, $CH_xF_y$ (x,y=0~9) while carrier gases such as $N_2$ and/or Ar may be added.

Next, the hard masks 58 are etched to expose the gate electrodes 54 of the replacement gate stacks 56. The respective process is also illustrated as process 252 in the process flow 250 shown in FIG. 33. The hard masks 58 may be etched using a suitable etchant selective to the hard masks 58.

As illustrated in FIG. 21B, the contact opening 88A is deliberately disposed near the edge or line end of the gate electrodes 54, whereas the contact openings 88B are not disposed near the edge or line end of the gate electrodes 54. In some embodiments, contact openings 88B are omitted (where all contact openings are disposed near the edge or line end of the gate electrodes 54).

Figure 22A:
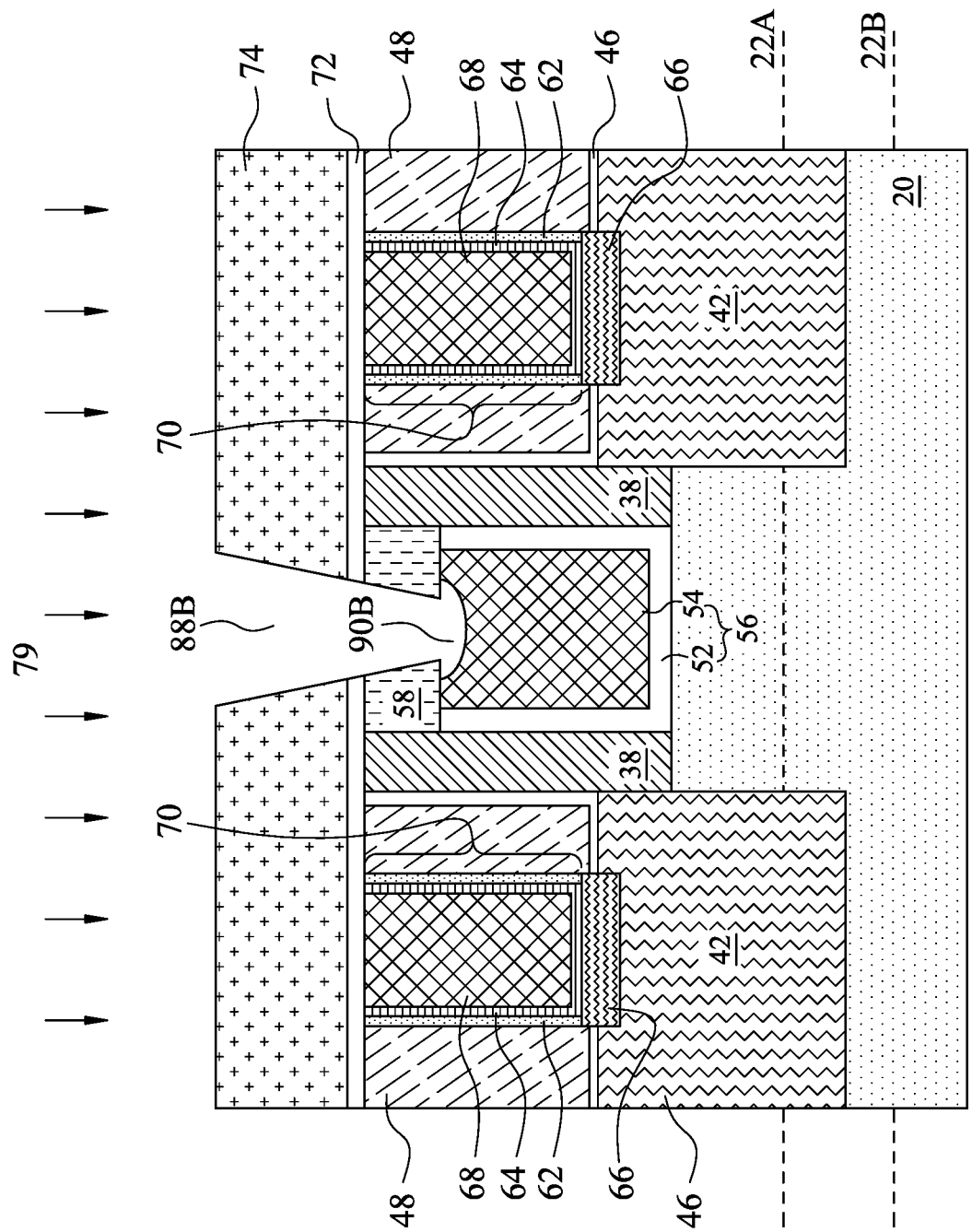
Figure 22B:
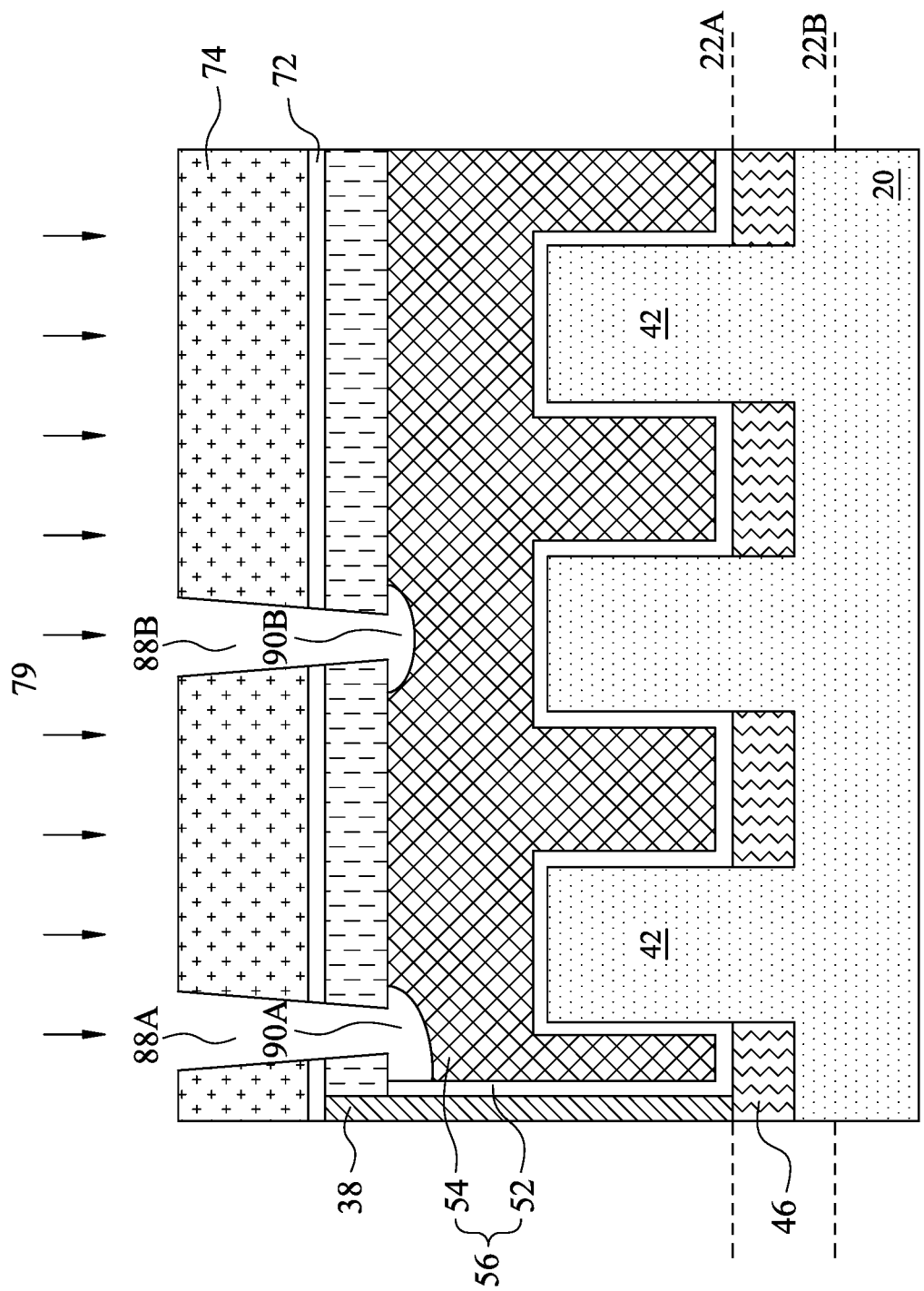
Figure 22C:
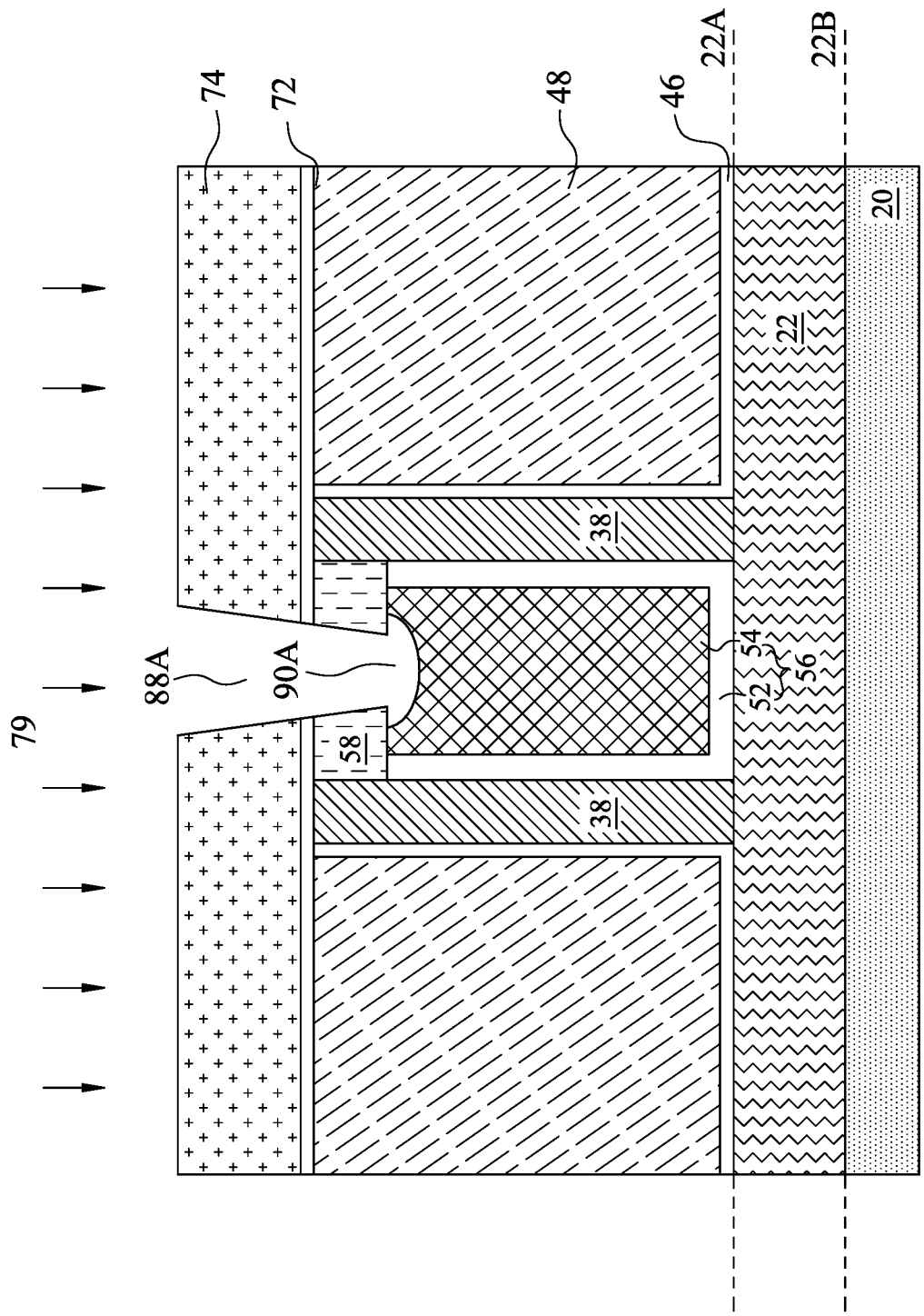

In FIGS. 22A-22C, an etching process 79 is performed on the gate contact openings 88A and 88B to extend the gate contact openings 88A and 88B into the gate electrodes 54 of the replacement gate stacks 56 and to form enlarged openings 90A and 90B, in accordance with some embodiments. In other embodiments, the enlarged openings 90A and 90B may not be formed and subsequent gate contacts can be deposited and formed in the gate contact openings 88A and 88B without extending into the gate electrodes 54. In embodiments utilizing the gate contact openings 88A and 88B, the enlarged openings 90A and 90B may also be referred to as depressions, recesses, or an inverted mushroom cap. The etching process 79 may use an etchant or cleaning agent similar to the etching process 79 discussed above with respect to FIGS. 16A-16B or may use a different etchant or cleaning agent. For example, the gate electrodes 54 may be made of a different material than the metallic regions 68 and may therefore require a different suitable etchant for that material. In some embodiments, the gate electrodes 54 may include titanium, aluminum, titanium nitride, aluminum nitride, tantalum, tantalum nitride, tungsten, the like, or combinations thereof. In such embodiments, if the enlarged openings 90A and 90B are formed, then an etchant suitable for such materials would be selected. In some embodiments, the etching process 79 may be performed at the same time and in the same process as the etching process 79 discussed above with respect to FIGS. 16A-16B. In other embodiments, the etching process 79 of FIGS. 22A-22C may be performed in a different process than the etching process 79 of FIGS. 16A-16B. The respective process is illustrated as process 254 in the process flow 250 shown in FIG. 33. The enlarged openings 90A and 90B have advantages similar to those discussed above with respect to the enlarged openings 80A and 80B. In particular, the enlarged openings 90A and 90B may have dimensional relationships similar to the dimensions a, b, c, d, and e, as discussed above with respect to FIG. 17.

The etching of the replacement gate stacks 56 forms enlarged openings 90A/90B in the gate electrode 54 of the replacement gate stacks 56. Where the contact openings 88B are not near the line end of the gate electrodes 54, the enlarged openings 90B may have a bowl shape. Where the gate contact openings 88A are near the line end of the gate electrodes 54, the enlarged openings 90A may have a partial bowl shape, where one side of the partial bowl shape is defined by the edge of the gate electrode 54 and the gate dielectrics 52.

Figure 23A:
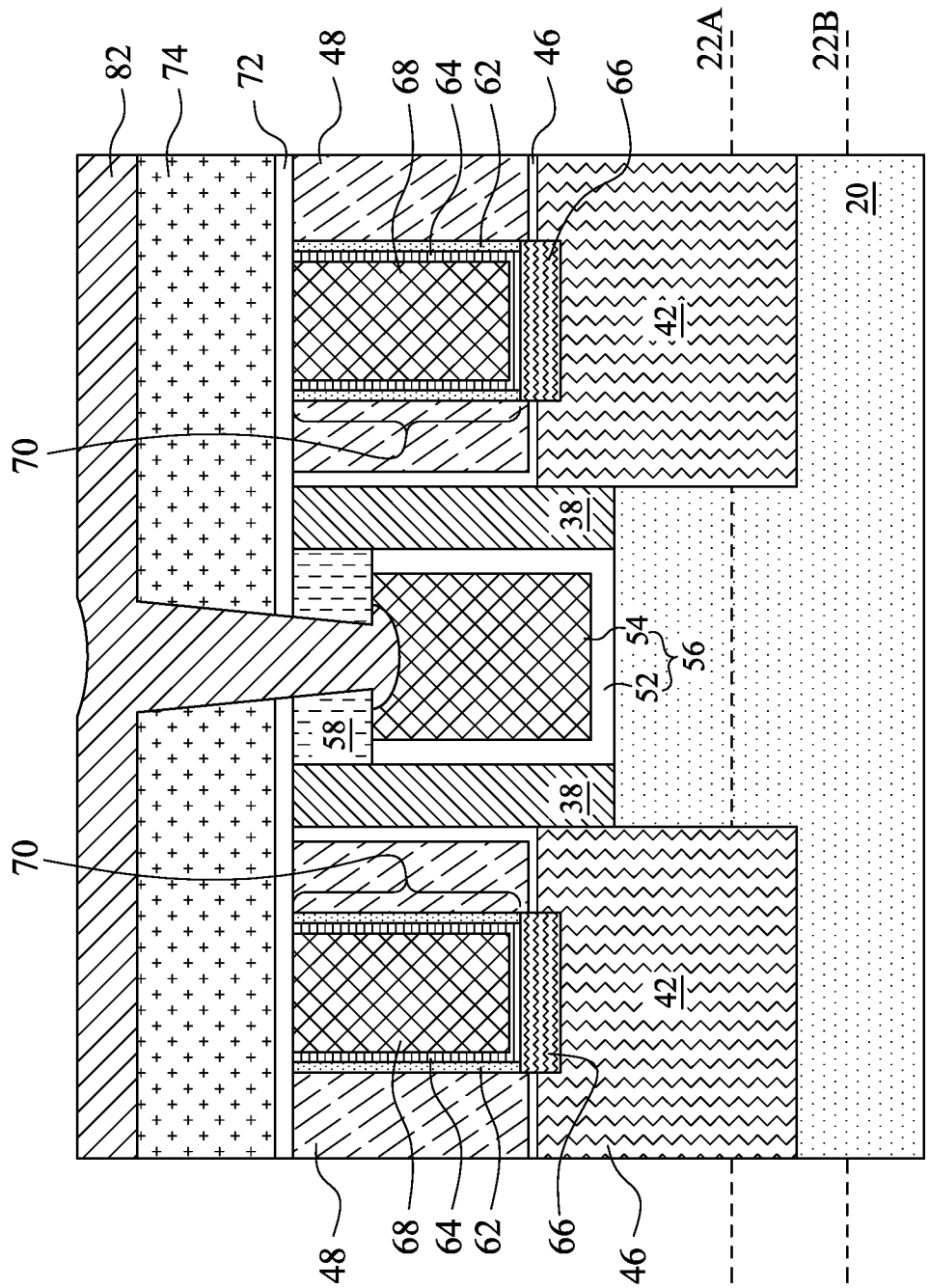
Figure 23B:
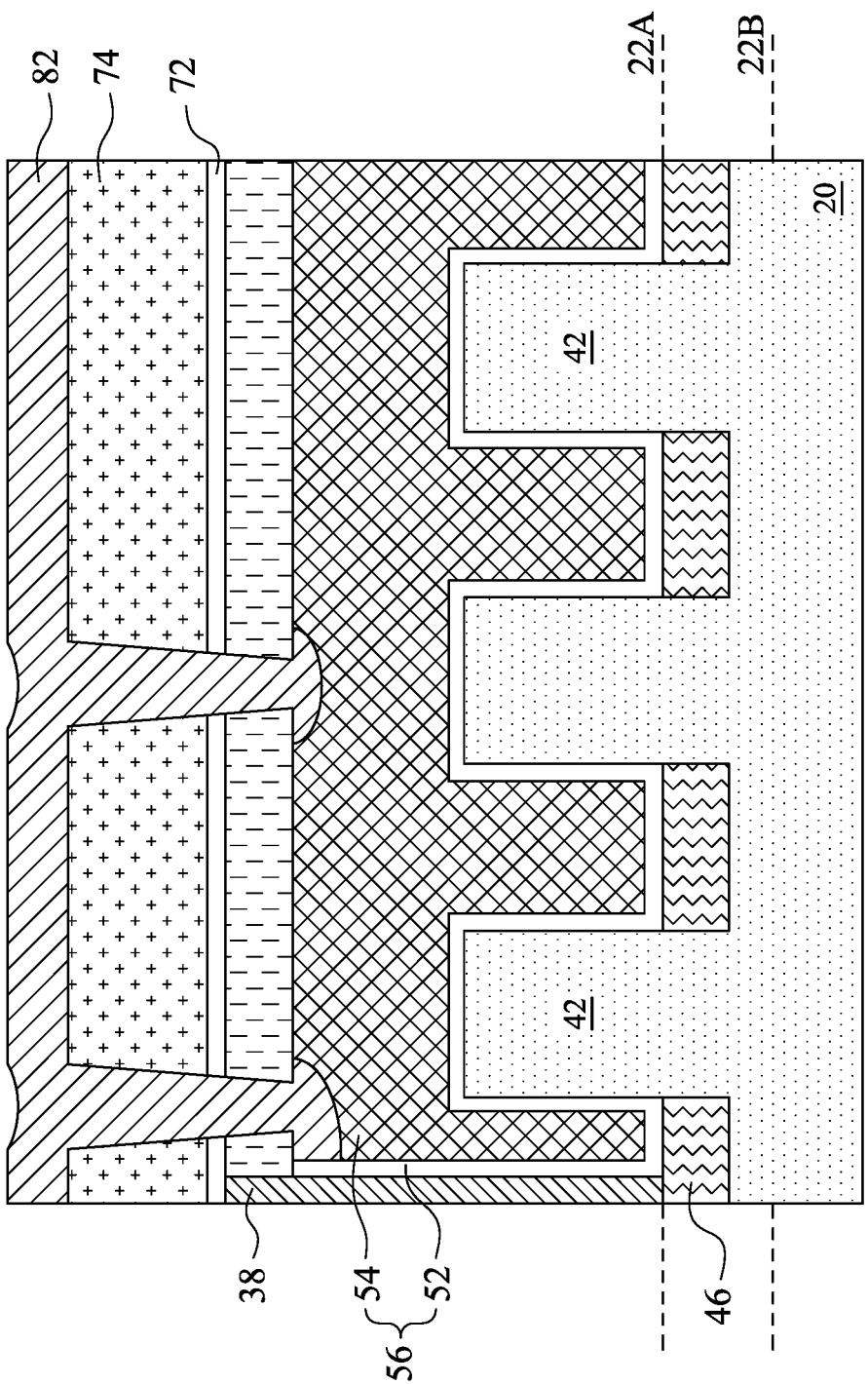
Figure 23C:
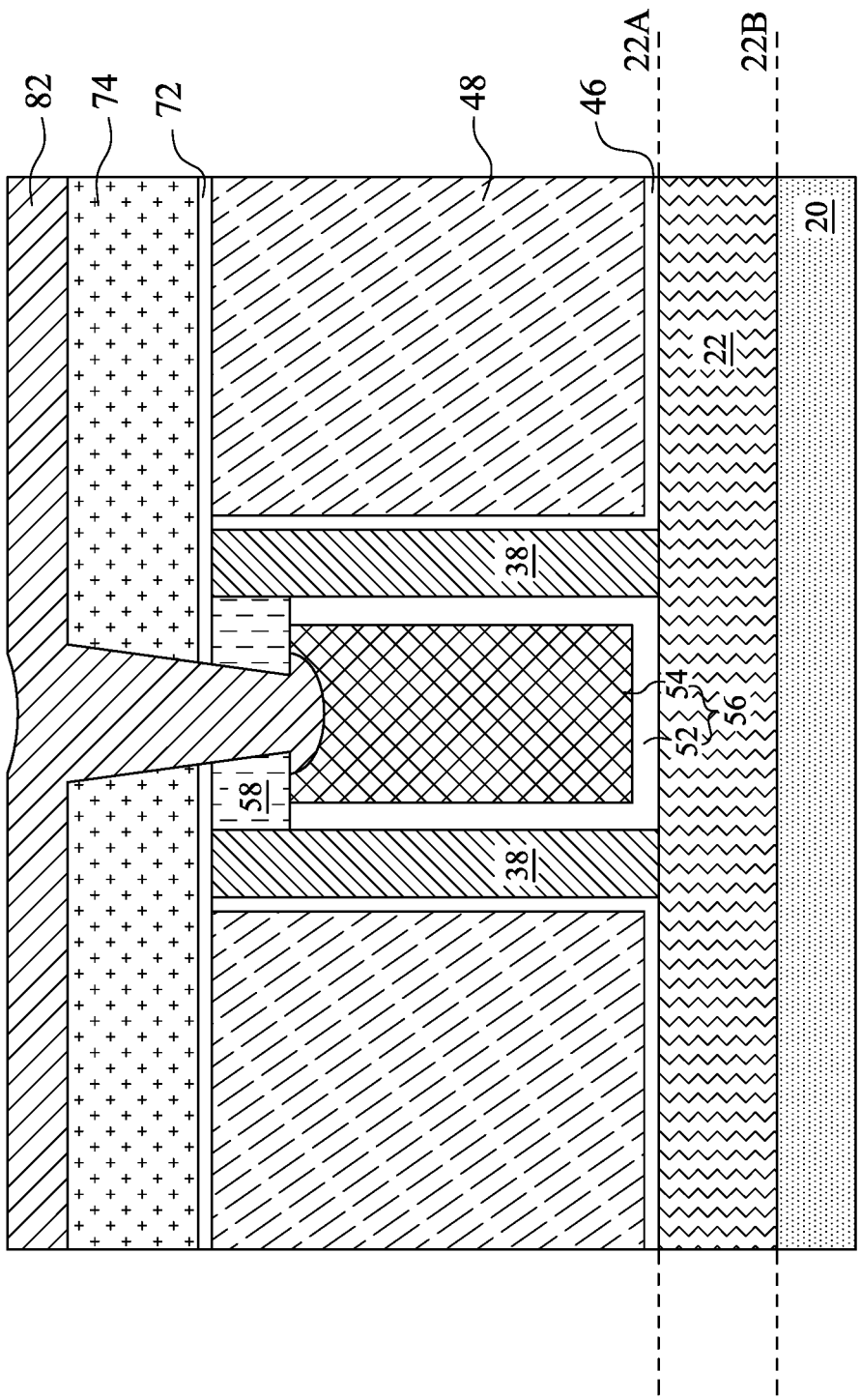

Referring to FIGS. 23A-23C, metallic material 82 is filled into enlarged openings 90A and 90B and in the gate contact openings 88A and 88B. The respective process is illustrated as process 256 in the process flow 250 shown in FIG. 33. In accordance with some embodiments, metallic material 82 may be deposited using materials and processes similar to those discussed above with respect to FIGS. 18A-18B.

Figure 24A:
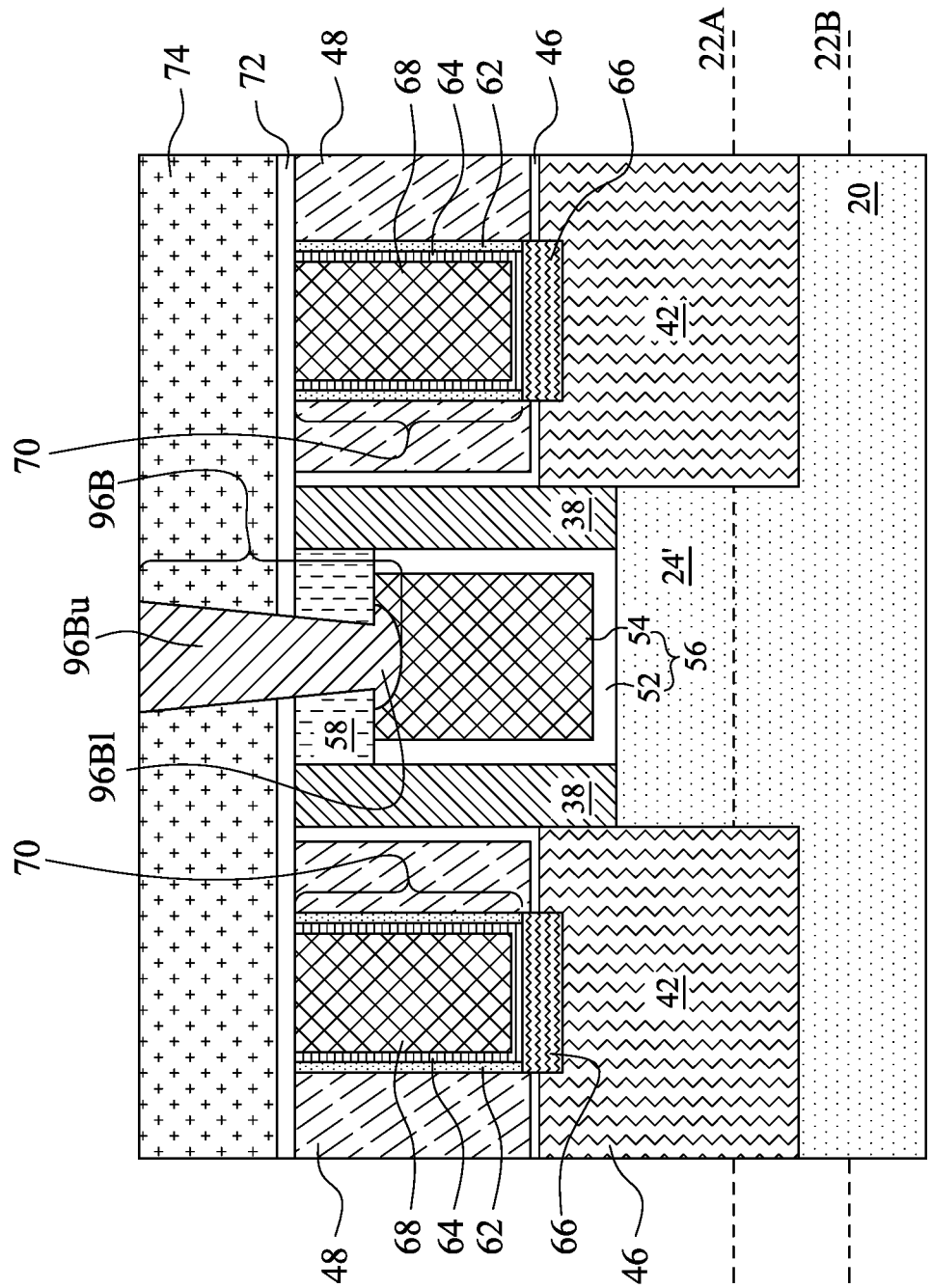
Figure 24B:
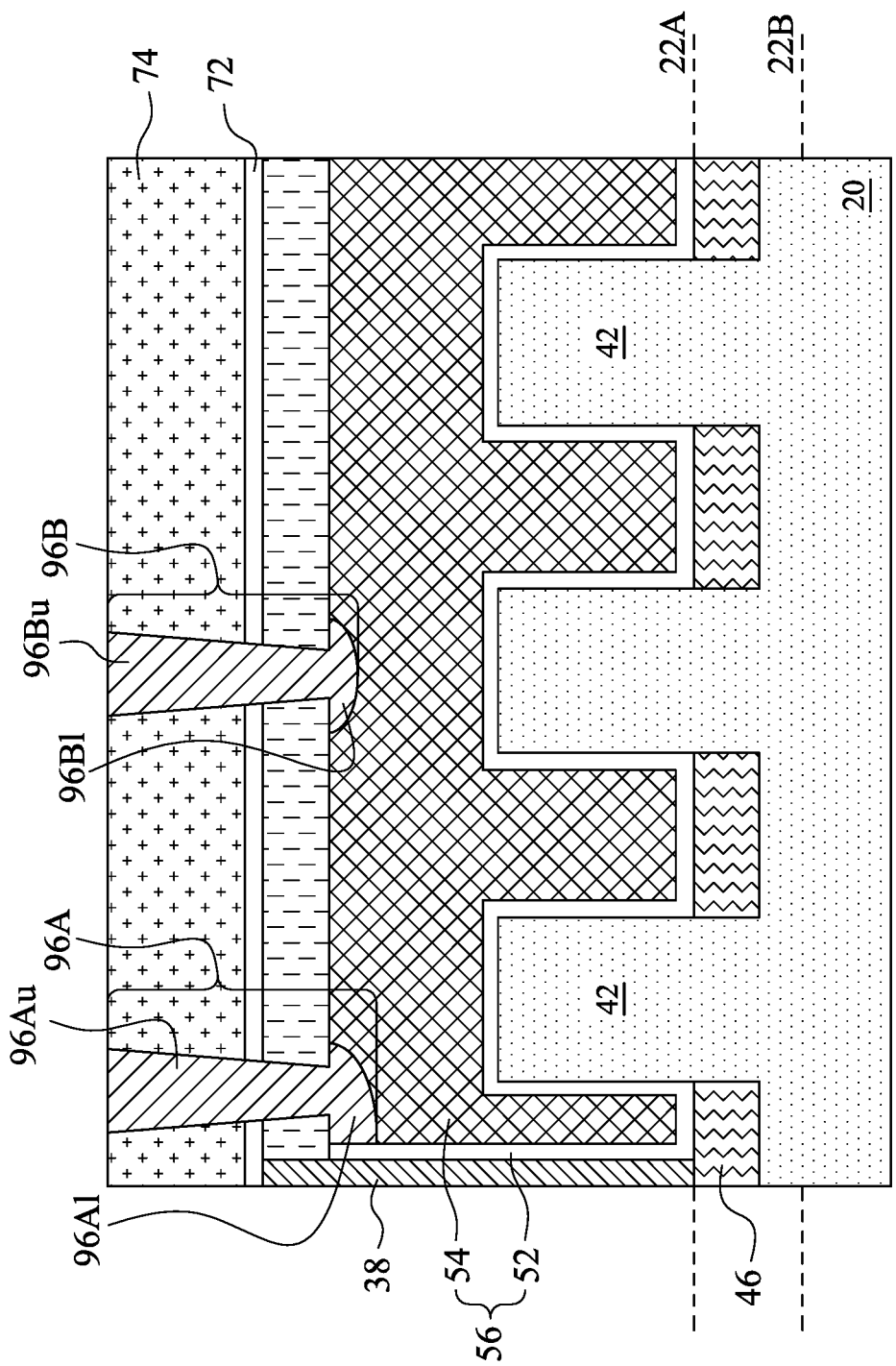
Figure 24C:
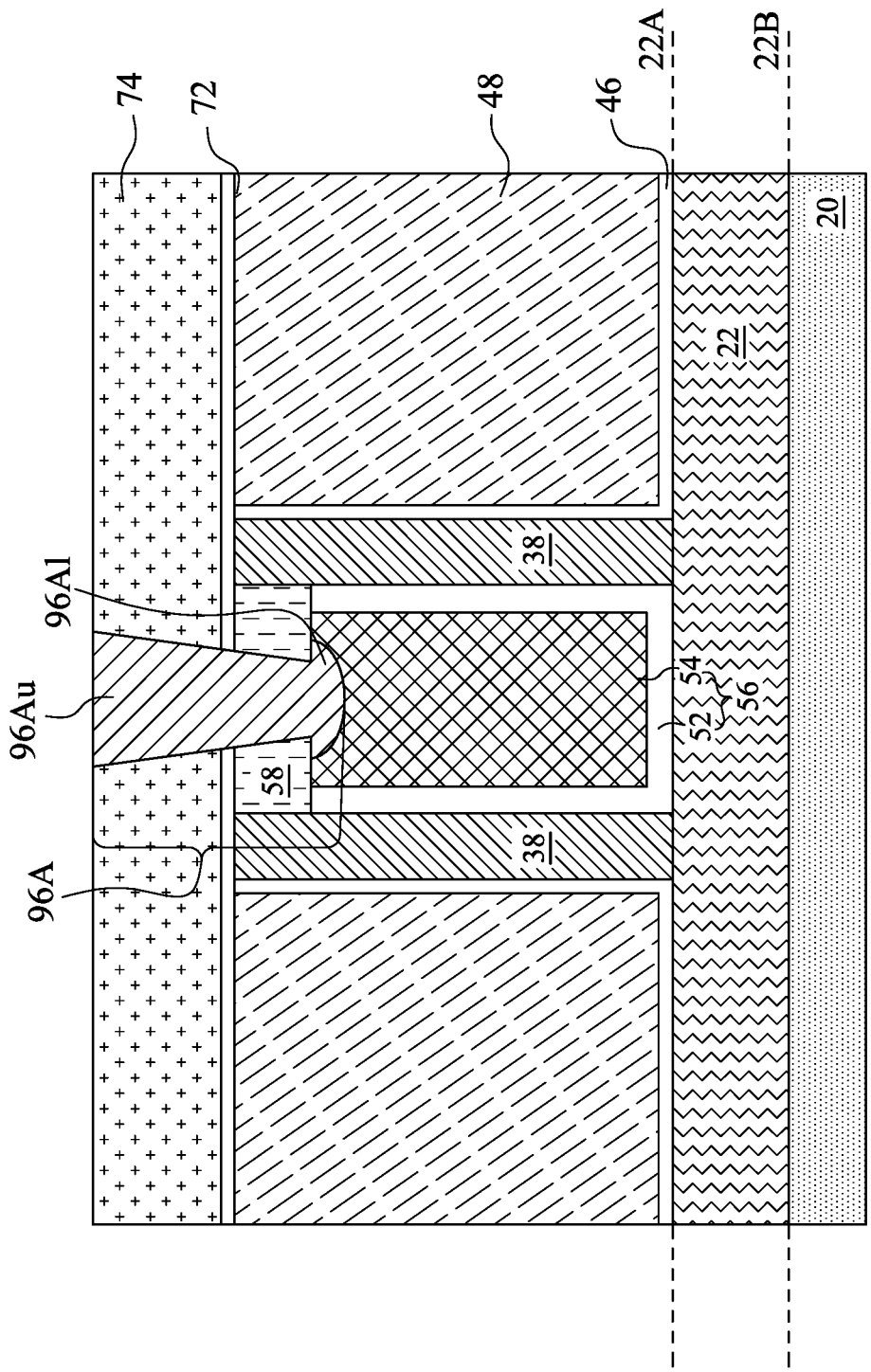

FIGS. 24A-24C illustrate a planarization process for removing excess portions of metallic material 82, and hence conductive gate vias 96A and 96B are formed. The respective process is illustrated as process 258 in the process flow 250 shown in FIG. 33. Conductive gate vias 96A and 96B include lower (expanded) portion 96A*l* and 96B*l*, which extend into the gate electrodes 54 of the replacement gates 56, and upper portions 96Au and 96Bu, which are disposed in the ILD 74 and laterally surrounded by the ILD 74, extending through the ESL 72 and the hard masks 58. The lower portions 96A*l* and 96B*l* may be considered contact extensions or contact extension regions of the conductive vias 96A and 96B. The resulting relationships between the relationships between the lower portions 96A*l* and 96B*l* follow from the relationships of their respective enlarged openings and the dimensions a, b, c, d, and e, as described above with respect to FIG. 17. In the cross-sectional view as shown in FIGS. 24A-24C, bottom via portions 96A*l* and 96B*l* extend laterally beyond the bottoms of the respective overlaying upper portions 96Au and 96Bu, causing a neck to be formed between the upper portions 96Au and 96Bu and the lower portions 96A*l* and 96B*l*. The upper portions 96Bu are aligned to the lower portions 96B*l* of the conductive vias 96B. In other words, the side-to-side centers of the upper portions 96Bu are aligned with the side-to-side centers of the lower portions 96B*l*. In contrast, the upper portions 96Au are not aligned to the lower portions 96A*l* of the conductive vias 96A. In other words, the side-to-side centers of the upper portions 96Au are not aligned with (or offset from) the side-to-side centers of the lower portions 96A*l*.

Figure 25:
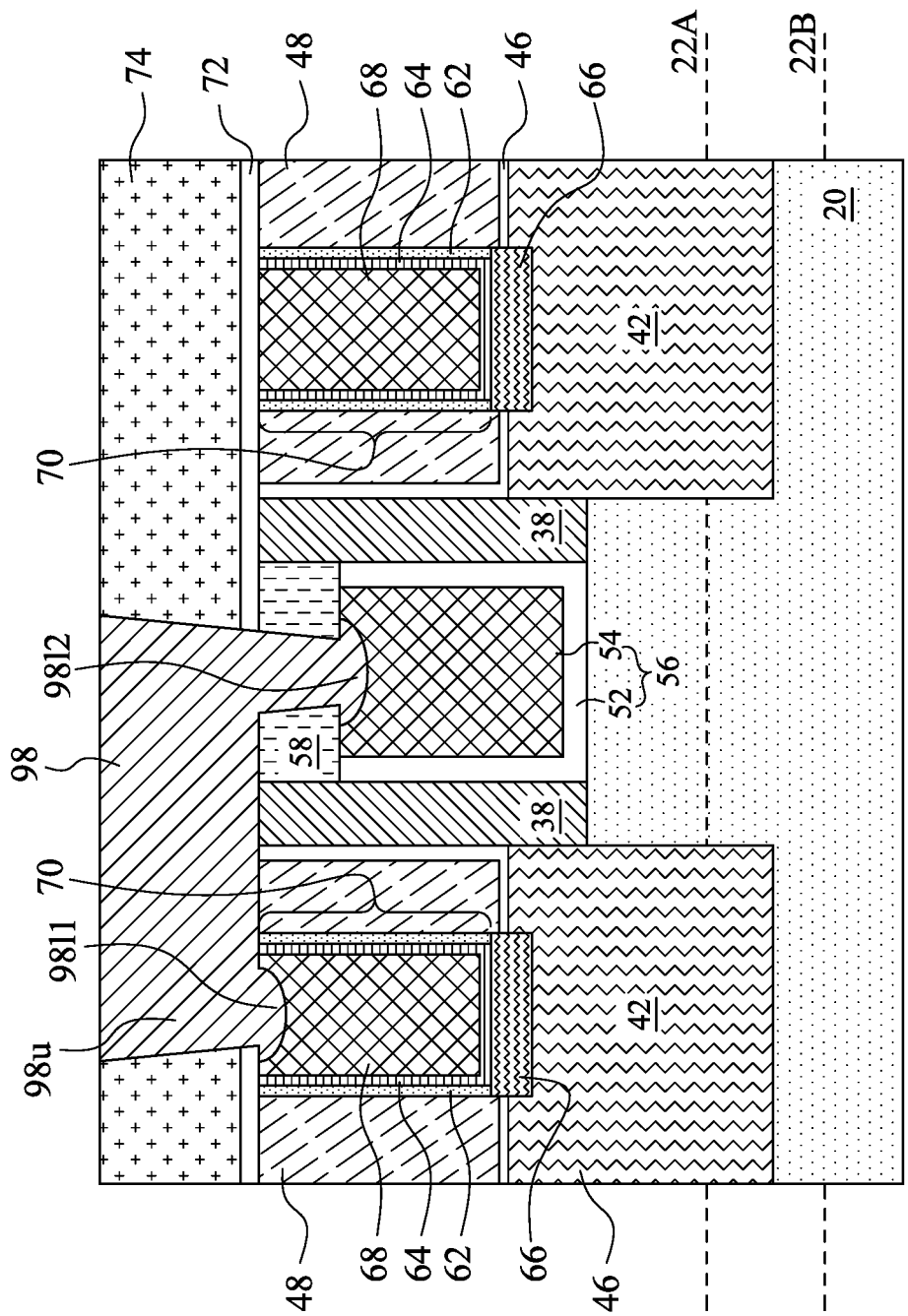
FIG. 25 is cross-sectional views of an intermediate stage in the formation of a contact plugs in accordance with some embodiments.

FIG. 25 illustrates a (contact plug) conductor 98 which bridges the metallic region 68 to the gate electrode 54. The conductor 98 has an upper portion 98*u*, which is laterally surrounded by the ILD 74 and the ESL 72, and has lower portions 98*l*1 and 98*l*2 which are extensions of the conductor 98 into the metallic region 68 and into the gate electrode 54, respectively. The lower portions 98*l*1 and 98*l*2 may be formed using processes similar to those discussed above with respect to the lower portions 86B*l* and 96B*l* of FIGS. 19A and 24A. The bridged portion may be formed by removing the portion of the ILD 74 and ESL 72 between the conductive vias 86A/86B and/or conductive gate vias 96A/96B while forming openings for the conductive vias 86A/86B and/or conductive gate vias 96A/96B, for example after forming the enlarged openings 80B and 90B and or and/or enlarged openings 80A and 90A of FIGS. 16A and 22A. The ILD 74 can be masked for portions of the ILD 74 which are to be kept and an etching process can be used to remove the ILD 74 and the ESL 72. Then, when the metallic material 82 is deposited, it will fill the bridged area of the conductor 98, coupling the metallic region 68 of the lower source/drain contact plugs 70 with the gate electrode 54. It should be appreciated that either one or both of the lower portions 98/1 and 98/2 of the conductor 98 may be at the line end, e.g. like unto conductive vias 86A and/or conductive gate vias 96A.

Figure 26:
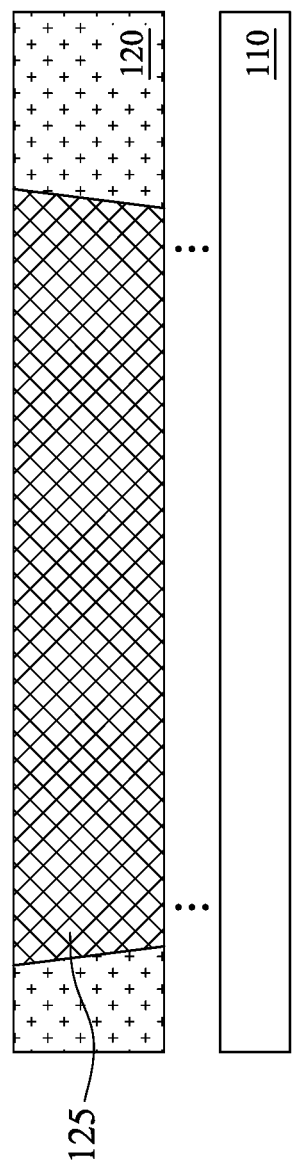
FIGS. 26-31 are cross-sectional views of intermediate stages in the formation of contact plugs in accordance with some embodiments.

FIGS. 26 through 31 illustrate intermediate steps in a process for forming contact vias to an underlying metallization, in accordance with some embodiments. FIG. 26 illustrates a substrate 110 and dielectric layer 120, with any number of layers and device features interposed therebetween. The substrate 110 may be a substrate like unto the substrate 20, described above. In addition, the substrate 110 may be a carrier substrate, such as a glass carrier, ceramic carrier, the like, and so forth. The dielectric layer 120 may be any suitable dielectric layer type. In some embodiments, the dielectric layer 120 may be an inter-layer dielectric (ILD) or an inter-metal dielectric (IMD), or the like, and may be a layer in a redistribution structure or interconnect. The dielectric layer may be formed of any suitable material by any suitable process. For example, the dielectric layer 120 may be formed of an insulating material, such as an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. In some embodiments, the dielectric layer 120 may be formed of other insulating materials such as silicon nitride, silicon oxycarbide, silicon oxynitride, silicon oxycarbonitride, the like, or combinations thereof. The dielectric layer 120 may be formed by any suitable process, such as by PVD, CVD, FCVD, spin-on coating, or another suitable deposition process.

Figure 34:
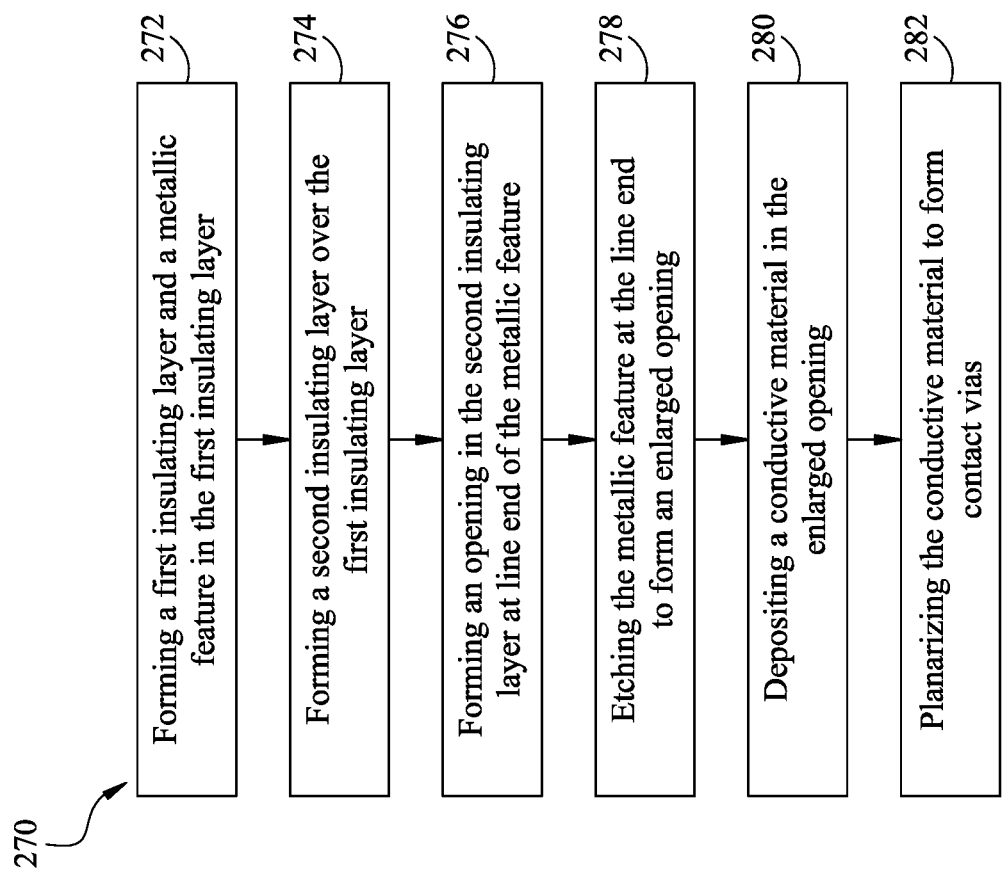
FIG. 34 illustrates a process flow for forming contact vias in accordance with some embodiments.

The metallic feature 125 is disposed within the dielectric layer 120. In some embodiments, the metallic feature 125 may be part of a metallization layer of an interconnect or redistribution structure. The metallic feature 125 may be coupled to one or more conductive features underlying the metallic feature 125, such as conductive vias, metallization layers, silicides, semiconductor materials, or the like. One example of formation of the metallic feature 125 is to form an opening in the dielectric layer 120, for example, using a suitable photomask and photolithography process to etch the opening in the dielectric layer 120. Next, a conductive material may be deposited in the opening, for example, by depositing a seed layer, and then performing a plating process to deposit the conductive material. The conductive material of the metallic feature may include any suitable material, such as copper, tin, tungsten, cobalt, aluminum, gold, titanium, titanium nitride, tantalum, tantalum nitride, and so forth, alloys thereof, combinations thereof, and the like. Then, a planarization process may be used, such as a CMP process to level the upper surface of the metallic feature 125 with the upper surface of the dielectric layer 120. The respective process is illustrated as process 272 in the process flow 270 shown in FIG. 34. Other processes may be used to form the metallic feature 125 in the dielectric layer 120, including, for example, forming the metallic feature 125 first and then forming the dielectric layer 120 around the metallic feature 125, followed by a planarization process.

Figure 27:
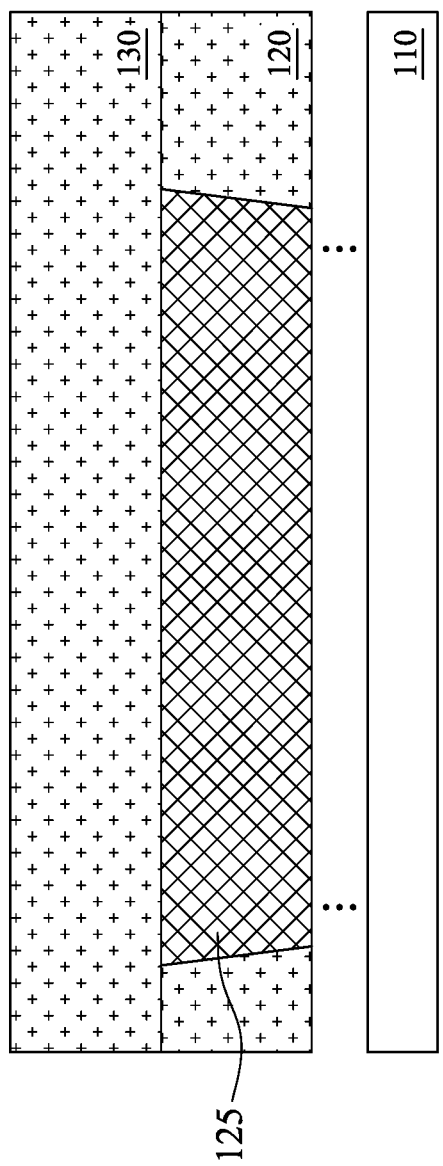

In FIG. 27, another dielectric layer 130 is formed over the dielectric layer 120 and over the metal feature 125. The dielectric layer 130 may be formed of the same or different materials as the dielectric layer 120. In some embodiments, an etch stop layer (for example, similar to the ESL 72) may be formed between the dielectric layer 120 and the dielectric layer 130. The dielectric layer 130 may be formed using processes and materials similar to those discussed above with respect to the dielectric layer 120. The respective process is illustrated as process 274 in the process flow 270 shown in FIG. 34.

Figure 28:
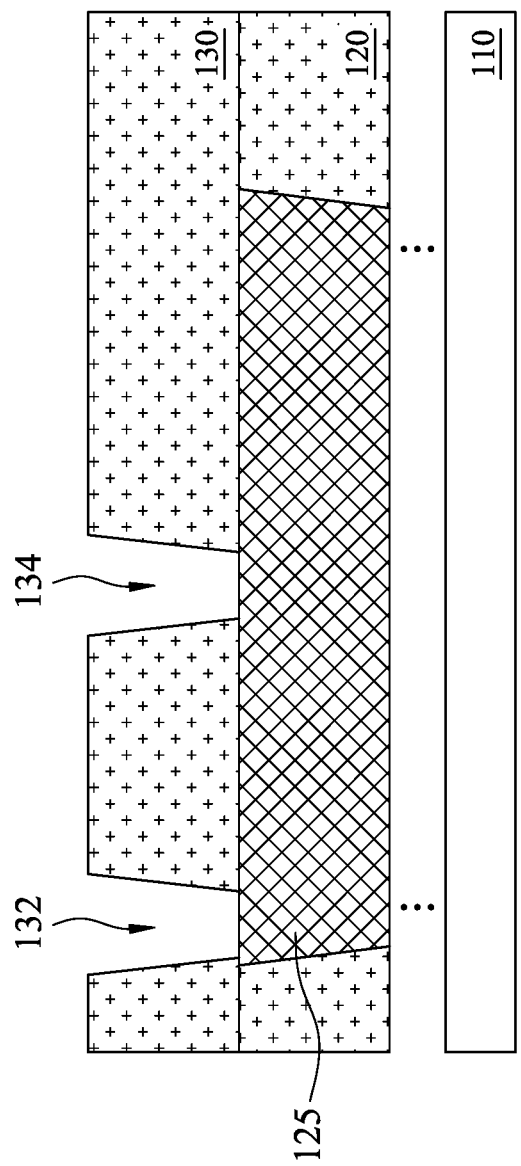

In FIG. 28, contact openings 132 and 134 are formed in the dielectric layer 130 over the metallic feature 125. The contact openings 132 and 134 may be used to form vias to connect the metallic feature 125 to another metallic feature, for example, an overlying metallic feature (not shown) which may then be electrically coupled to a device within the substrate 110 or to another device (not shown). The contact opening 132 may be formed at the line end of the metallic feature 125 and the contact opening 134 may be formed not at the line end of the metallic feature 125. It should be understood that these are only examples of the contact openings 132 and 134. In some embodiments, additional or other contact openings may be formed in the dielectric layer 130, including at the opposite line end from the illustrated contact opening 132. In such embodiments, two such contact openings 132 (at opposing line ends of the metallic feature 125) may be formed in the dielectric layer 130.

The contact openings 132 and 134 may be formed by any suitable process, such as by an acceptable photolithography process to form a resist mask over the dielectric layer, pattern the resist mask through a photomask, develop the resist mask to form a pattern in the resist mask, and etch the dielectric layer 130 through the resist mask. The respective process is illustrated as process 276 in the process flow 270 shown in FIG. 34.

Figure 29:
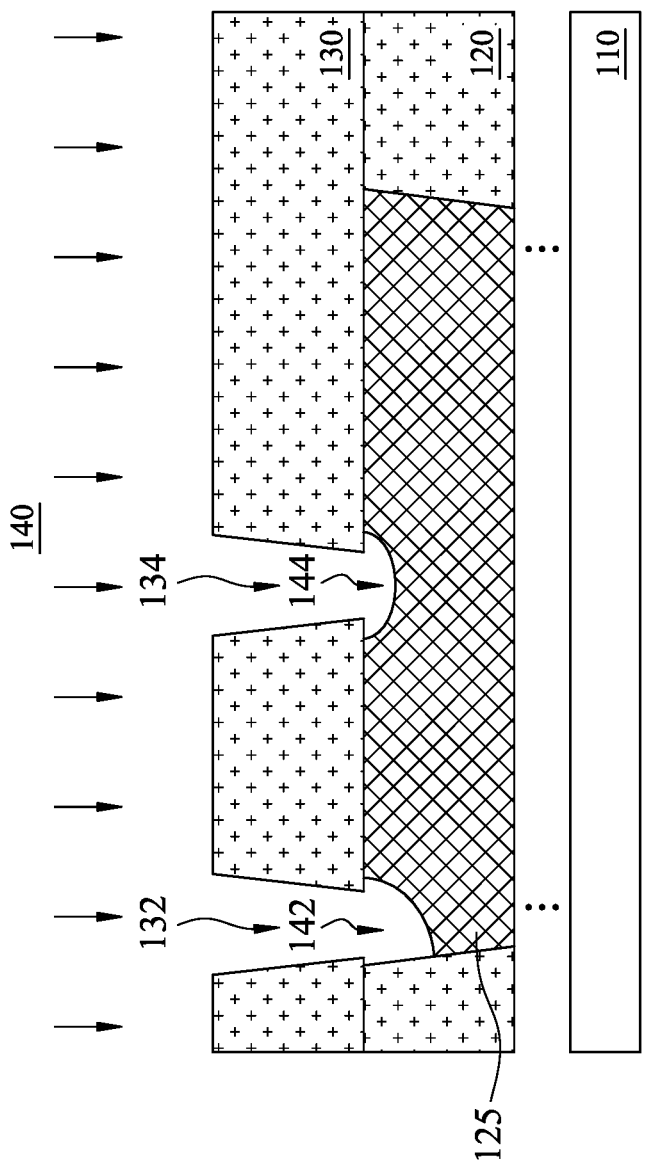

In FIG. 29 an etching process 140 is performed on the contact openings 132 and 134 to extend the openings into the metallic feature 125, to form enlarged openings 142 in the contact opening 132 and enlarged openings 144 in the contact opening 134. The enlarged openings 142 and 144 may also be referred to as depressions, recesses, or an inverted mushroom cap. The etching process 140 may be performed using processes and materials similar to those discussed above with respect to the etching process 79 of FIGS. 16A and 16B. The respective process is illustrated as process 278 in the process flow 270 shown in FIG. 34.

The enlarged openings 142 extending from the contact openings 132 at the line ends of the metallic feature 125 have several advantages over the enlarged openings 144 extending from the contact openings 134 at interior part of the metallic feature 125. The enlarged openings 142 are analogous to the enlarged openings 80A of FIG. 17 and the enlarged openings 144 are analogous to the enlarged openings 80B of FIG. 17. As such, the enlarged openings 142 are deeper than the enlarged openings 144, and the enlarged openings 142 extend laterally further from the contact opening 132 than the enlarged openings 144 extend from the contact opening 134. Further, the relationships between a, b, c, d, and e, as described above with respect to FIG. 17 apply to the enlarged openings 142 and 144. The larger volume and deeper pocket formed by the enlarged openings 142 result in a better contact area with the subsequently formed conductive layer, help resist upward force better than the enlarged openings 144, and provide better protection from seepage of a reactive element of a planarization process.

Figure 30:
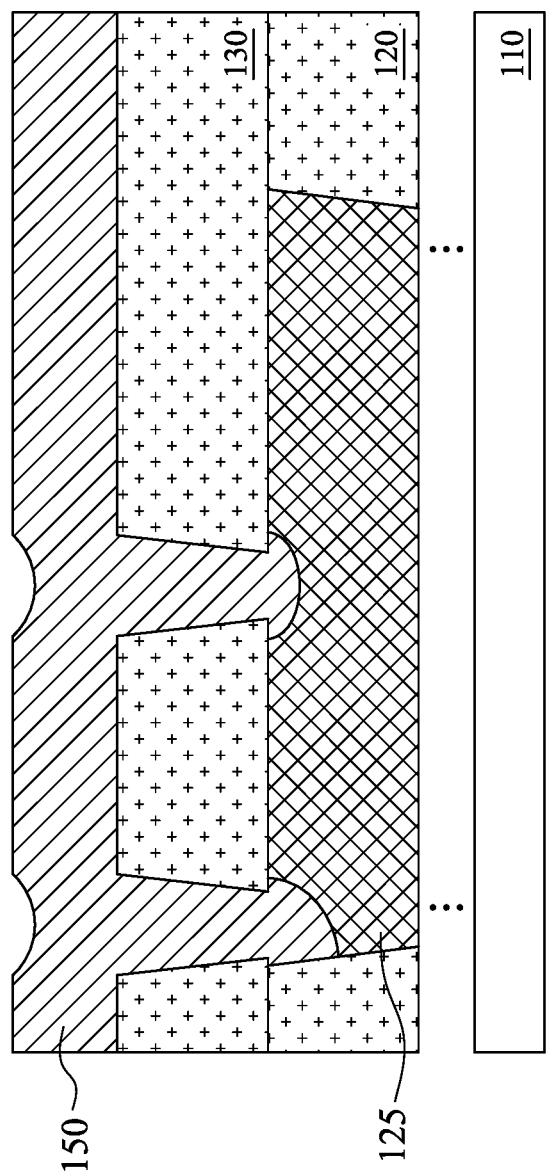

In FIG. 30, a conductive layer 150 is deposited in the enlarged openings 142 and 144, in the contact openings 132 and 134, and over the top of the dielectric layer 130. The conductive layer 150 may be formed using processes and materials similar to the metallic material 82, discussed above. The respective process is illustrated as process 280 in the process flow 270 shown in FIG. 34.

Figure 31:
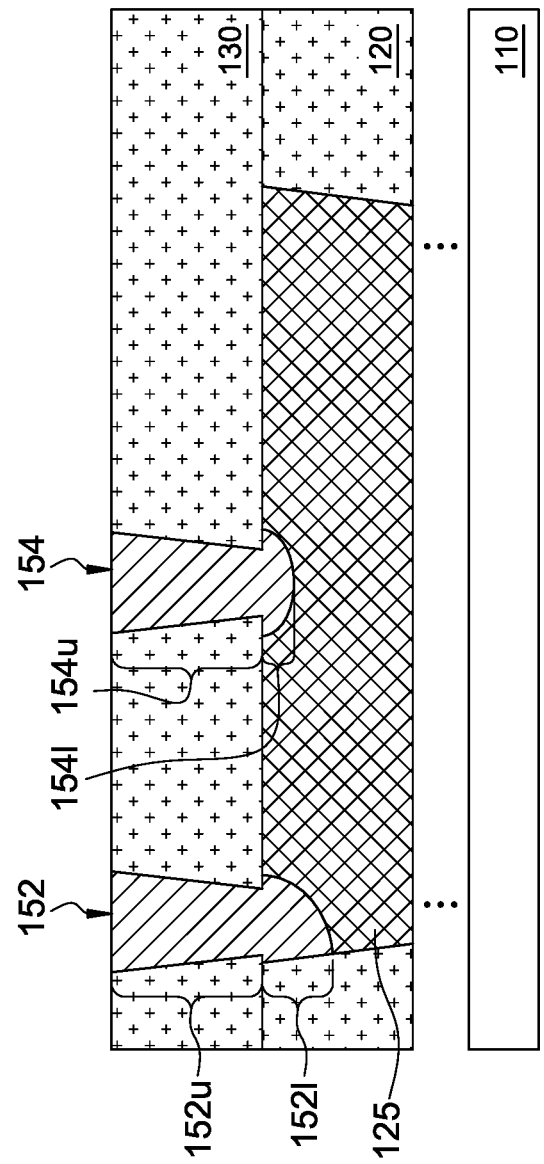

In FIG. 31, a planarization process, such as a CMP process is performed on the conductive layer 150 to level the upper surface of the conductive layer 150 with the upper surface of the dielectric layer 130. The resulting conductive vias 152 and 154 include an upper portion 152*u* and 154*u*, respectively, and a lower portion 152*l* and 154*l*, respectively. The lower portions 152*l* and 154*l* may be considered contact extensions or contact extension regions of the conductive vias 152 and 154. The respective process is illustrated as process 282 in the process flow 270 shown in FIG. 34.

The resulting relationships between the relationships between the lower portions 152*l* and 154*l* follow from the relationships of their respective enlarged openings and the dimensions a, b, c, d, and e, as described above with respect to FIG. 17. The lower portions 152*l* and 154*l* are laterally wider than the neck between the upper portions 152*u* and 154*u* and the lower portions 152*l* and 154*l*, respectively. As a result, the contact between the material of the conductive vias 152 and 154 and the metallic feature 125 resists upward force, such as may be caused by warpage, and reduces or eliminates peeling and separation of the conductive vias 152 and 154 from the metallic feature 125. Because the lower portion 152*l* has a portion laterally further from the upper portion 152*u* than the lower portion 154*l* and upper portion 154*u*, the resistance of the upward force is more effective in the lower portion 152*l* than the lower portion 154*l*, essentially due to its placement at line end of the metallic feature 125. Further, the surface area contact of the lower portion 152*l* is larger than the lower portion 154*l*, resulting in less contact sheet resistance. Further still, the lower portion 152*l* resists chemical intrusion between the upper portion 152*u* and sidewall of the dielectric layer 130 (at the contact opening 132) better than chemical intrusion between the upper portion 154*u* and sidewall of the dielectric layer 130 (at the contact opening 134), the chemical intrusion resulting from the CMP process used to level the upper surface of the conductive layer 150 with the upper surface of the dielectric layer 130.

The upper portions 154*u* are aligned to the lower portions 154*l* of the conductive vias 154. In other words, the side-to-side centers of the upper portions 154*u* are aligned with the side-to-side centers of the lower portions 154*l*. In contrast, the upper portions 152*u* are not aligned to the lower portions 152*l* of the conductive vias 152. In other words, the side-to-side centers of the upper portion 152*u* are not aligned with (or offset from) the side-to-side centers of the lower portion 152*l*.

The embodiments of the present disclosure have some advantageous features. By forming a contact extension region of a contact via intentionally close to the line end of the underlying metallic feature, the contact extension region can be larger (more voluminous and wider) than a contact extension region disposed elsewhere along the underlying metallic feature. This size difference provides better resistance to upward force (e.g., peeling force), less contact resistance due to the larger interface with the metallic feature, and better resistance against chemical intrusion.

One embodiment is a method including forming a metallic region in a first insulating layer. The method also includes depositing a second insulating layer over the metallic region and the first insulating layer. The method also includes performing a first etching process to etch the second insulating layer to form a first opening in the second insulating layer, the first opening exposing a portion of the metallic region proximal to a line end of the metallic region. The method also includes performing a second etching process through the first opening to etch a first depression into an upper surface of the metallic region, the first depression having greater lateral extents than a bottom of the first opening, a side-to-side center of the first depression being offset from a side-to-side center of the first opening. The method also includes forming a first upper contact plug, the first upper contact plug having a first portion filling the first depression in the metallic region and a second portion filling the first opening. In an embodiment, the first portion of the upper contact plug has a sidewall which is continuous with a sidewall of the metallic region. In an embodiment, the method further includes using the first etching process to form a second opening in the first insulating layer, the second opening spaced apart from the first opening; using the second etching process through the second opening to etch a second depression into the upper surface of the metallic region, the second depression centered to a side-to-side center of the second opening; and forming a second upper contact plug, the second upper contact plug having a first portion filling the second depression in the metallic region and a second portion filling the second opening. In an embodiment, the first depression is deeper than the second depression. In an embodiment, a first distance corresponds to a width of the second insulating layer that overhangs the first depression on a side of the first depression opposite the line end of the metallic region, a second distance corresponds to a width of the second insulating layer that overhangs the first depression on a side of the first depression near the line end of the metallic region, and a third distance corresponds to a width of the second insulating layer that overhangs the second depression from an edge of the bottom of the first opening, where the first distance is greater than the third distance and where the third distance is greater than the second distance. In an embodiment, a volume of the first depression is greater than a volume of the second depression. In an embodiment, the metallic region includes cobalt, and the first upper contact plug includes tungsten. In an embodiment, the method further includes performing a chemical mechanical polishing (CMP) process on upper surfaces of the first upper contact plug and upper surfaces of the second insulating layer. In an embodiment, an etching chemical of the CMP process leaks between the first upper contact plug and the second insulating layer at a bottom surface of the second insulating layer, and not beyond a lateral extent of the first portion of the first upper contact plug.

Another embodiment is an integrated circuit structure including a first insulating layer. The integrated circuit structure also includes a first metallic line disposed in the first insulating layer, the first metallic line laterally surrounded by the first insulating layer, the first metallic line having an upper surface which is level with an upper surface of the first insulating layer. The first metallic line includes a first depression in the upper surface of the first metallic line, and the first depression extends from a first end of the first metallic line. The integrated circuit structure also includes a second insulating layer disposed over the first insulating layer. The integrated circuit structure also includes a first metallic contact disposed in the second insulating layer and extending below the second insulating layer into the first depression, the first metallic contact having an interface with the first metallic in the first depression. In an embodiment, the first metallic contact includes an upper portion surrounded by the second insulating layer and a lower portion disposed in the first depression, where a side-to-side center of the lower portion is askew of a side-to-side center of the upper portion. In an embodiment, a first distance from the first end of the first metallic line to the upper portion of the first metallic contact is less than a second distance from the upper portion of the first metallic contact to a lateral extent of the lower portion of the first metallic contact. In an embodiment, the second metallic contact has an upper portion laterally surrounded by the second insulating layer, where the second metallic contact has a lower portion laterally surrounded by the first metallic line, where the lower portion has lateral extents which extend beyond lateral extents of the upper portion. In an embodiment, the upper portion and the lower portion are aligned on center. In an embodiment, the first metallic contact extends into the first metallic line deeper than the second metallic contact. In an embodiment, the lower portion is a second lower portion, where the first metallic contact includes a second lower portion the second lower portion disposed in the first depression, where a volume of the first lower portion is greater than a volume of the second lower portion.

Another embodiment is a device including a source/drain region of a transistor. The device also includes a first inter-layer dielectric over the source/drain region. The device also includes a first source/drain contact plug over and electrically coupled to the source/drain region, where the first source/drain contact plug includes a metal region. The device also includes a second inter-layer dielectric over the first inter-layer dielectric. The device also includes a second source/drain contact plug over and electrically coupled to the first source/drain contact plug at a first end of the first source/drain contact plug, the second source/drain contact plug having a first upper portion laterally surrounded by the second inter-layer dielectric, the second source/drain contact plug having a first lower portion extending down below the second inter-layer dielectric into the first source/drain contact plug, where the first lower portion has a sidewall which is aligned to a sidewall of the source/drain contact plug. In an embodiment, the device further includes a third source/drain contact plug having a second lower portion extending down below the second inter-layer dielectric into the first source/drain contact plug, where the first lower portion has a greater volume than the second lower portion. In an embodiment, the first lower portion extends further into the first source/drain contact plug than the second lower portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a metallic region in a first insulating layer;
depositing a second insulating layer over the metallic region and the first insulating layer;
performing a first etching process to etch the second insulating layer to form a first opening in the second insulating layer, the first opening exposing a portion of the metallic region proximal to a line end of the metallic region;
performing a second etching process through the first opening to etch a first depression into an upper surface of the metallic region, the first depression having greater lateral extents than a bottom of the first opening, a side-to-side center of the first depression being offset from a side-to-side center of the first opening; and
forming a first upper contact plug, the first upper contact plug having a first portion filling the first depression in the metallic region and a second portion filling the first opening.

2. The method of claim 1, wherein the first portion of the first upper contact plug has a sidewall which is continuous with a sidewall of the metallic region.

3. The method of claim 1, further comprising:
using the first etching process to form a second opening in the first insulating layer, the second opening spaced apart from the first opening;
using the second etching process through the second opening to etch a second depression into the upper surface of the metallic region, the second depression centered to a side-to-side center of the second opening; and
forming a second upper contact plug, the second upper contact plug having a first portion filling the second depression in the metallic region and a second portion filling the second opening.

4. The method of claim 3, wherein the first depression is deeper than the second depression.

5. The method of claim 3, wherein a first distance corresponds to a width of the second insulating layer that overhangs the first depression on a side of the first depression opposite the line end of the metallic region; wherein a second distance corresponds to a width of the second insulating layer that overhangs the first depression on a side of the first depression near the line end of the metallic region; wherein a third distance corresponds to a width of the second insulating layer that overhangs the second depression from an edge of the bottom of the first opening; wherein the first distance is greater than the third distance; and wherein the third distance is greater than the second distance.

6. The method of claim 3, wherein a volume of the first depression is greater than a volume of the second depression.

7. The method of claim 1, wherein the metallic region comprises cobalt, and wherein the first upper contact plug comprises tungsten.

8. The method of claim 1, further comprising:
performing a chemical mechanical polishing (CMP) process on upper surfaces of the first upper contact plug and upper surfaces of the second insulating layer.

9. The method of claim 8, wherein an etching chemical of the CMP process leaks between the first upper contact plug and the second insulating layer at a bottom surface of the second insulating layer, and not beyond a lateral extent of the first portion of the first upper contact plug.

10. A method comprising:
forming a first metallic region and a second metallic region in a first insulating layer;
depositing a second insulating layer over the first metallic region, the second metallic region, and the first insulating layer;
performing a first etching process to etch the second insulating layer to form a first opening and a second opening in the second insulating layer, the first opening exposing a first portion of the first metallic region proximal to an edge of the first metallic region, the second opening exposing a second portion of the second metallic region closer to a center of the second metallic region than the first portion is to the edge of the first metallic region;
performing a second etching process to form a first depression in the first metallic region through the first opening and a second depression in the second metallic region through the second opening, the first depression being deeper than the second depression; and
forming a first contact plug in the first opening and the first depression and a second contact plug in the second opening and the second depression.

11. The method of claim 10, wherein the first metallic region and the second metallic region is a source/drain contact.

12. The method of claim 10, wherein the first depression has a first overhang width, the second depression has a second overhang width less than the first overhang width.

13. The method of claim 10, wherein the first depression exposes a sidewall of the first insulating layer.

14. The method of claim 10, wherein the first depression has greater lateral extents than a bottom of the first opening in the second insulating layer.

15. The method of claim 10, wherein a side-to-side center of the first depression is offset from a side-to-side center of the first opening.

16. A method comprising:
forming a first metallic region in a first insulating layer;
depositing a second insulating layer over the first metallic region and the first insulating layer;
performing a plurality of etching process to etch the second insulating layer to form a first opening through the second insulating layer and a first depression in the first metallic region, wherein a width of the first opening at a bottom of the second insulating layer is less than a widest width of the first depression, wherein the first depression exposes a sidewall of the first insulating layer; and
forming a first upper contact plug in the first depression and the first opening.

17. The method of claim 16, wherein the plurality of etching processes comprise a first etching process to etch through the first insulating layer and a second etching process to form the first depression.

18. The method of claim 16, wherein performing the plurality of etching processes comprises etching the second insulating layer to form a second opening through the second insulating layer and a second depression in a second metallic region, wherein the widest width of the first depression is greater than a widest width of the second depression.

19. The method of claim 18, wherein the second depression is spaced apart from the first insulating layer.

20. The method of claim 16, wherein performing the plurality of etching processes comprises etching the second insulating layer to form a second opening through the second insulating layer and a second depression in the first metallic region, wherein the second depression is closer to a center of the first metallic region than the first depression.

* * * * *